(12) United States Patent
Liu et al.

(10) Patent No.: US 12,419,084 B2
(45) Date of Patent: Sep. 16, 2025

(54) METHODS OF FORMING TRANSISTOR SOURCE/DRAIN REGIONS COMPRISING CARBON LINER LAYERS

(71) Applicant: Taiwan Semiconductor Manufacturing Co., Ltd., Hsinchu (TW)

(72) Inventors: Wei-Min Liu, Hsinchu (TW); Li-Li Su, Chubei (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 580 days.

(21) Appl. No.: 17/565,716

(22) Filed: Dec. 30, 2021

(65) Prior Publication Data

US 2022/0367625 A1    Nov. 17, 2022

Related U.S. Application Data

(60) Provisional application No. 63/188,134, filed on May 13, 2021.

(51) Int. Cl.
*H10D 62/10* (2025.01)
*H10D 30/01* (2025.01)
(Continued)

(52) U.S. Cl.
CPC ......... *H10D 62/118* (2025.01); *H10D 30/031* (2025.01); *H10D 30/6713* (2025.01);
(Continued)

(58) Field of Classification Search
None
See application file for complete search history.

(56) References Cited

U.S. PATENT DOCUMENTS 8,653,599 B1 * 2/2014 Cheng .................. H01L 21/845
257/351
9,209,247 B2   12/2015 Colinge et al.
(Continued)

FOREIGN PATENT DOCUMENTS

KR    20180060941 A    6/2018
KR    20190055677 A    5/2019
(Continued)

OTHER PUBLICATIONS

Loubet, N. et al., "Stacked Nanosheet Gate-All-Around Transistor to Enable Scaling Beyond FinFET," 2017 Symposium on VLSI Technology Digest of Technical Papers, Jun. 5-8, 2017, pp. T230-T231.

*Primary Examiner* — Christine S. Kim
*Assistant Examiner* — Tyler J Wiegand
(74) *Attorney, Agent, or Firm* — Slater Matsil, LLP

(57) ABSTRACT

In an embodiment, a device includes: a first nanostructure; a source/drain region adjoining a first channel region of the first nanostructure, the source/drain region including: a main layer; and a first liner layer between the main layer and the first nanostructure, a carbon concentration of the first liner layer being greater than a carbon concentration of the main layer; an inter-layer dielectric on the source/drain region; and a contact extending through the inter-layer dielectric, the contact connected to the main layer, the contact spaced apart from the first liner layer.

20 Claims, 45 Drawing Sheets

(51) Int. Cl.
  *H10D 30/67* (2025.01)
  *H10D 84/01* (2025.01)
  *H10D 84/03* (2025.01)
  *H10D 30/69* (2025.01)

(52) U.S. Cl.
  CPC ..... *H10D 30/6735* (2025.01); *H10D 30/6757* (2025.01); *H10D 84/0128* (2025.01); *H10D 84/013* (2025.01); *H10D 84/0147* (2025.01); *H10D 84/038* (2025.01); *H10D 30/797* (2025.01)

(56) References Cited

U.S. PATENT DOCUMENTS

| | | | |
|---|---|---|---|
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,115,808 B2 | 10/2018 | Lin et al. | |
| 11,024,550 B2 | 6/2021 | Liao et al. | |
| 11,264,485 B2 | 3/2022 | Wang et al. | |
| 11,309,404 B2 | 4/2022 | Colombeau et al. | |
| 2016/0211371 A1* | 7/2016 | Tsai | H01L 29/7847 |
| 2020/0013878 A1* | 1/2020 | Colombeau | H10D 30/031 |
| 2020/0058561 A1 | 2/2020 | Liao et al. | |
| 2020/0168716 A1* | 5/2020 | Peng | H01L 29/78696 |
| 2020/0365692 A1* | 11/2020 | Jung | H10D 30/62 |
| 2021/0126106 A1 | 4/2021 | Wang et al. | |
| 2021/0234020 A1* | 7/2021 | Mochizuki | H01L 29/42392 |

FOREIGN PATENT DOCUMENTS

| | | |
|---|---|---|
| KR | 20200020631 A | 2/2020 |
| KR | 20210016091 A | 2/2021 |
| TW | 201820633 A | 6/2018 |
| TW | 202016980 A | 5/2020 |
| TW | 202117819 A | 5/2021 |

* cited by examiner

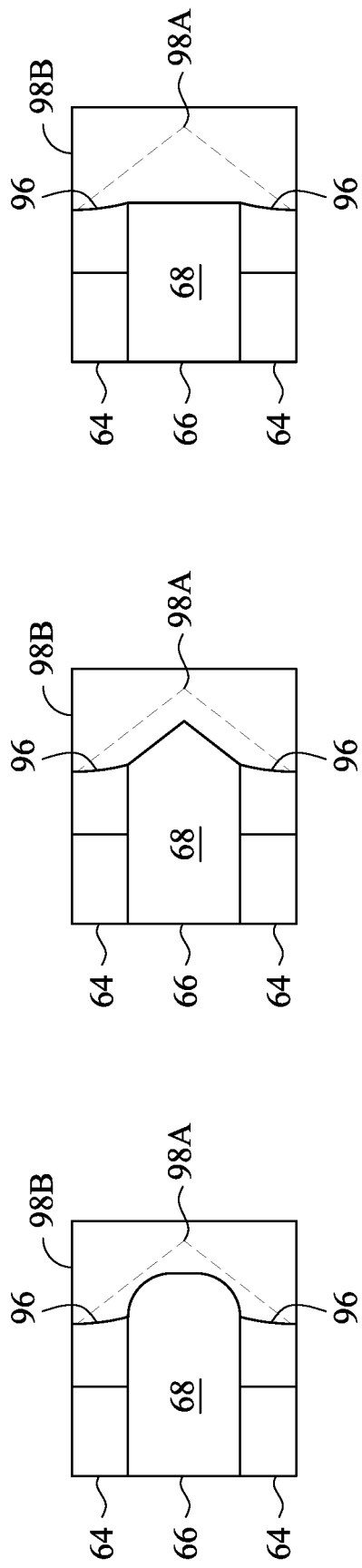
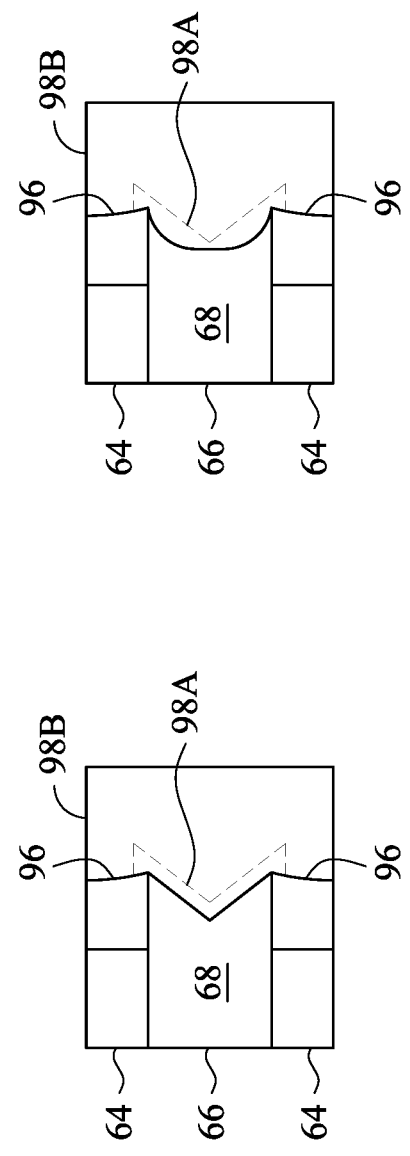
Figure 19A  Figure 19B  Figure 19C  Figure 19D  Figure 19E

METHODS OF FORMING TRANSISTOR SOURCE/DRAIN REGIONS COMPRISING CARBON LINER LAYERS

PRIORITY CLAIM AND CROSS-REFERENCE

This application claims the benefit of U.S. Provisional Application No. 63/188,134, filed on May 13, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-25C are views of intermediate stages in the manufacturing of nano-FETs, in accordance with some embodiments.

DETAILED DESCRIPTION

Figure 1:
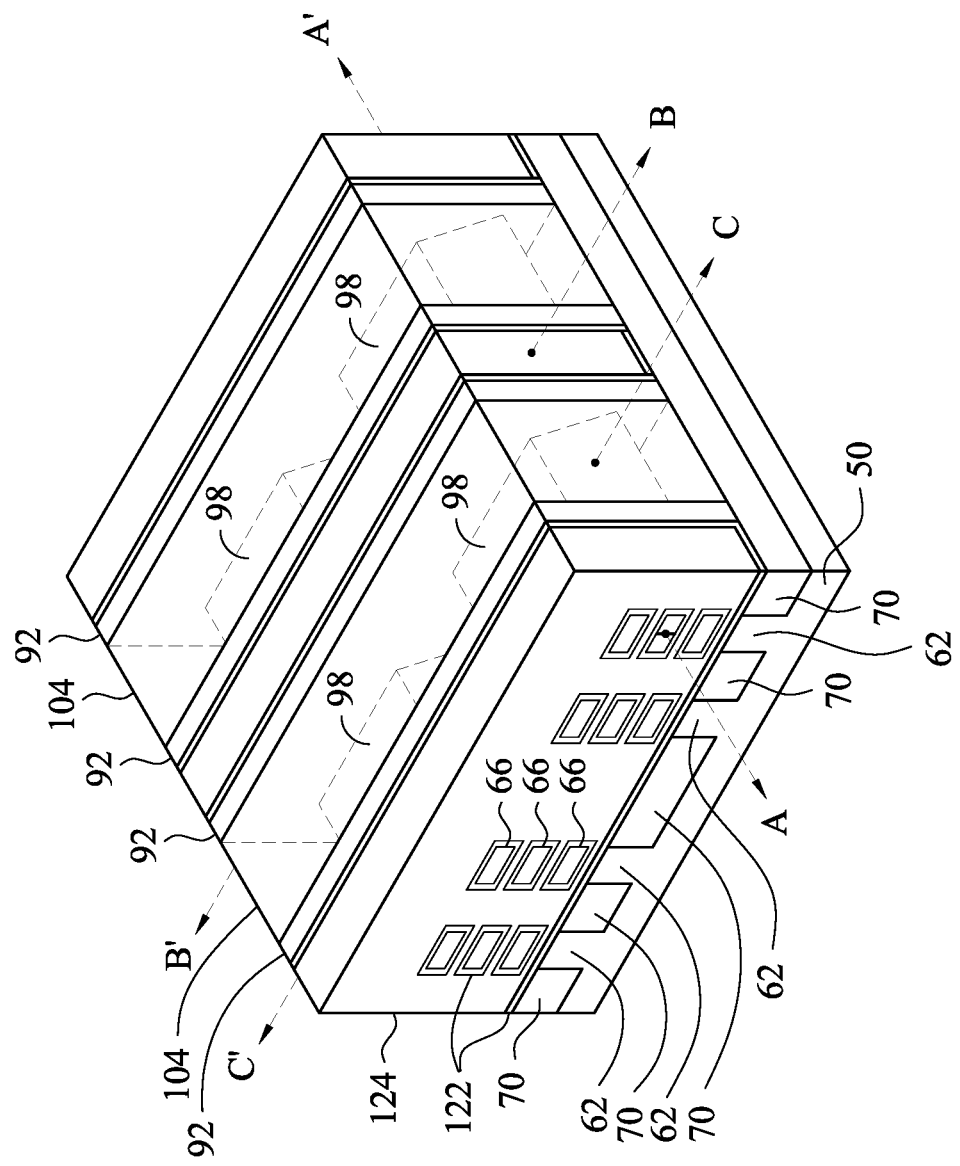
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

According to various embodiments, source/drain regions for n-type devices are epitaxially grown with liner layers. The liner layers include a semiconductor material that is composed of a blocker element, which helps reduce out-diffusion of dopants from the source/drain regions into adjoining channel regions. By reducing the diffusion of dopants into the channel regions, channel mobility may be increased. Device performance may thus be increased.

Embodiments are described in a particular context, a die including nano-FETs. Various embodiments may be applied, however, to dies including other types of transistors (e.g., fin field-effect transistors (finFETs), planar transistors, or the like) in lieu of or in combination with the nano-FETs.

FIG. 1 illustrates an example of nano-FETs (e.g., nanowire FETs, nanosheet FETs, or the like), in accordance with some embodiments. FIG. 1 is a three-dimensional view, where some features of the nano-FETs are omitted for illustration clarity. The nano-FETs may be nanosheet field-effect transistors (NSFETs), nanowire field-effect transistors (NWFETs), gate-all-around field-effect transistors (GAAFETs), or the like.

The nano-FETs include nanostructures 66 (e.g., nanosheets, nanowires, or the like) over fins 62 on a substrate 50 (e.g., a semiconductor substrate), with the nanostructures 66 acting as channel regions for the nano-FETs. The nanostructures 66 may include p-type nanostructures, n-type nanostructures, or a combination thereof. Isolation regions 70, such as shallow trench isolation (STI) regions, are disposed between adjacent fins 62, which may protrude above and from between adjacent isolation regions 70. Although the isolation regions 70 are described/illustrated as being separate from the substrate 50, as used herein, the term "substrate" may refer to the semiconductor substrate alone or a combination of the semiconductor substrate and the isolation regions. Additionally, although a bottom portion of the fins 62 are illustrated as being single, continuous materials with the substrate 50, the bottom portion of the fins 62 and/or the substrate 50 may include a single material or a plurality of materials. In this context, the fins 62 refer to the portion extending above and from between the adjacent isolation regions 70.

Gate dielectrics 122 are over top surfaces of the fins 62 and wrapped around the top surfaces, sidewalls, and bottom surfaces of the nanostructures 66. Gate electrodes 124 are over and wrapped around the gate dielectrics 122. Epitaxial source/drain regions 98 are disposed on the fins 62 at opposing sides of the gate dielectrics 122 and the gate electrodes 124. An inter-layer dielectric (ILD) 104 is formed over the epitaxial source/drain regions 98. Source/drain contact (subsequently described) to the epitaxial source/drain regions 98 are formed through the ILD 104. The epitaxial source/drain regions 98 may be shared between various nanostructures 66 and fins 62. For example, adjacent epitaxial source/drain regions 98 may be electrically connected, such as through coalescing the epitaxial source/drain regions 98 by epitaxial growth, or through coupling the epitaxial source/drain regions 98 with a same source/drain contact.

FIG. 1 further illustrates reference cross-sections that are used in later figures. Cross-section A-A' is along a longitudinal axis of a fin 62 and in a direction of, for example, a current flow between the epitaxial source/drain regions 98 of a nano-FET. Cross-section B-B' is along a longitudinal axis of a gate electrode 124 and in a direction, for example, perpendicular to a direction of current flow between the epitaxial source/drain regions 98 of a nano-FET. Cross-section C-C' is parallel to cross-section B-B' and extends through epitaxial source/drain regions 98 of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (finFETs). For example, finFETs may include fins on a substrate, with the fins acting as channel regions for the finFETs. Similarly, planar FETs may include a substrate, with portions of the substrate acting as channel regions for the planar FETs.

FIGS. 2-25C are views of intermediate stages in the manufacturing of nano-FETs, in accordance with some embodiments. FIGS. 2-6 are three-dimensional views showing a similar three-dimensional view as FIG. 1. FIGS. 7A, 8A, 9A, 10A, 11A, 14A, 15, 16, 17, 20A, 21A, 22A, 23A, 24A, and 25A illustrate reference cross-section A-A' illustrated in FIG. 1. FIGS. 7B, 8B, 9B, 10B, 11B, 14B, 20B, 21B, 22B, 23B, 24B, and 25B illustrate reference cross-section B-B' illustrated in FIG. 1. FIGS. 7C, 8C, 9C, 10C, 11C, 14C, 20C, 21C, 22C, 23C, 24C, and 25C illustrate reference cross-section C-C' illustrated in FIG. 1.

Figure 2:
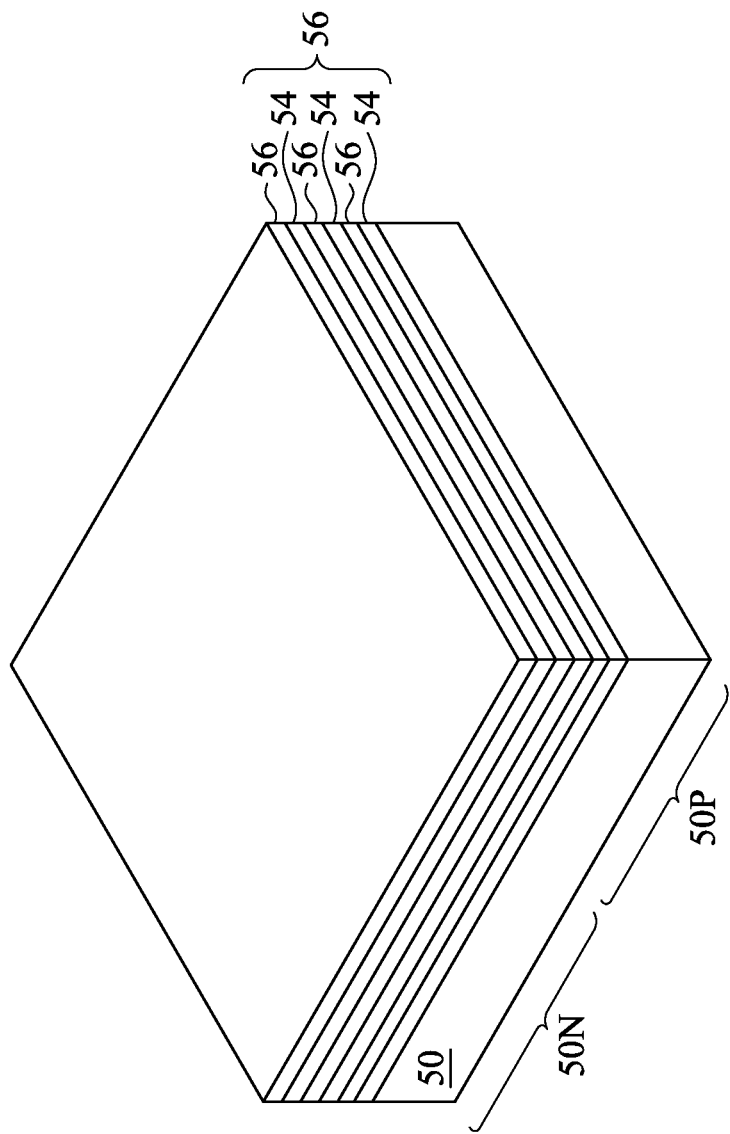

In FIG. 2, a substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (not separately illustrated), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type or an n-type impurity. An anti-punch-through (APT) implantation may be performed on an upper portion of the substrate 50 to form an APT region. During the APT implantation, impurities may be implanted in the substrate 50. The impurities may have a conductivity type opposite from a conductivity type of source/drain regions that will be subsequently formed in each of the n-type region 50N and the p-type region 50P. The APT region may extend under the source/drain regions in the nano-FETs. The APT region may be used to reduce the leakage from the source/drain regions to the substrate 50. In some embodiments, the impurity concentration in the APT region may be in the range of $10^{18}$ cm$^{-3}$ to $10^{19}$ cm$^{-3}$.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50. In the illustrated embodiment, the multi-layer stack 52 includes three layers of each of the first semiconductor layers 54 and the second semiconductor layers 56. It should be appreciated that the multi-layer stack 52 may include any number of the first semiconductor layers 54 and the second semiconductor layers 56.

In the illustrated embodiment, and as will be subsequently described in greater detail, the first semiconductor layers 54 will be removed and the second semiconductor layers 56 will be patterned to form channel regions for the nano-FETs in both the n-type region 50N and the p-type region 50P. The first semiconductor layers 54 are sacrificial layers (or dummy layers), which will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56, such as silicon germanium. The second semiconductor material of the second semiconductor layers 56 is a material suitable for both n-type and p-type devices, such as silicon.

In another embodiment (not separately illustrated), the first semiconductor layers 54 will be patterned to form channel regions for nano-FETs in one region (e.g., the p-type region 50P), and the second semiconductor layers 56 will be patterned to form channel regions for nano-FETs in another region (e.g., the n-type region 50N). The first semiconductor material of the first semiconductor layers 54 may be a material suitable for p-type devices, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 56 may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 54 may be removed without removing the second semiconductor layers 56 in the n-type region 50N, and the second semiconductor layers 56 may be removed without removing the first semiconductor layers 54 in the p-type region 50P.

Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like. Each of the layers may have a small thickness, such as a thickness in a range of 5 nm to 30 nm. In some embodiments, some layers of the multi-layer stack 52 (e.g., the second semiconductor layers 56) are formed to be thinner than other layers of the multi-layer stack 52 (e.g., the first semiconductor layers 54).

Figure 3:
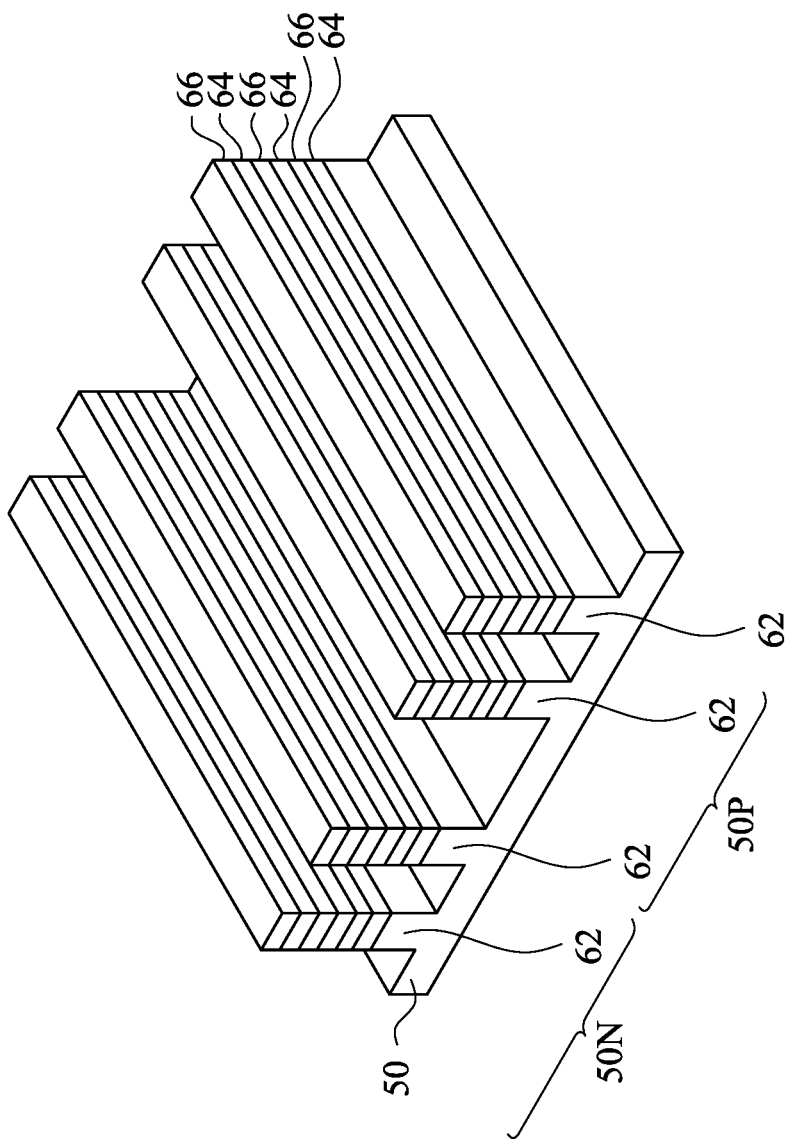

In FIG. 3, trenches are patterned in the substrate 50 and the multi-layer stack 52 to form fins 62, first nanostructures 64, and second nanostructures 66. The fins 62 are semiconductor strips patterned in the substrate 50. The first nanostructures 64 and the second nanostructures 66 include the remaining portions of the first semiconductor layers 54 and the second semiconductor layers 56, respectively. The trenches may be patterned by any acceptable etch process, such as a reactive ion etch (RIE), neutral beam etch (NBE), the like, or a combination thereof. The etching may be anisotropic.

The fins 62 and the nanostructures 64, 66 may be patterned by any suitable method. For example, the fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 62 and the nanostructures 64, 66. In some embodiments, the mask (or other layer) may remain on the nanostructures 64, 66.

The fins 62 and the nanostructures 64, 66 may each have widths in a range of 8 nm to 40 nm. In the illustrated embodiment, the fins 62 and the nanostructures 64, 66 have substantially equal widths in the n-type region 50N and the p-type region 50P. In another embodiment, the fins 62 and the nanostructures 64, 66 in one region (e.g., the n-type region 50N) are wider or narrower than the fins 62 and the nanostructures 64, 66 in another region (e.g., the p-type region 50P).

Figure 4:
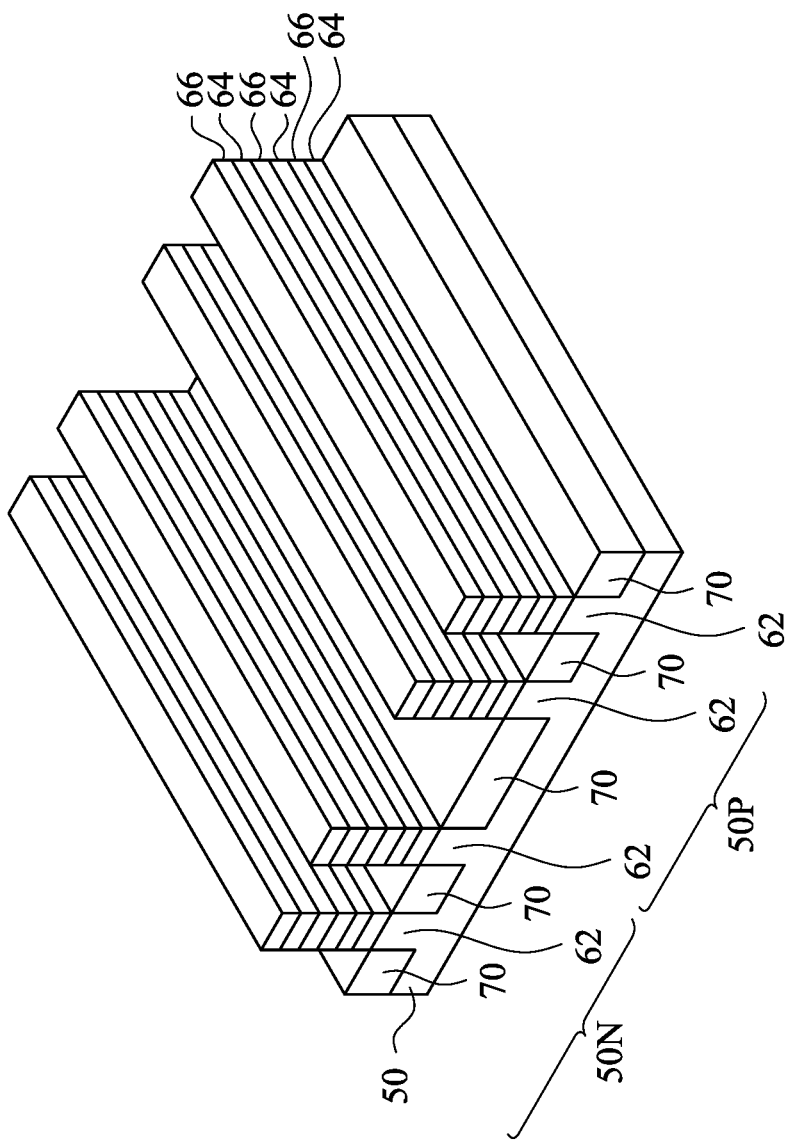

In FIG. 4, STI regions 70 are formed over the substrate 50 and between adjacent fins 62. The STI regions 70 are disposed around at least a portion of the fins 62 such that at least a portion of the nanostructures 64, 66 protrude from between adjacent STI regions 70. In the illustrated embodiment, the top surfaces of the STI regions 70 are coplanar (within process variations) with the top surfaces of the fins 62. In some embodiments, the top surfaces of the STI regions 70 are above or below the top surfaces of the fins 62. The STI regions 70 separate the features of adjacent devices.

The STI regions 70 may be formed by any suitable method. For example, an insulation material can be formed over the substrate 50 and the nanostructures 64, 66, and between adjacent fins 62. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the nanostructures 64, 66. Although the STI regions 70 are each illustrated as a single layer, some embodiments may utilize multiple layers. For example, in some embodiments a liner (not separately illustrated) may first be formed along surfaces of the substrate 50, the fins 62, and the nanostructures 64, 66. Thereafter, a fill material, such as those previously described may be formed over the liner.

A removal process is then applied to the insulation material to remove excess insulation material over the nanostructures 64, 66. In some embodiments, a planarization process such as a chemical mechanical polish (CMP), an etch-back process, combinations thereof, or the like may be utilized. In embodiments in which a mask remains on the nanostructures 64, 66, the planarization process may expose the mask or remove the mask. After the planarization process, the top surfaces of the insulation material and the mask (if present) or the nanostructures 64, 66 are coplanar (within process variations). Accordingly, the top surfaces of the mask (if present) or the nanostructures 64, 66 are exposed through the insulation material. In the illustrated embodiment, no mask remains on the nanostructures 64, 66. The insulation material is then recessed to form the STI regions 70. The insulation material is recessed such that at least a portion of the nanostructures 64, 66 protrude from between adjacent portions of the insulation material. Further, the top surfaces of the STI regions 70 may have a flat surface as illustrated, a convex surface, a concave surface (such as dishing), or a combination thereof. The top surfaces of the STI regions 70 may be formed flat, convex, and/or concave by an appropriate etch. The insulation material may be recessed using any acceptable etching process, such as one that is selective to the material of the insulation material (e.g., selectively etches the insulation material of the STI regions 70 at a faster rate than the materials of the fins 62 and the nanostructures 64, 66). For example, an oxide removal may be performed using dilute hydrofluoric (dHF) acid.

The process previously described is just one example of how the fins 62 and the nanostructures 64, 66 may be formed. In some embodiments, the fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 62 and/or the nanostructures 64, 66. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the nanostructures 64, 66, the fins 62, and/or the substrate 50 by doping (e.g., with a p-type or an n-type impurity). The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using mask (not separately illustrated) such as a photoresist. For example, a photoresist may be formed over the fins 62, the nanostructures 64, 66, and the STI regions 70 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of $10^{13}$ cm$^{-3}$ to $10^{14}$ cm$^{-3}$. After the implant, the photoresist may be removed, such as by any acceptable ashing process.

Following or prior to the implanting of the p-type region 50P, a mask (not separately illustrated) such as a photoresist is formed over the fins 62, the nanostructures 64, 66, and the STI regions 70 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of $10^{13}$ cm$^{-3}$ to $10^{14}$ cm$^{-3}$. After the implant, the photoresist may be removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the fins 62 and/or the nanostructures 64, 66, the grown materials may be in situ doped during growth, which may obviate the implantations, although in situ and implantation doping may be used together.

Figure 5:
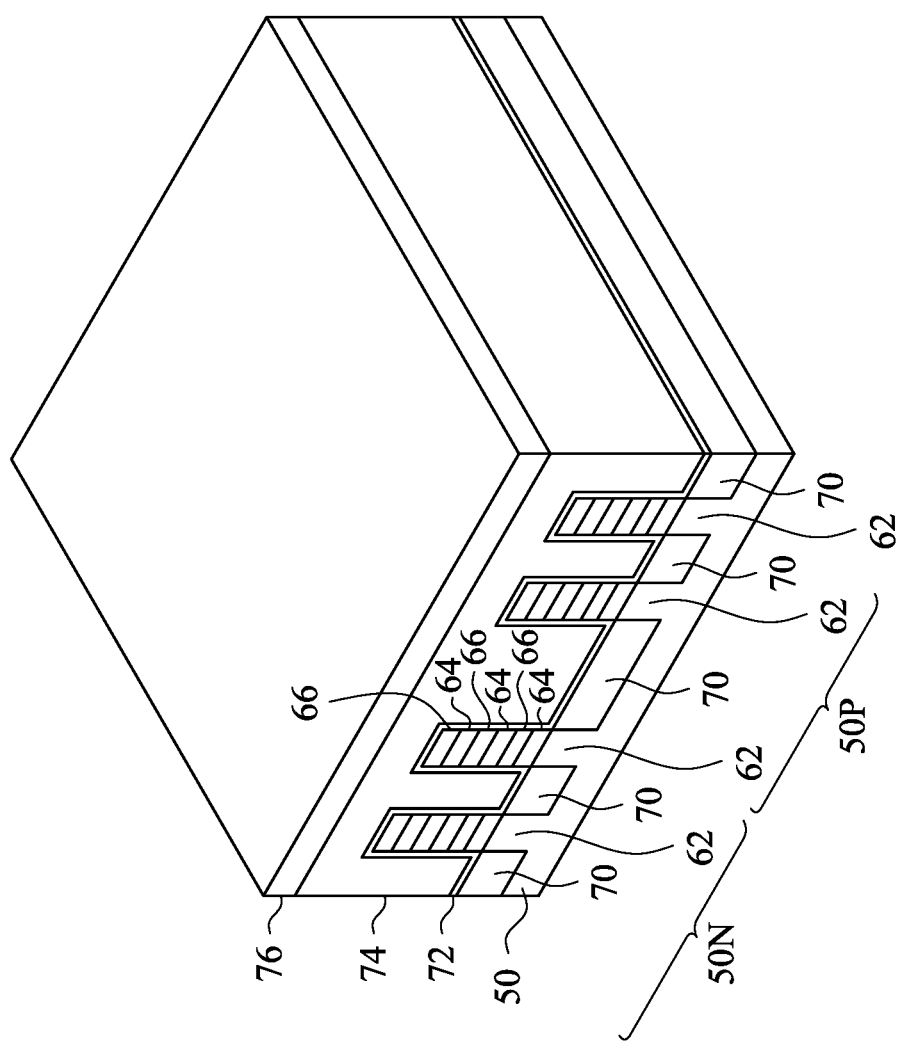

In FIG. 5, a dummy dielectric layer 72 is formed on the fins 62 and the nanostructures 64, 66. The dummy dielectric layer 72 may be formed of a dielectric material such as silicon oxide, silicon nitride, a combination thereof, or the like, which may be deposited or thermally grown according to acceptable techniques. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a CMP. The dummy gate layer 74 may be formed of a conductive or non-conductive material, such as amorphous silicon, polycrystalline-silicon (polysilicon), poly-crystalline silicon germanium (poly-SiGe), a metal, a metallic nitride, a metallic silicide, a metallic oxide, or the like, which may be deposited by physical vapor deposition (PVD), CVD, or the like. The dummy gate layer 74 may be formed of material(s) that have a high etching selectivity from the etching of insulation materials, e.g., the STI regions 70 and/or the dummy dielectric layer 72. The mask layer 76 may be deposited over the dummy gate layer 74. The mask layer 76 may be formed of a dielectric material such as silicon nitride, silicon oxynitride, or the like. In this example, a single dummy gate layer 74 and a single mask layer 76 are formed across the n-type region 50N and the p-type region 50P. In the illustrated embodiment, the dummy dielectric layer 72 covers the fins 62, the nanostructures 64, 66, and the STI regions 70, such that the dummy dielectric layer 72 extends over the STI regions 70 and between the dummy gate layer 74 and the STI regions 70. In another embodiment, the dummy dielectric layer 72 covers only the fins 62 and the nanostructures 64, 66.

Figure 6:
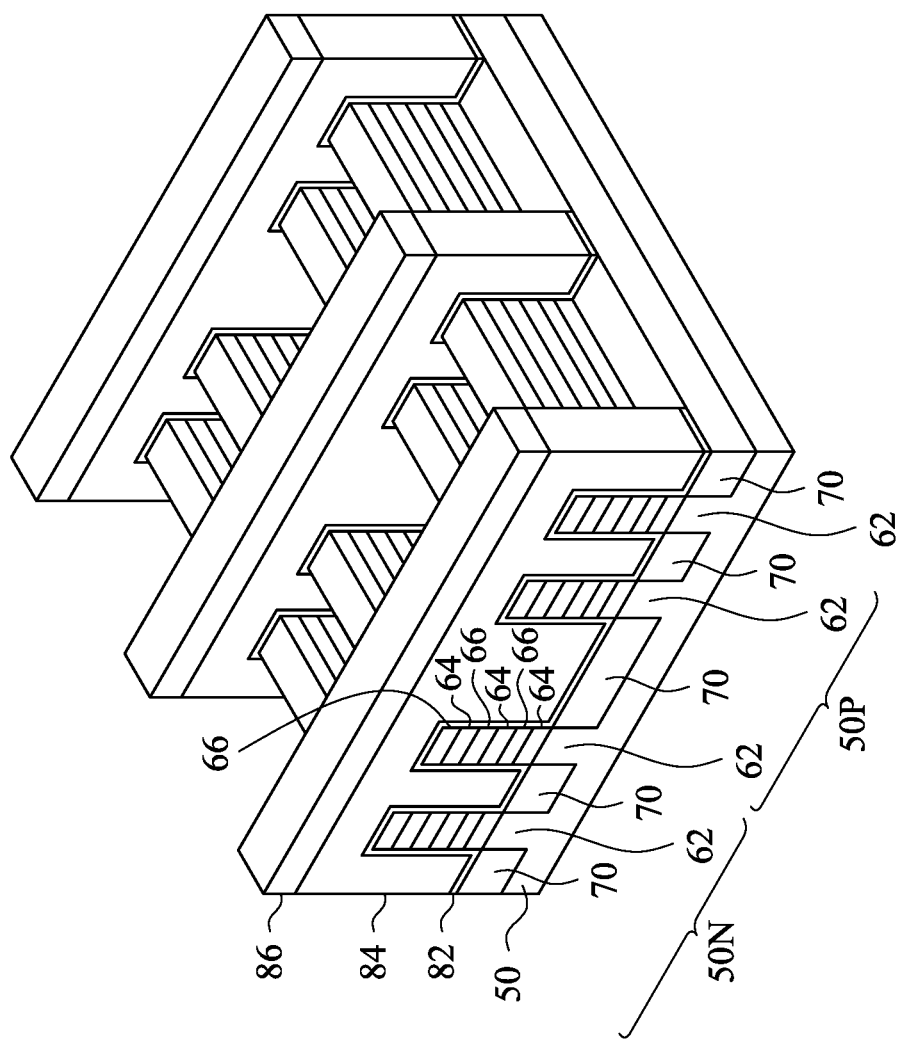

In FIG. 6, the mask layer 76 is patterned using acceptable photolithography and etching techniques to form masks 86. The pattern of the masks 86 is then transferred to the dummy gate layer 74 by any acceptable etching technique to form dummy gates 84. The pattern of the masks 86 may optionally be further transferred to the dummy dielectric layer 72 by any acceptable etching technique to form dummy dielectrics 82. The dummy gates 84 cover portions of the nanostructures 64, 66 that will be exposed in subsequent processing to form channel regions. Specifically, the dummy gates 84 extend along the portions of the second nanostructures 66 that will be patterned to form channel regions 68. The pattern of the masks 86 may be used to physically separate adjacent dummy gates 84. The dummy gates 84 may also have lengthwise directions substantially perpendicular (within process variations) to the lengthwise directions of the fins 62. The masks 86 can optionally be removed after patterning, such as by any acceptable etching technique.

FIGS. 7A-11C, 14A-17, and 20A-25C illustrate various additional steps in the manufacturing of embodiment devices. FIGS. 7A-11C, 14A-17, and 20A-25C illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are explained in the description accompanying each figure.

Figure 7A:
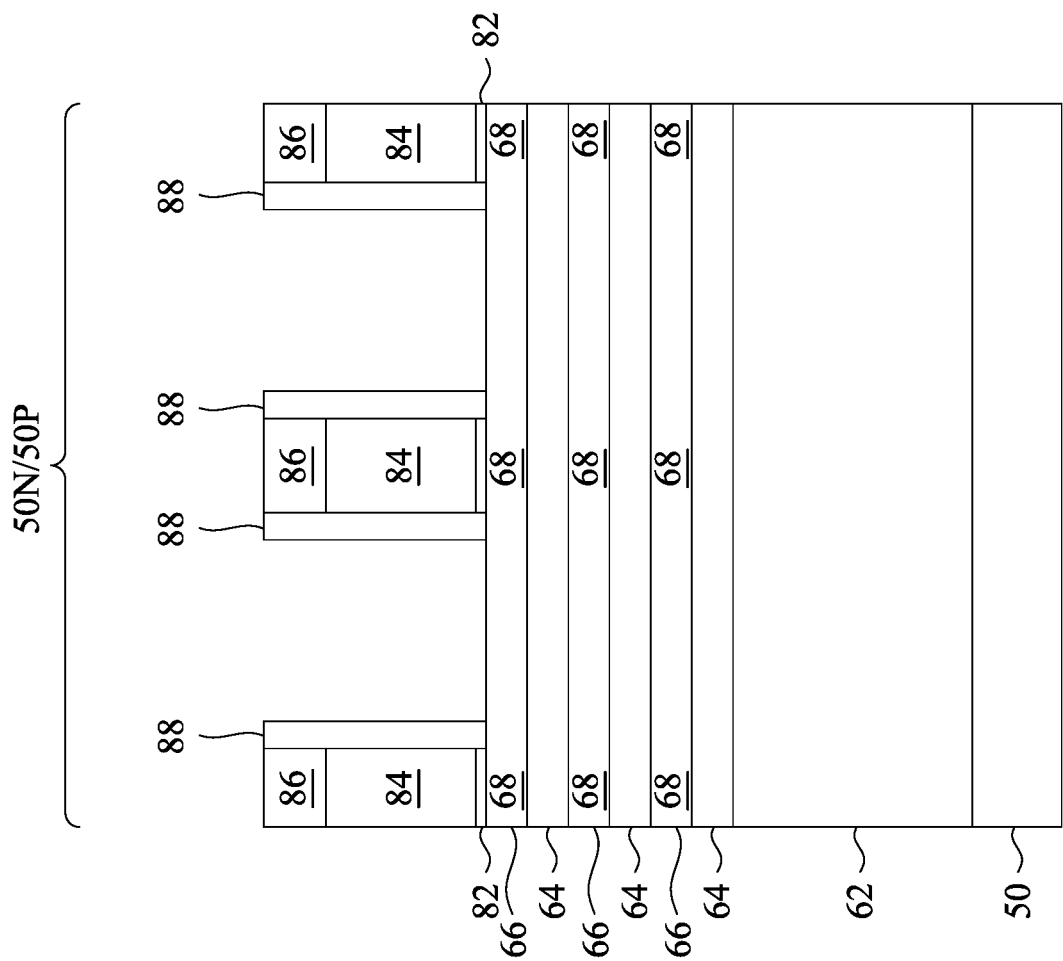
Figure 7C:
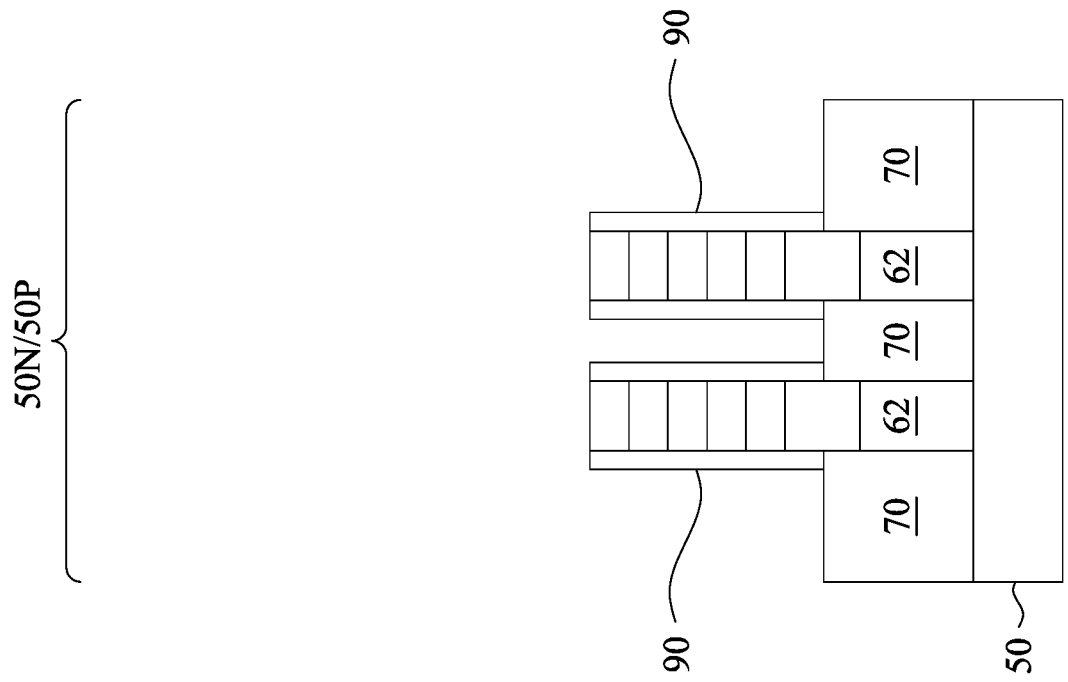
Figure 7B:
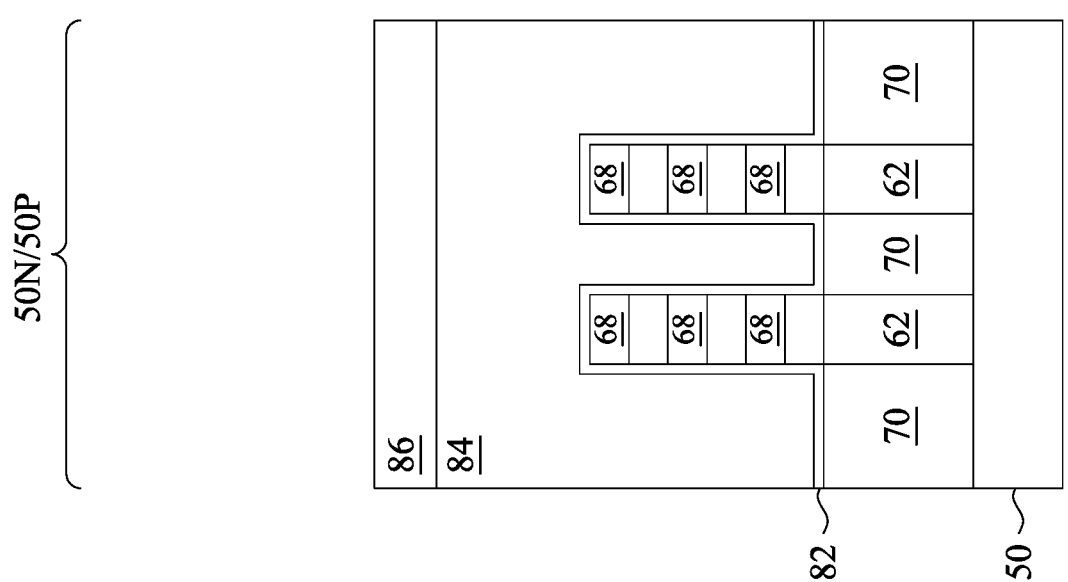

In FIGS. 7A-7C, gate spacers 88 are formed over the nanostructures 64, 66, on exposed sidewalls of the masks 86 (if present), the dummy gates 84, and the dummy dielectrics 82. The gate spacers 88 may be formed by conformally depositing one or more dielectric material(s) and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 84 (thus forming the gate spacers 88). The dielectric material(s), when etched, may also have portions left on the sidewalls of the fins 62 and/or the nanostructures 64, 66 (thus forming fin spacers 90). After etching, the fin spacers 90 (if present) and the gate spacers 88 can have straight sidewalls (as illustrated) or can have curved sidewalls (not separately illustrated).

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the fins 62 and/or the nanostructures 64, 66 exposed in the p-type region 50P. The mask may then be removed. Subsequently, a mask (not separately illustrated) such as a photoresist may be formed over the p-type region 50P while exposing the n-type region 50N, and appropriate type impurities (e.g., n-type) may be implanted into the fins 62 and/or the nanostructures 64, 66 exposed in the n-type region 50N. The mask may then be removed. The n-type impurities may be any of the n-type impurities previously described, and the p-type impurities may be any of the p-type impurities previously described. During the implanting, the channel regions 68 remain covered by the dummy gates 84, so that the channel regions 68 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 8A:
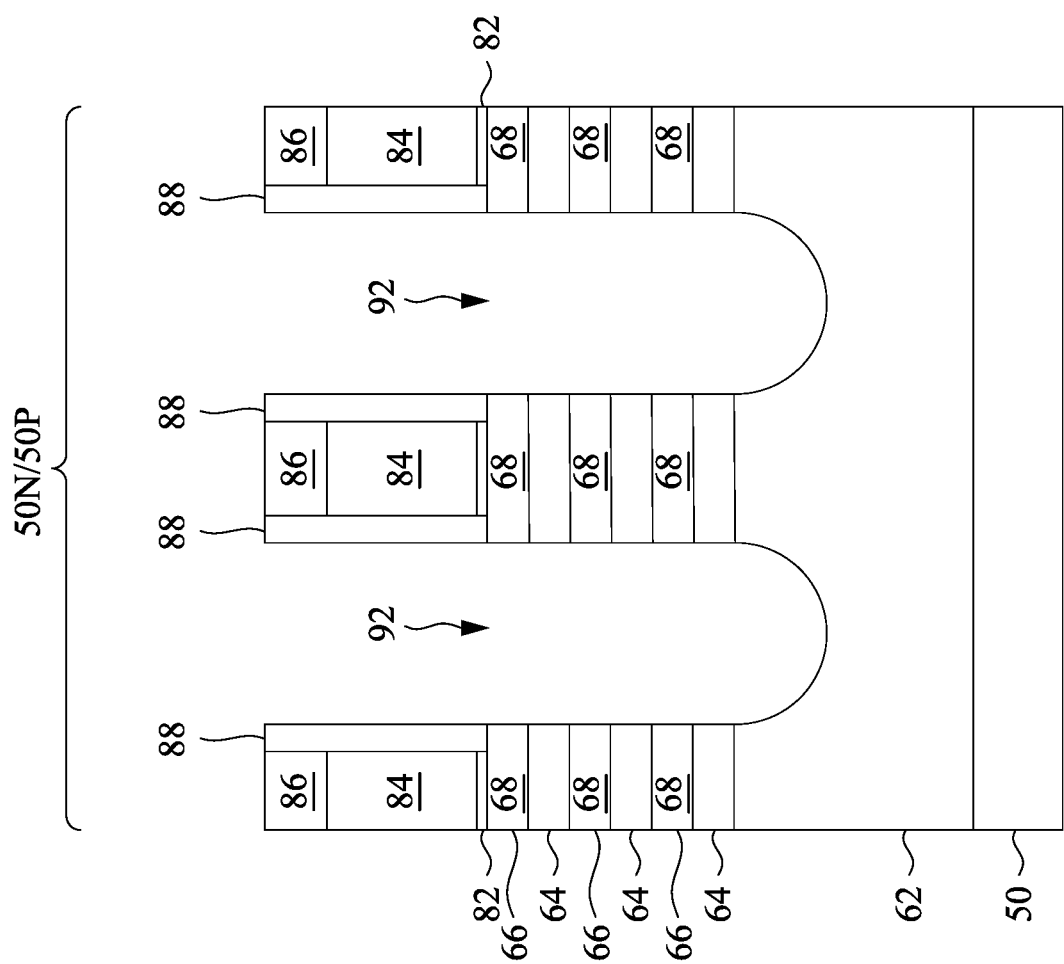
Figure 8C:
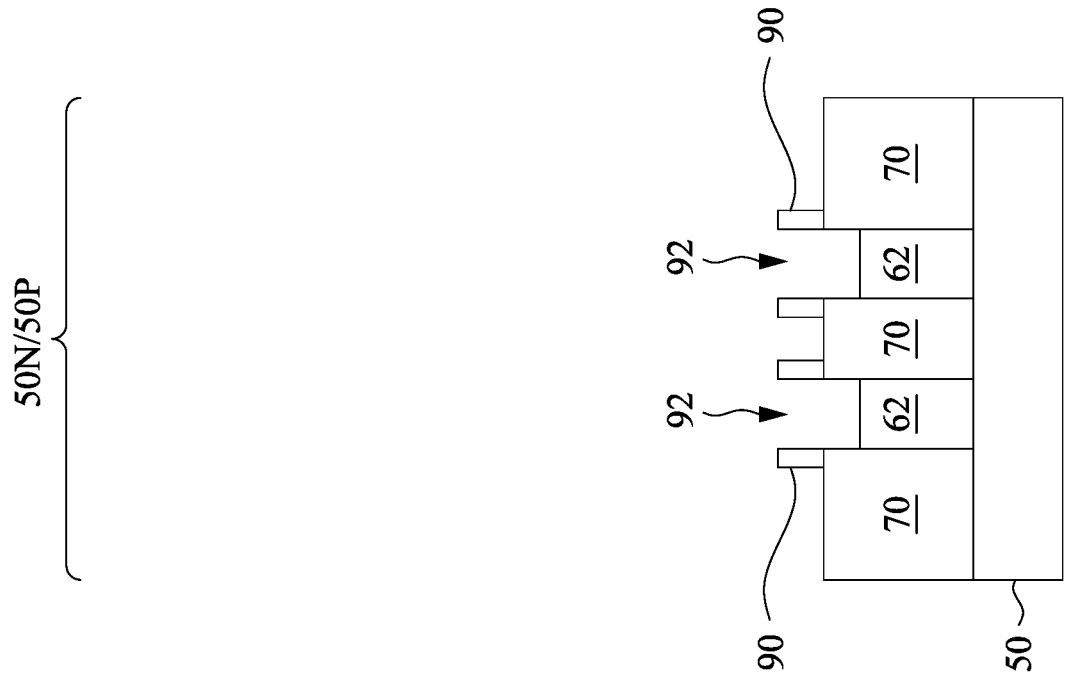
Figure 8B:
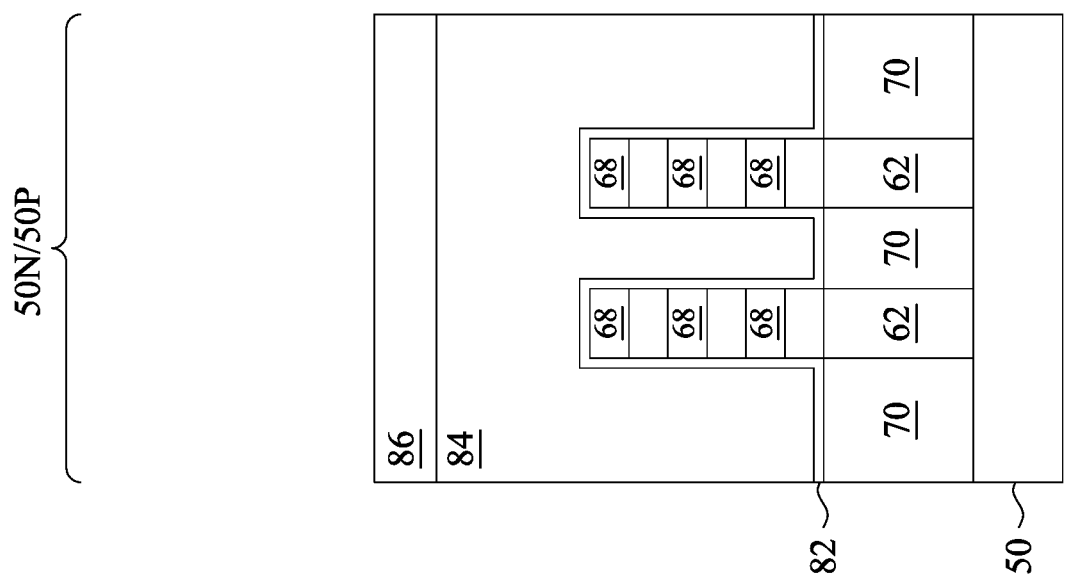

In FIGS. 8A-8C, source/drain recesses 92 are formed in the nanostructures 64, 66. In the illustrated embodiment, the source/drain recesses 92 extend through the nanostructures 64, 66 and into the fins 62. The source/drain recesses 92 may also extend into the substrate 50. In various embodiments, the source/drain recesses 92 may extend to a top surface of the substrate 50 without etching the substrate 50; the fins 62 may be etched such that bottom surfaces of the source/drain recesses 92 are disposed below the top surfaces of the STI regions 70; or the like. The source/drain recesses 92 may be formed by etching the nanostructures 64, 66 using an anisotropic etching processes, such as a RIE, a NBE, or the like. The gate spacers 88 and the dummy gates 84 collectively mask portions of the fins 62 and/or the nanostructures 64, 66 during the etching processes used to form the source/drain recesses 92. A single etch process may be used to etch each of the nanostructures 64, 66, or multiple etch processes may be used to etch the nanostructures 64, 66. Timed etch processes may be used to stop the etching of the source/drain recesses 92 after the source/drain recesses 92 reach a desired depth. The fin spacers 90 (if present) may be etched during or after the etching of the source/drain recesses 92, so that the height of the fin spacers 90 is reduced. The dimensions of the source/drain regions that will be subsequently formed in the source/drain recesses 92 may be controlled by adjusting the height of the fin spacers 90.

Figure 9A:
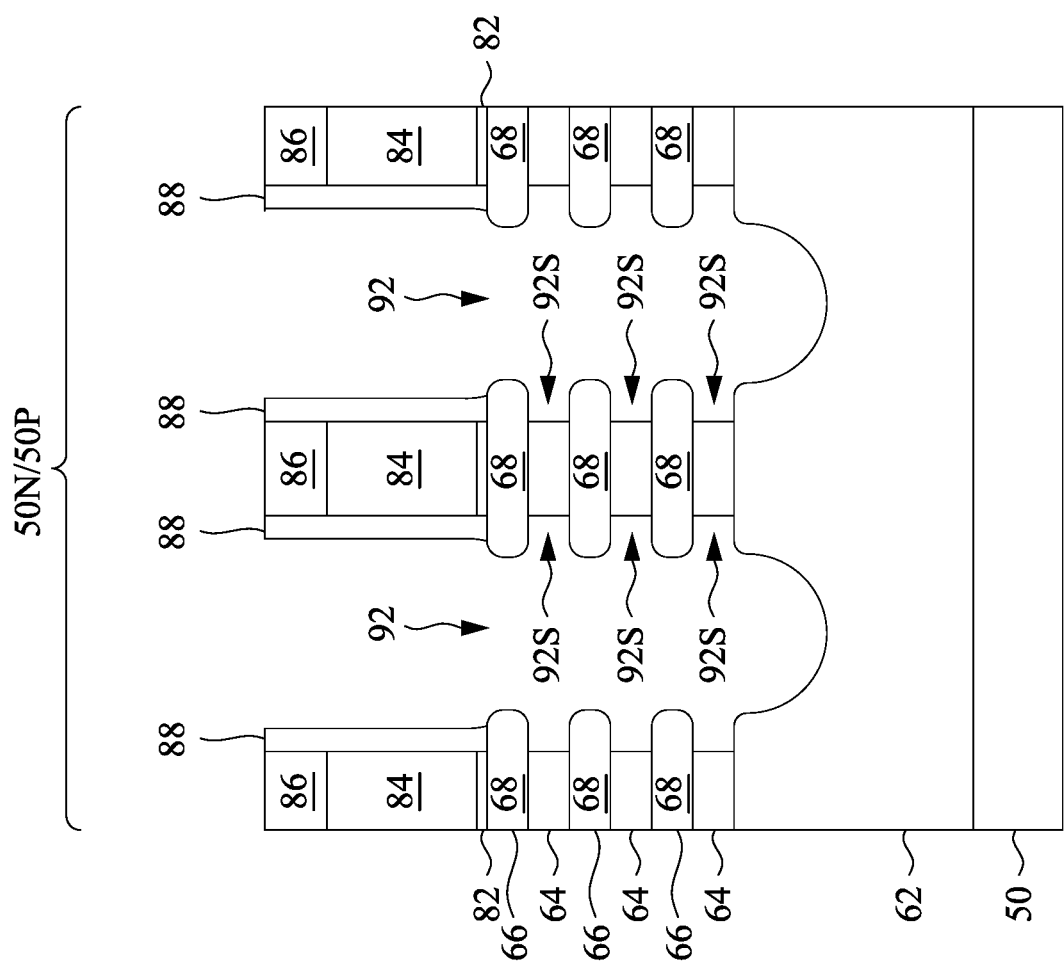
Figure 9C:
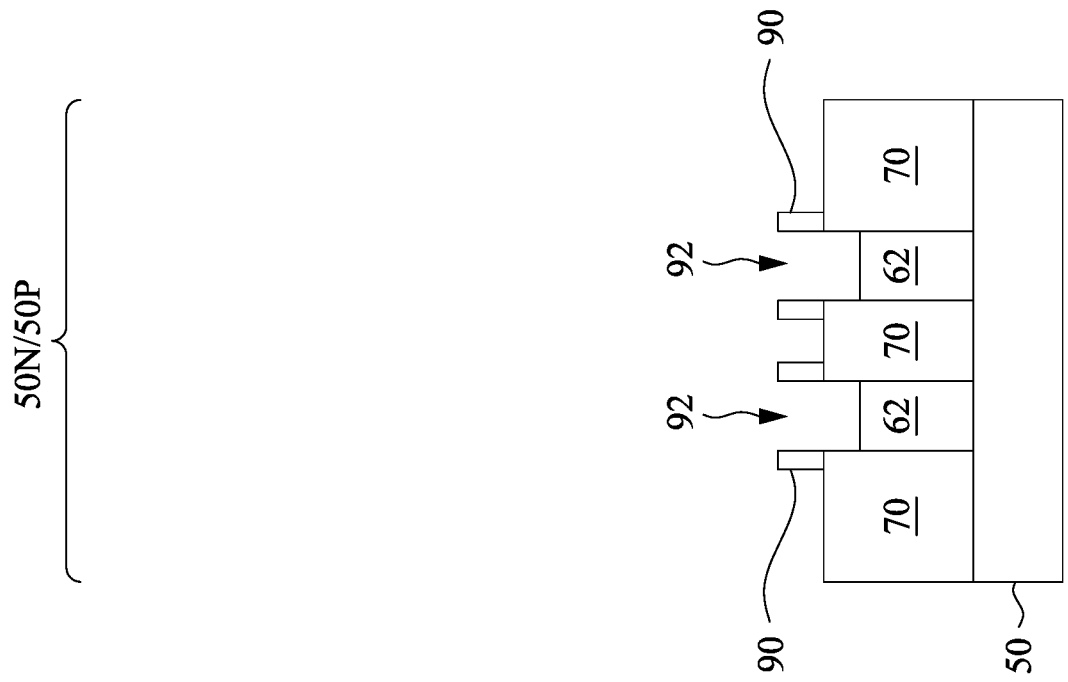
Figure 9B:
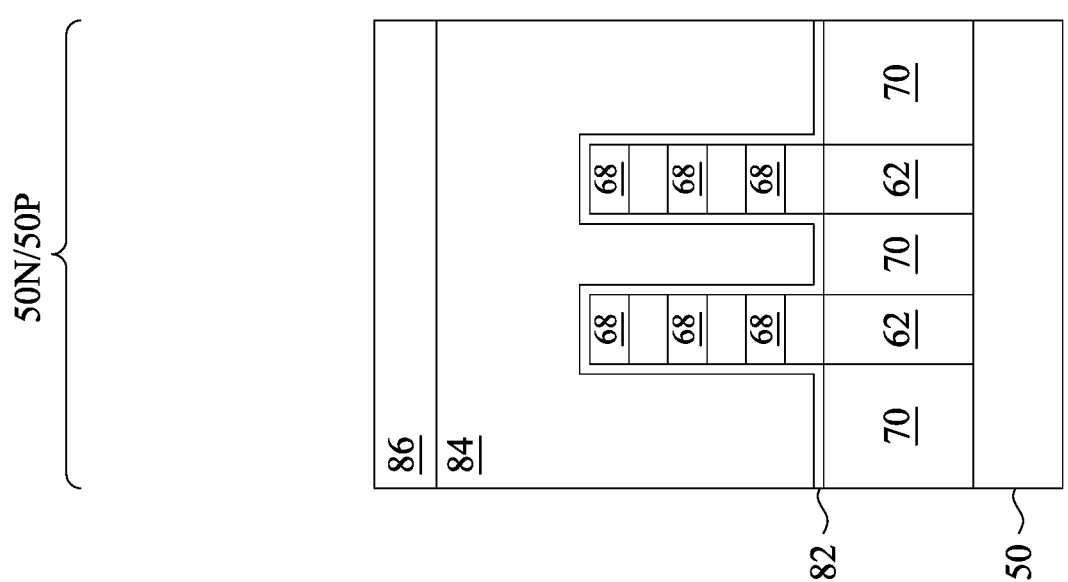

In FIGS. 9A-9C, the source/drain recesses 92 are laterally expanded to form sidewall recesses 92S in the source/drain recesses 92. Specifically, portions of the sidewalls of the first nanostructures 64 exposed by the source/drain recesses 92 are recessed. Although sidewalls of the first nanostructures 64 are illustrated as being straight, the sidewalls may be concave or convex. The sidewalls may be recessed by any acceptable etching process, such as one that is selective to the material of the first nanostructures 64 (e.g., selectively etches the material of the first nanostructures 64 at a faster rate than the material of the second nanostructures 66). The etching may be isotropic. For example, when the second nanostructures 66 are formed of silicon and the first nanostructures 64 are formed of silicon germanium, the etching process may be a wet etch using tetramethylammonium hydroxide (TMAH), ammonium hydroxide (NH$_4$OH), or the like. In another embodiment, the etching process may be a dry etch using a fluorine-based gas such as hydrogen fluoride (HF) gas. In some embodiments, the same etching process may be continually performed to both form the source/drain recesses 92 and recess the sidewalls of the first nanostructures 64.

In some embodiments, the widths of the gate spacers 88 are reduced, such as by the etching process used to form and/or expand the source/drain recesses 92. Further, the sidewalls of the second nanostructures 66 may be etched by the etching process used to form and/or expand the source/drain recesses 92. In some embodiments, the sidewalls of the second nanostructures 66 are rounded convex sidewalls at this stage of processing.

Figure 10A:
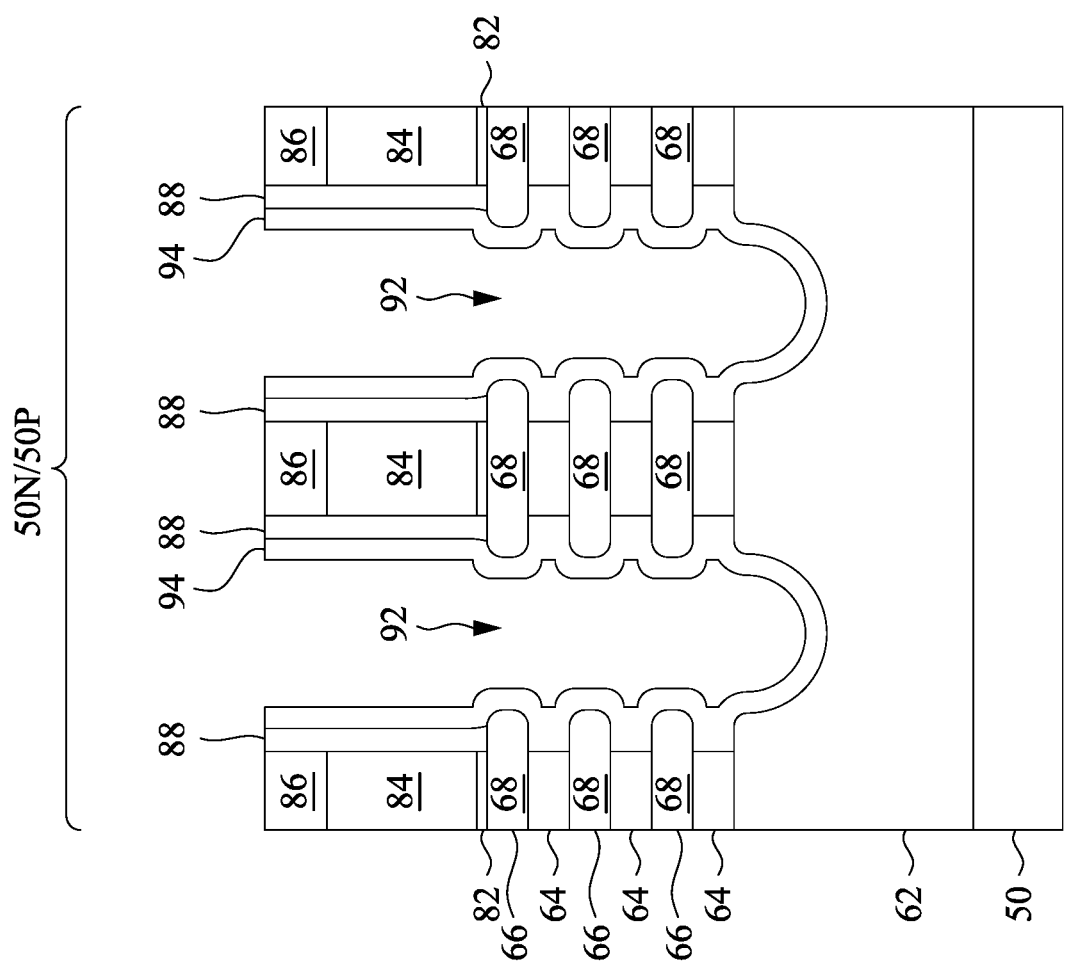
Figure 10C:
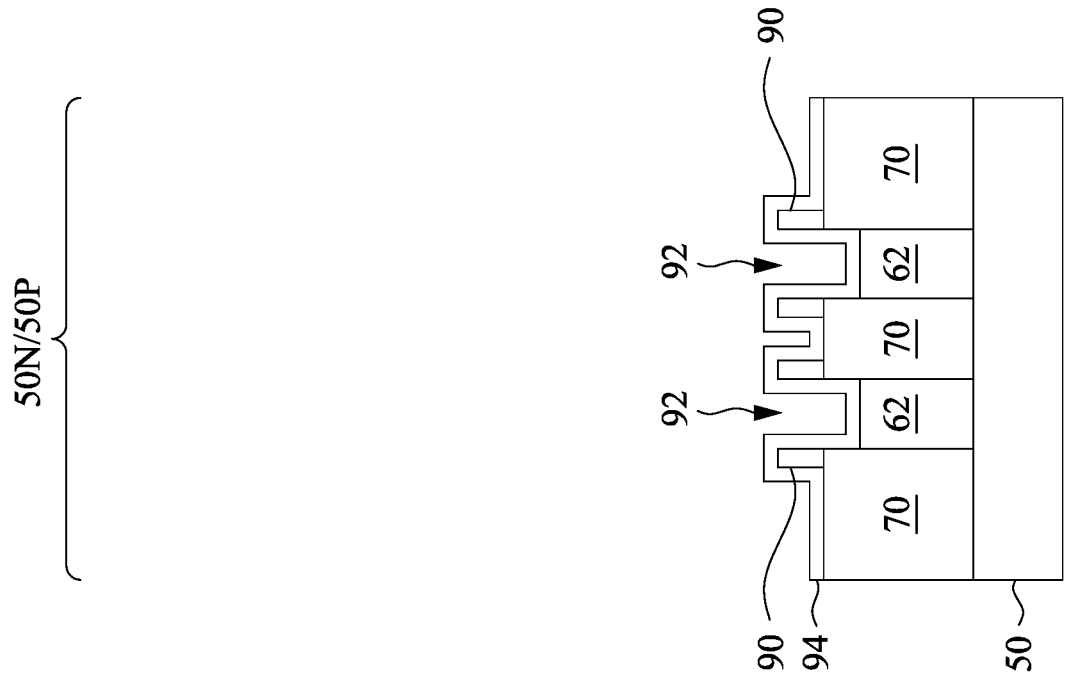
Figure 10B:
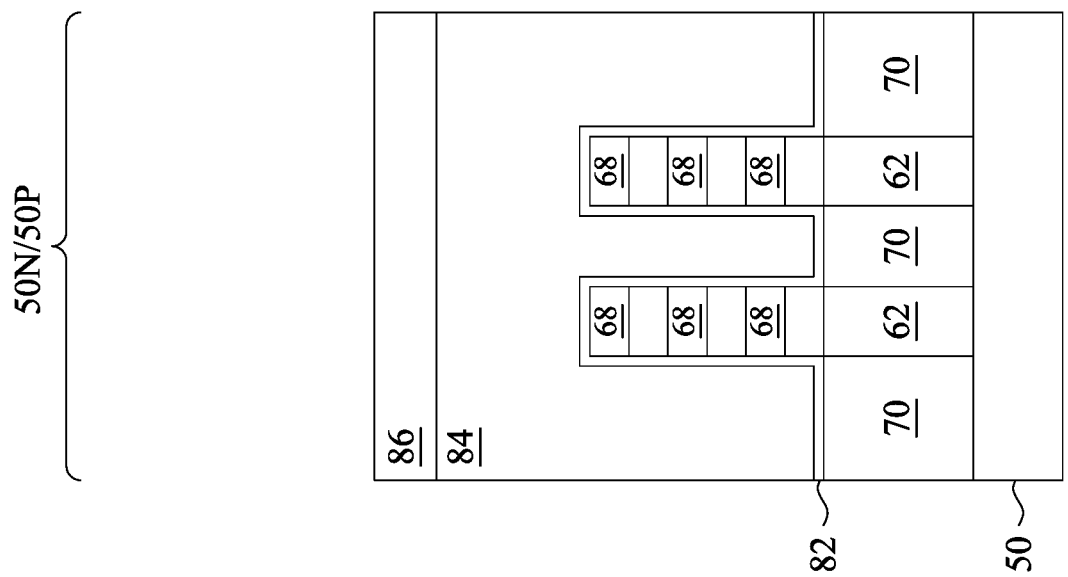

In FIGS. 10A-10C, a spacer layer 94 is deposited in the source/drain recesses 92, including in the sidewall recesses 92S (see FIGS. 9A-9C). The spacer layer 94 may also be deposited on the STI regions 70. The spacer layer 94 may be formed of a dielectric material such as silicon nitride, silicon oxynitride, silicon oxycarbonitride, or the like, which may be deposited by a conformal deposition process, such as ALD, CVD, or the like. A low-k dielectric material (e.g., dielectric materials having a k-value less than about 3.5) may be utilized. Other insulation materials formed by any acceptable process may be used.

Figure 11A:
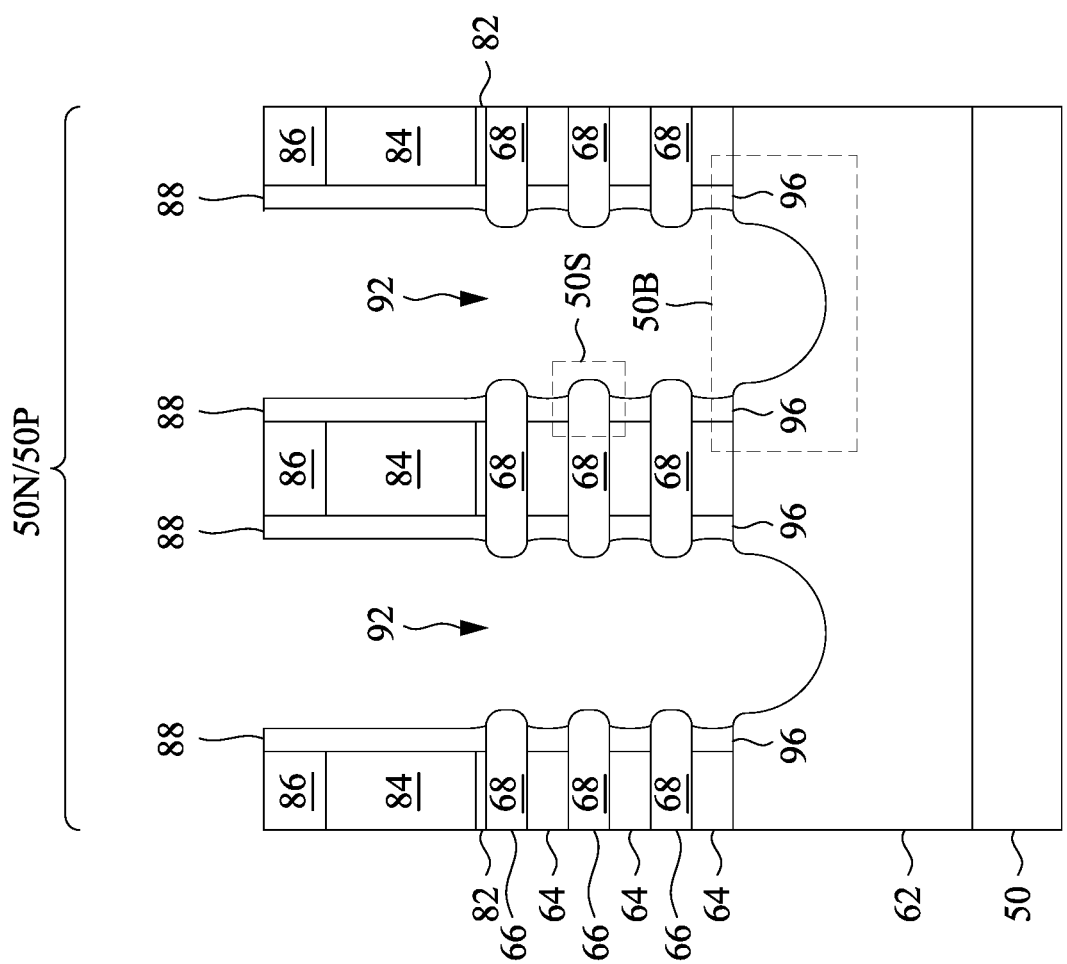
Figure 11C:
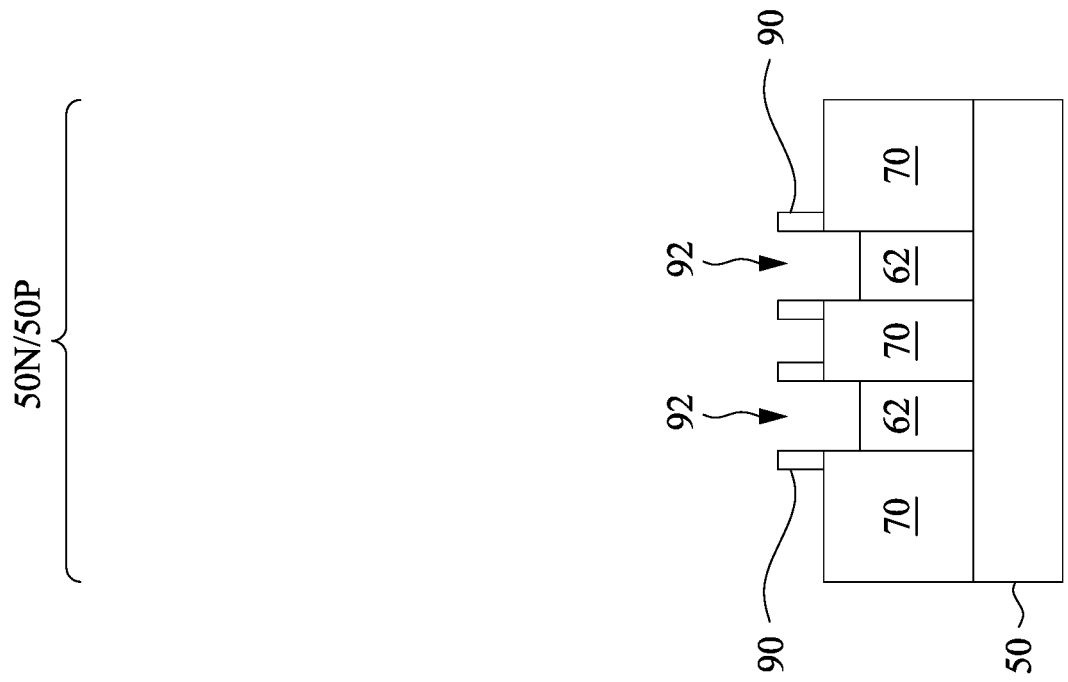
Figure 11B:
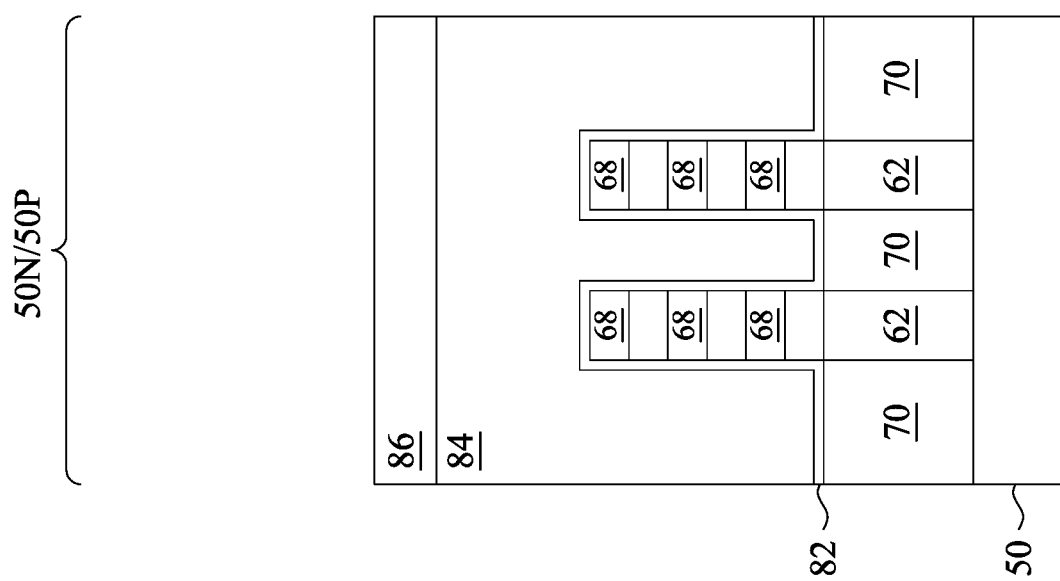

In FIGS. 11A-11C, the spacer layer 94 is patterned to form inner spacers 96 in the sidewall recesses 92S (see FIGS. 9A-9C) of the source/drain recesses 92. The spacer layer 94 may be patterned by any acceptable etch process, such as a reactive ion etch (RIE), neutral beam etch (NBE), the like, or a combination thereof. The etching may be anisotropic. Although outer sidewalls of the inner spacers 96 are illustrated as being flush with respect to the sidewalls of the gate spacers 88, the outer sidewalls of the inner spacers 96 may extend beyond or be recessed from the sidewalls of the gate spacers 88. In other words, the inner spacers 96 may partially fill, completely fill, or overfill the sidewall recesses 92S. Moreover, although the sidewalls of the inner spacers 96 are illustrated as being concave, the sidewalls of the inner spacers 96 may be straight or convex.

After formation, the inner spacers 96 are disposed on the sidewalls of the remaining portions of the first nanostructures 64, e.g., those sidewalls exposed by the source/drain recesses 92. As will be subsequently described in greater detail, source/drain regions will be subsequently formed in the source/drain recesses 92, and the first nanostructures 64 will be subsequently replaced with corresponding gate structures. The inner spacers 96 act as isolation features between the subsequently formed source/drain regions and the subsequently formed gate structures. Further, the inner spacers 96 may be used to substantially prevent damage to the subsequently formed source/drain regions by subsequent etching processes, such as etching processes used to subsequently remove the first nanostructures 64.

In this embodiment, the spacer layer 94 is removed from the bottoms of the source/drain recesses 92 so that no spacers are formed on the bottoms of the source/drain recesses 92. In other embodiments (subsequently described for FIG. 32A-33), the spacer etch used to form the inner spacers 96 is adjusted to also form spacers on the bottoms of the source/drain recesses 92, such as on the surfaces of the fins 62.

Figure 12C:
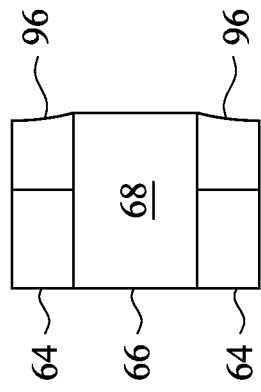
Figure 12B:
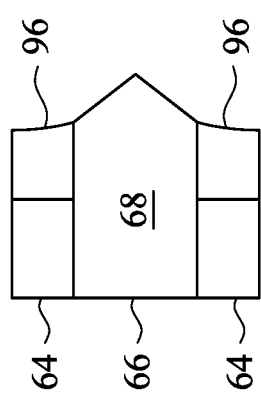
Figure 12A:
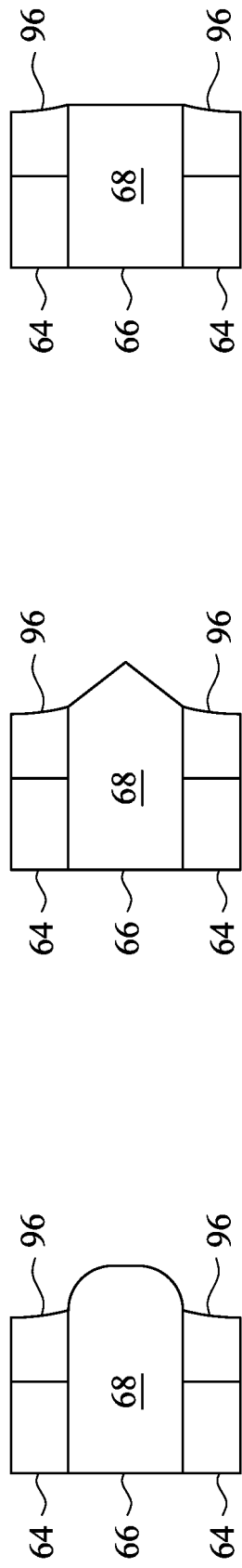
Figure 12E:
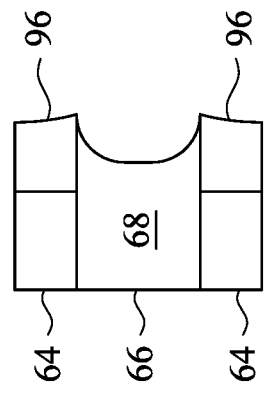
Figure 12D:
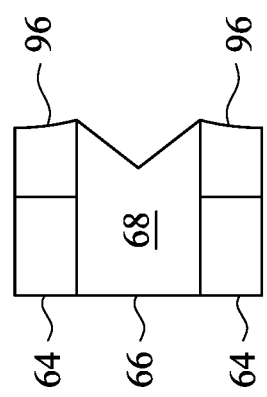

After the source/drain recesses 92 and the inner spacers 96 are formed, the second nanostructures 66 can have a variety of sidewall types. FIGS. 12A-12E illustrate different sidewall types in a region 50S in FIG. 11A. The sidewalls of the second nanostructures 66 may be rounded convex sidewalls, as shown by FIG. 12A. The sidewalls of the second nanostructures 66 may be polygonal convex sidewalls, as shown by FIG. 12B. The sidewalls of the second nanostructures 66 may be straight sidewalls, as shown by FIG. 12C. The sidewalls of the second nanostructures 66 may be polygonal concave sidewalls, as shown by FIG. 12D. The sidewalls of the second nanostructures 66 may be rounded concave sidewalls, as shown by FIG. 12E. Subsequent processing steps are shown for the embodiment of FIG. 12A, although those processing steps may be performed for any of the embodiments.

Figure 13A:
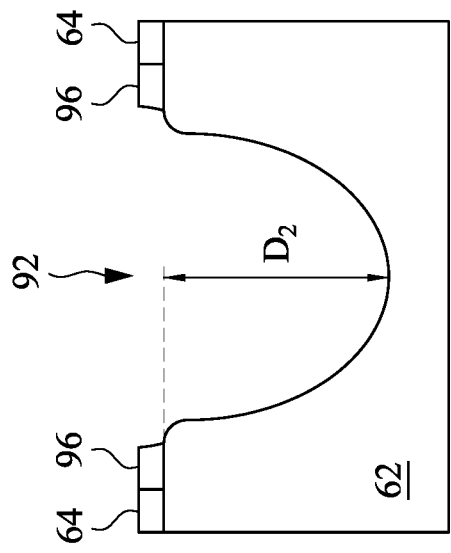
Figure 13B:
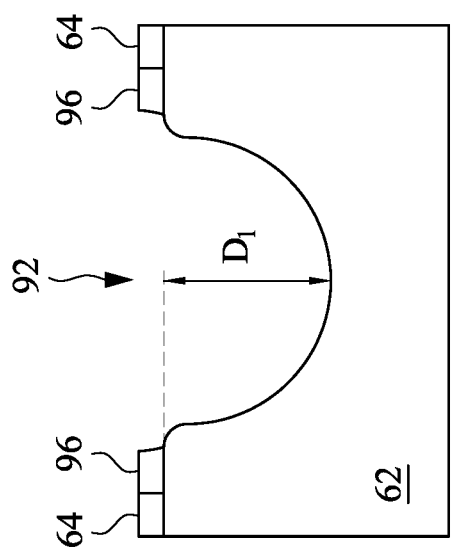
Figure 13C:
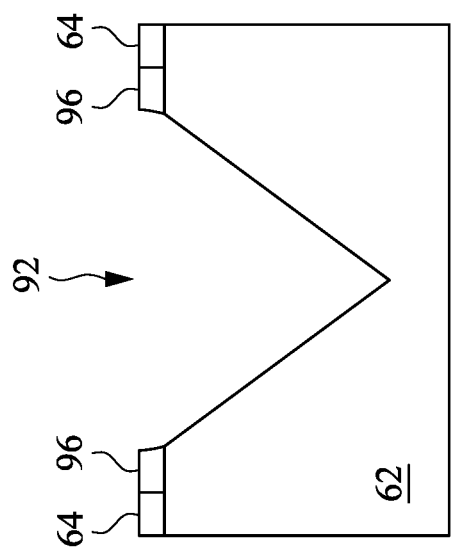

Further, after the source/drain recesses 92 and the inner spacers 96 are formed, the source/drain recesses 92 which extend into the fins 62 can have a variety of bottom types. FIGS. 13A-13C illustrate different bottom types in a region 50B in FIG. 11A. The bottoms of the source/drain recesses 92 which extend into the fins 62 may be shallow rounded concave bottoms, as shown by FIG. 13A. The bottoms of the source/drain recesses 92 which extend into the fins 62 may be deep rounded concave bottoms, as shown by FIG. 13B. The deep rounded concave bottoms shown in FIG. 13B extend further into the fins 62 than the shallow rounded concave bottoms shown in FIG. 13A. In some embodiments, the shallow rounded concave bottoms have a depth $D_1$ in the range of 3 nm to 20 nm, and the deep rounded concave bottoms have a depth $D_2$ in the range of 20 nm to 50 nm. The bottoms of the source/drain recesses 92 which extend into the fins 62 may be polygonal concave bottoms, as shown by FIG. 13C. Subsequent processing steps are shown for the embodiment of FIG. 13A, although those processing steps may be performed for any of the embodiments.

The second nanostructures 66 and/or the source/drain recesses 92 may be shaped to have the sidewall types and/or bottom types described for FIGS. 12A-13C by an appropriate etch. The shaping of the second nanostructures 66 and/or the source/drain recesses 92 may occur as a result of the etch used to initially form the source/drain recesses 92 (see FIGS. 8A-8C), as a result of the etch used to expand the source/drain recesses 92 (see FIGS. 9A-9C), and/or as a result of the etch used to pattern the spacer layer 94 (see FIGS. 11A-11C). The second nanostructures 66 and/or the source/drain recesses 92 may also be shaped by a separate etch performed after the inner spacers 96 are formed. In some embodiments, the etch is an anisotropic wet etch performed with potassium hydroxide (KOH), tetramethylammonium hydroxide (TMAH), and ethylenediamine pyrocatechol (EDP). In some embodiments, the etch is an anisotropic dry etch performed with carbon tetrafluoride ($CF_4$), fluoromethane ($CH_3F$), hydrogen bromide (HBr), and oxygen ($O_2$) gas in helium (He) and/or argon (Ar) while generating a plasma with a bias voltage or a bias power. In some embodiments, the etch is an isotropic dry etch performed with nitrogen trifluoride ($NF_3$), chlorine ($Cl_2$) gas, and hydrogen ($H_2$) gas in helium (He) and/or argon (Ar). In some embodiments, the etch is a combination of these processes.

Figure 14A:
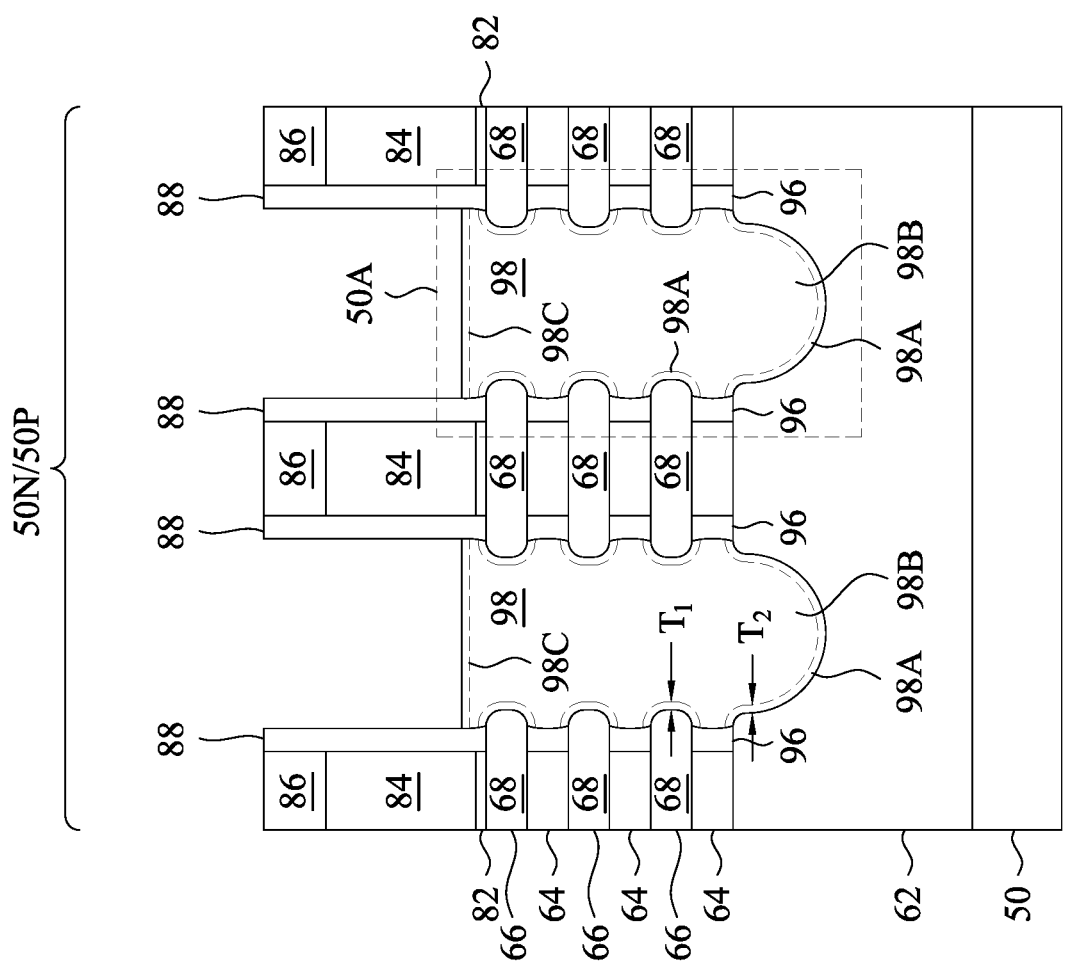
Figure 14C:
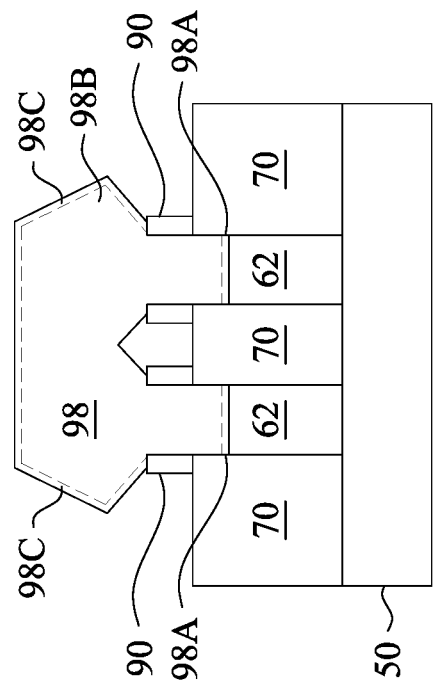
Figure 14B:
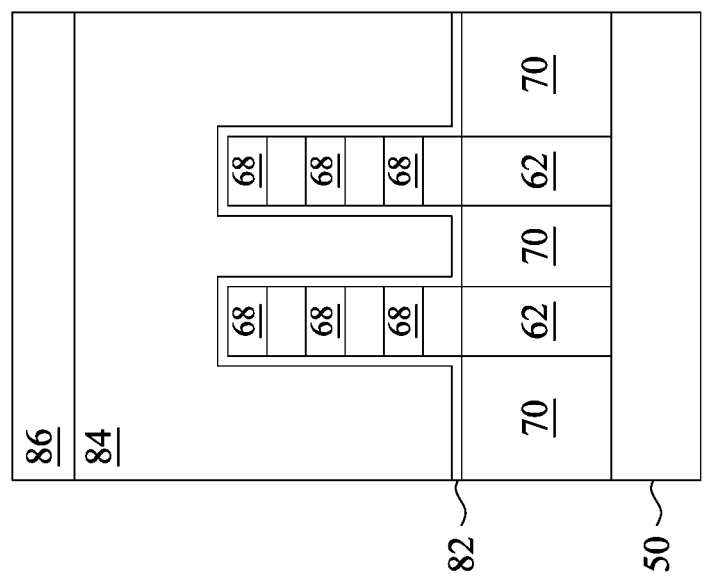

In FIGS. 14A-14C, epitaxial source/drain regions 98 are formed in the source/drain recesses 92. The epitaxial source/drain regions 98 are formed in the source/drain recesses 92 such that each dummy gate 84 (and corresponding channel region 68) is disposed between respective adjacent pairs of the epitaxial source/drain regions 98. In some embodiments, the gate spacers 88 and the inner spacers 96 are used to separate the epitaxial source/drain regions 98 from, respectively, the dummy gates 84 and the first nanostructures 64 by an appropriate lateral distance so that the epitaxial source/drain regions 98 do not short out with subsequently formed gates of the resulting nano-FETs. A material of the epitaxial source/drain regions 98 may be selected to exert stress in the respective channel regions 68, thereby improving performance.

The epitaxial source/drain regions 98 in the n-type region 50N may be formed by masking the p-type region 50P. Then, the epitaxial source/drain regions 98 in the n-type region 50N are epitaxially grown in the source/drain recesses 92 in the n-type region 50N. The epitaxial source/drain regions 98 may include any acceptable material appropriate for n-type devices. For example, if the second nanostructures 66 are silicon, the epitaxial source/drain regions 98 in the n-type region 50N may include materials exerting a tensile strain on the channel regions 68, such as silicon, silicon carbide, phosphorous-doped silicon carbide, silicon phosphide, or the like. The epitaxial source/drain regions 98 in the n-type region 50N may be referred to as "n-type source/drain regions." The epitaxial source/drain regions 98 in the n-type region 50N may have surfaces raised from respective surfaces of the fins 62 and the nanostructures 64, 66, and may have facets.

The epitaxial source/drain regions 98 in the p-type region 50P may be formed by masking the n-type region 50N. Then, the epitaxial source/drain regions 98 in the p-type region 50P are epitaxially grown in the source/drain recesses 92 in the p-type region 50P. The epitaxial source/drain regions 98 may include any acceptable material appropriate for p-type devices. For example, if the second nanostructures 66 are silicon, the epitaxial source/drain regions 98 in the p-type region 50P may include materials exerting a compressive strain on the channel regions 68, such as silicon germanium, boron-doped silicon germanium, germanium, germanium tin, or the like. The epitaxial source/drain regions 98 in the p-type region 50P may be referred to as "p-type source/drain regions." The epitaxial source/drain regions 98 in the p-type region 50P may have surfaces raised from respective surfaces of the fins 62 and the nanostructures 64, 66, and may have facets.

The epitaxial source/drain regions 98, the nanostructures 64, 66, and/or the fins 62 may be implanted with impurities to form source/drain regions, similar to the process previously described for forming LDD regions, followed by an anneal. The source/drain regions may have an impurity concentration in the range of $10^{19}$ cm$^{-3}$ to $10^{21}$ cm$^{-3}$. The n-type and/or p-type impurities for source/drain regions may be any of the impurities previously described. In some embodiments, the epitaxial source/drain regions 98 may be in situ doped during growth.

As a result of the epitaxy processes used to form the epitaxial source/drain regions 98, upper surfaces of the epitaxial source/drain regions have facets which expand laterally outward beyond sidewalls of the fins 62 and the nanostructures 64, 66. In some embodiments, these facets cause adjacent epitaxial source/drain regions 98 to merge as illustrated by FIG. 14C. In some embodiments, adjacent epitaxial source/drain regions 98 remain separated after the epitaxy process is completed (not separately illustrated). In the illustrated embodiments, the spacer etch used to form the gate spacers 88 is adjusted to also form the fin spacers 90 on sidewalls of the fins 62 and/or the nanostructures 64, 66. The fin spacers 90 are formed to cover a portion of the sidewalls of the fins 62 and/or the nanostructures 64, 66 that extend above the STI regions 70, thereby blocking the epitaxial growth. In another embodiment, the spacer etch used to form the gate spacers 88 is adjusted to not form fin spacers, so as to allow the epitaxial source/drain regions 98 to extend to the surface of the STI regions 70.

The epitaxial source/drain regions 98 include multiple semiconductor material layers. Specifically, the epitaxial source/drain regions 98 each include a liner layer 98A, a main layer 98B, and (optionally) a finishing layer 98C (or more generally, first, second, and third epitaxial layers). Other quantities of semiconductor material layers may be used for the epitaxial source/drain regions 98. The liner layers 98A are grown on the surfaces of semiconductor features (e.g., surfaces of the fins 62 and the second nanostructures 66) in the source/drain recesses 92. The main layers 98B are grown on the liner layers 98A. The finishing layers 98C (if present) are grown on the main layers 98B. Each of the liner layer 98A, the main layer 98B, and the finishing layer 98C may be formed of different semiconductor materials and may be doped (e.g., with a p-type or an n-type impurity) to different impurity concentrations. In some embodiments, the main layers 98B have a greater impurity concentration than the finishing layers 98C, and the finishing layers 98C have a greater impurity concentration than the liner layers 98A. Forming the liner layers 98A with a lesser impurity concentration than the main layers 98B may increase adhesion in the source/drain recesses 92, and forming the finishing layers 98C with a lesser impurity concentration than the main layers 98B may reduce out-diffusion of dopants from the main layers 98B in subsequent processing.

When the second nanostructures 66 are formed of silicon and the first nanostructures 64 are formed of silicon germanium, a tensile strain may be exerted on the channel regions 68 in the n-type region 50N, increasing the propensity of dopant diffusion into the channel regions 68 during growth of the epitaxial source/drain regions 98 in the n-type region 50N. For example, a tensile strain of up to 0.5% may be exerted on the channel regions 68 in the n-type region 50N after the source/drain recesses 92 are formed in the nanostructures 64, 66. According to various embodiments, the liner layers 98A in the n-type region 50N are formed of a material which helps reduce out-diffusion of dopants from the main layers 98B into the second nanostructures 66 or the fins 62. Diffusion of dopants into the channel regions 68 may thus be reduced, thereby increasing the channel mobility and thus increasing device performance.

The semiconductor material of the liner layers 98A in the n-type region 50N is a compound semiconductor which is composed of a semiconductor element and a blocker element. The blocker element helps the semiconductor material of the liner layers 98A suppress diffusion of n-type dopants (e.g., phosphorous, arsenic, etc.). In some embodiments, the semiconductor element is silicon and the blocker element is carbon. The semiconductor material(s) of the main layers 98B and/or the finishing layers 98C (if present) may not be composed of the blocker element. In some embodiments, the main layers 98B and/or the finishing layers 98C are formed of the same semiconductor material, and that semiconductor material is an elemental semiconductor which is composed of the semiconductor element but is not composed of the blocker element. In other words, the semiconductor material of the liner layers 98A may be a carbon-containing semiconductor material (e.g., silicon carbide), but the semiconductor material(s) of the main layers 98B and/or the finishing layers 98C may be carbon-free semiconductor material(s) (e.g., silicon). The concentration of the blocker element in the semiconductor material of the liner layers 98A determines how well the liner layers 98A reduce out-diffusion of dopants from the main layers 98B. In some embodiments, the semiconductor material of the liner layers 98A has a concentration of the blocker element (e.g., a carbon concentration) in the range of 0.1 atomic percent (at %) to 2 at %. Forming the semiconductor material of the liner layers 98A with a concentration of the blocker element that is less than 0.1 at % may not sufficiently reduce out-diffusion of dopants from the main layers 98B, decreasing device performance. Forming the semiconductor material of the liner layers 98A with a concentration of the blocker element that is greater than 2 at % may cause the resistance of the epitaxial source/drain regions 98 to be excessively high, decreasing device performance. The liner layers 98A have a greater concentration of the blocker element than the main layers 98B and the finishing layers 98C, e.g., the liner layers 98A have a greater carbon concentration than the main layers 98B and the finishing layers 98C.

One or more of the layers 98A, 98B, 98C in the n-type region 50N further include appropriate type impurities (e.g., n-type) to form source/drain regions, which are different from the blocker element. The n-type impurities may be any of the n-type impurities previously described. In some embodiments, the layers 98A, 98B, 98C each include the impurities. For example, when the n-type impurities are phosphorous, the finishing layers 98C may be formed of phosphorous-doped silicon, the main layers 98B may be formed of phosphorous-doped silicon, and the liner layers 98A may be formed of phosphorous-doped silicon carbide or undoped silicon carbide. Similarly, when the n-type impurities are arsenic, the finishing layers 98C may be formed of arsenic-doped silicon, the main layers 98B may be formed of arsenic-doped silicon, and the liner layers 98A may be formed of arsenic-doped silicon carbide or undoped silicon carbide. The concentration of the impurities in the liner layers 98A and the main layers 98B determines how well the liner layers 98A reduce out-diffusion of dopants from the main layers 98B. In some embodiments, the liner layers 98A have an impurity concentration in the range of $2 \times 10^{20}$ cm$^{-3}$ to $2 \times 10^{21}$ cm$^{-3}$. In some embodiments, the main layers 98B have an impurity concentration in the range of $1 \times 10^{20}$ cm$^{-3}$ to $5 \times 10^{21}$ cm$^{-3}$. In some embodiments, the main layers 98B and the finishing layers 98C include the impurities, but the liner layers 98A are free of the impurities.

The thickness of the liner layers 98A in the n-type region 50N determines how well the liner layers 98A reduce out-diffusion of dopants from the main layers 98B. The thickness $T_1$ of the portions of the liner layers 98A along the second nanostructures 66 may be smaller than the thickness $T_2$ of the portions of the liner layers 98A along the fins 62. In some embodiments, the portions of the liner layers 98A along the second nanostructures 66 have a thickness $T_1$ in the range of 1 nm to 6 nm, and the portions of the liner layers 98A along the fins 62 have a thickness $T_2$ in the range of 1 nm to 30 nm. Forming the liner layers 98A with a thickness $T_1$ that is less than 1 nm or with a thickness $T_2$ that is less than 1 nm may not sufficiently reduce out-diffusion of dopants from the main layers 98B, decreasing device performance. Forming the liner layers 98A with a thickness $T_1$ that is greater than 6 nm or with a thickness $T_2$ that is greater than 30 nm may cause the resistance of the epitaxial source/drain regions 98 to be excessively high, decreasing device performance.

Figure 15:
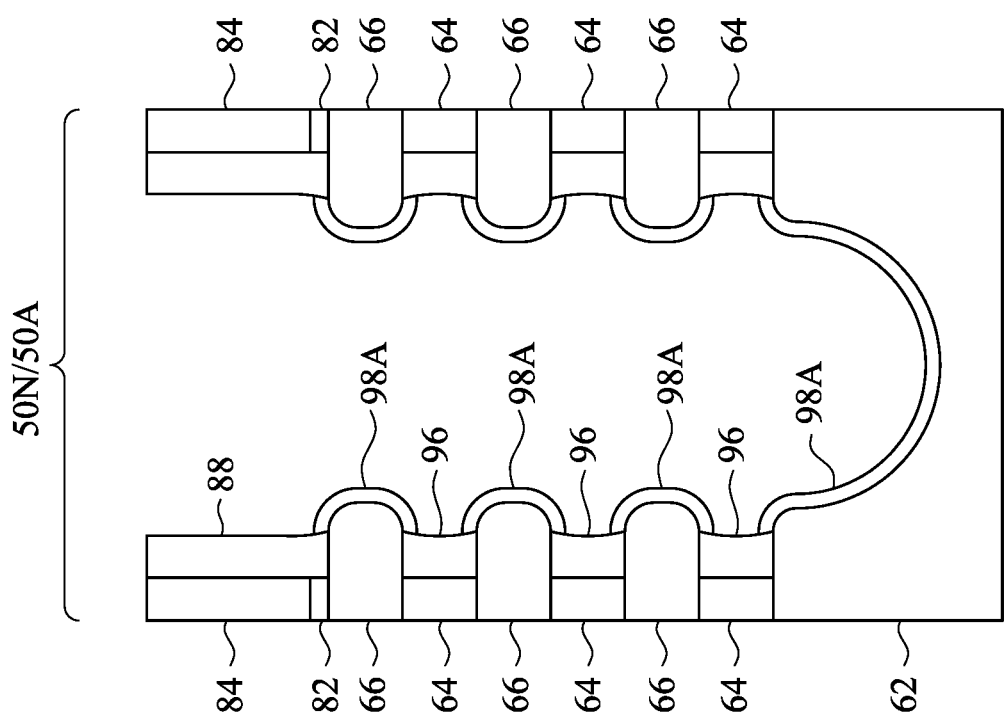
Figure 17:
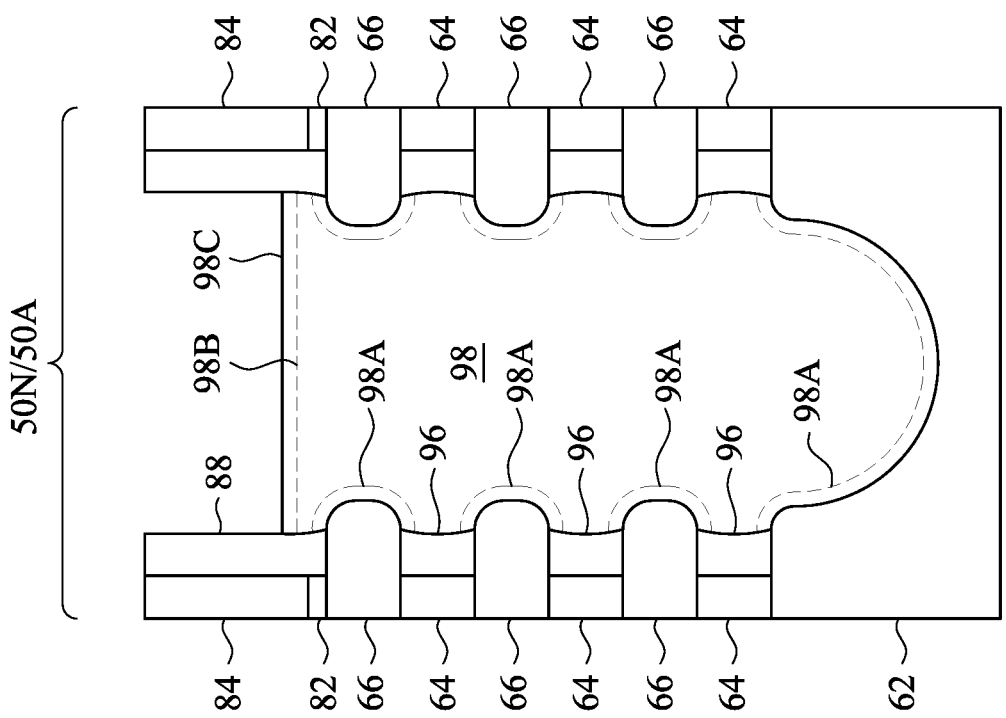
Figure 16:
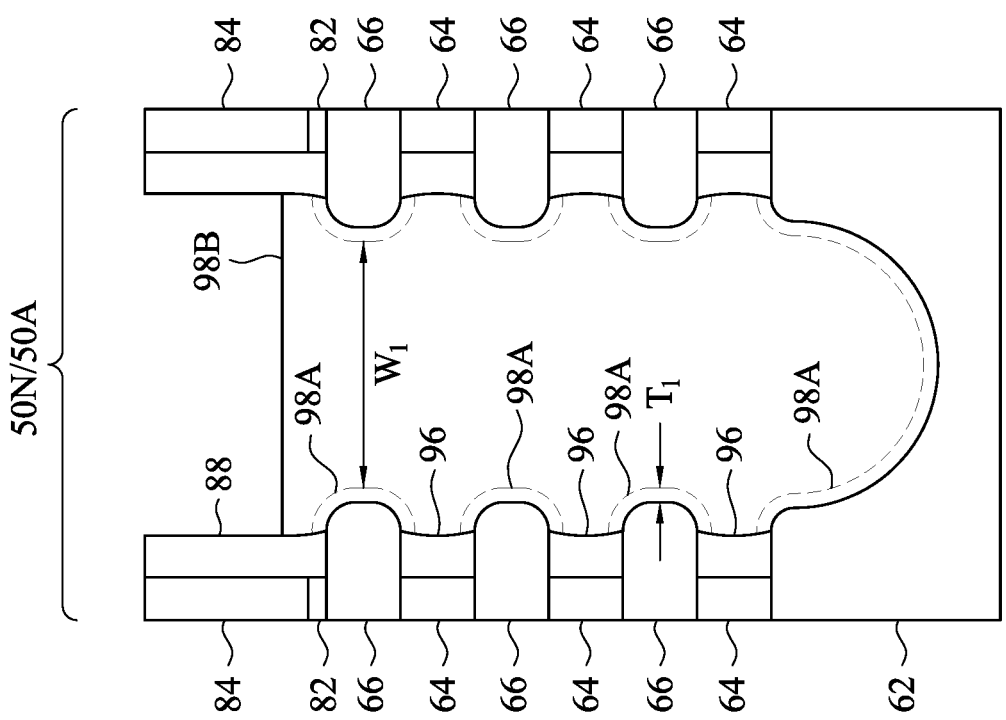
Figure 18A:
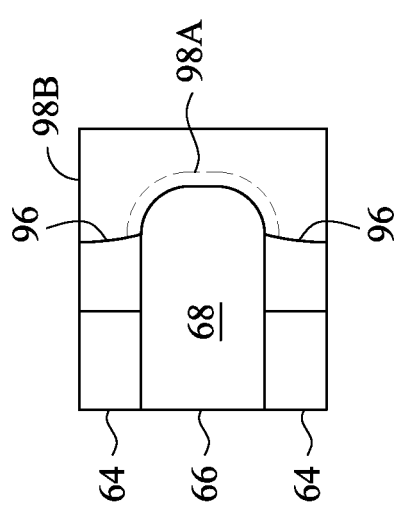
Figure 18B:
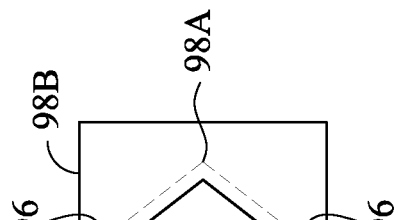
Figure 18C:
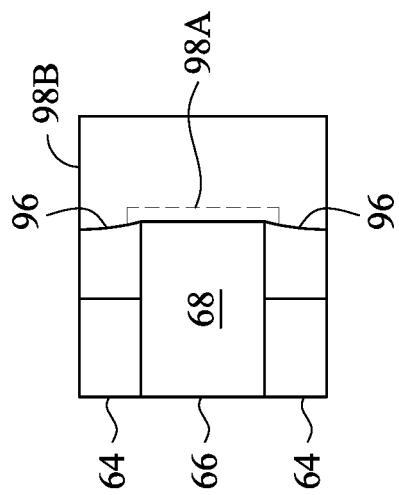
Figure 18D:
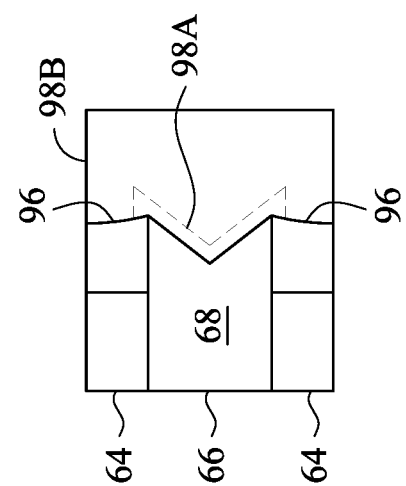
Figure 18E:
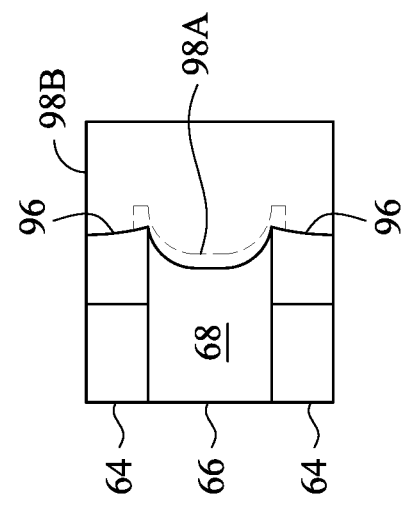

FIGS. 15-17 illustrate a process for forming the epitaxial source/drain regions 98 in the n-type region 50N. FIGS. 15-17 illustrate features in a region 50A in FIG. 14A. As previously described, the semiconductor material of the liner layers 98A in the n-type region 50N is composed of a semiconductor element and a blocker element, which helps reduce out-diffusion of dopants from the main layers 98B in subsequent processing.

In FIG. 15, the liner layers 98A in the n-type region 50N are epitaxially grown on the surfaces of semiconductor features (e.g., surfaces of the fins 62 and the second nanostructures 66) in the source/drain recesses 92. The liner layers 98A may be grown from the second nanostructures 66 and the fins 62 by exposing the second nanostructures 66 and the fins 62 to a semiconductor-containing precursor, a blocker-containing precursor, and (optionally) a dopant-containing precursor. When the semiconductor element is silicon, the semiconductor-containing precursor may be a silicon-containing precursor such as a silane, such as monosilane ($SiH_4$), disilane ($Si_2H_6$), trisilane ($Si_3H_8$), trichlorosilane ($HCl_3Si$), dichlorosilane ($H_2SiCl_2$), or the like. When the blocker element is carbon, the blocker-containing precursor may be a carbon-containing precursor such as trimethylsilane ($(CH_3)_3SiH$) or the like. When the dopant is arsenic, the dopant-containing precursor may be an arsenic-containing precursor such as arsine ($AsH_3$) or the like. When the dopant is phosphorous, the dopant-containing precursor may be a phosphorous-containing precursor such as diphosphine ($P_2H_6$), phosphorus trichloride ($PCl_3$), or the like. In some embodiments, the second nanostructures 66 and the fins 62 are exposed to the semiconductor-containing precursor, the blocker-containing precursor, and the dopant-containing precursor (if present) at a temperature in the range of 500° C. to 800° C., at a pressure in the range of 1 Torr to 760 Torr, and for a duration in the range of 5 seconds to 20 minutes. Growing the liner layers 98A at a temperature and at a pressure in these ranges allows the liner layers 98A to have a desired thickness and blocker element concentration (previously described). Growing the liner layers 98A at a temperature or at a pressure outside of these ranges may not allow the liner layers 98A to have the desired thickness or blocker element concentration.

In this embodiment, the portions of the liner layers 98A in each source/drain recess 92 are grown so that they remain separated and do not merge after growth. Specifically growth of the liner layers 98A is stopped before the liner layers 98A merge in the source/drain recess 92. Portions of the sidewalls of the inner spacers 96 are thus not covered by the liner layers 98A, and remain expose after growth of the liner layers 98A is completed. In another embodiment (subsequently described for FIGS. 26-32C), the liner layers 98A are grown until they merge in each source/drain recess 92, so that the sidewalls of the inner spacers 96 are covered by the liner layers 98A.

In FIG. 16, the main layers 98B in the n-type region 50N are epitaxially grown on the liner layers 98A. The main layers 98B may be grown from the liner layers 98A by exposing the liner layers 98A to a semiconductor-containing precursor and a dopant-containing precursor. When the semiconductor element is silicon, the semiconductor-containing precursor may be a silicon-containing precursor such as a silane, such as monosilane ($SiH_4$), disilane ($Si_2H_6$), trisilane ($Si_3H_8$), trichlorosilane ($HCl_3Si$), dichlorosilane ($H_2SiCl_2$), or the like. When the dopant is arsenic, the dopant-containing precursor may be an arsenic-containing precursor such as arsine ($AsH_3$) or the like. When the dopant is phosphorous, the dopant-containing precursor may be a phosphorous-containing precursor such as diphosphine ($P_2H_6$), phosphorus trichloride ($PCl_3$), or the like. The semiconductor-containing precursor and/or the dopant-containing precursor used to grow the main layers 98B may be the same as those used to grow the liner layers 98A, or may include different precursors. In some embodiments, the liner layers 98A are exposed to the semiconductor-containing precursor and the dopant-containing precursor at a temperature in the range of 400° C. to 800° C. and at a pressure in the range of 1 Torr to 760 Torr.

The main layers 98B in the n-type region 50N are grown from the liner layers 98A until the portions of the main layers 98B in each source/drain recess 92 merge. In this embodiment, the main layers 98B cover the portions of the sidewalls of the inner spacers 96 that are not covered by the liner layers 98A. In another embodiment (subsequently described for FIGS. 26-32C) where the liner layers 98A cover all of the sidewalls of the inner spacers 96, the main layers 98B are separated from the inner spacers 96 by the liner layers 98A.

The width of the source/drain recesses 92 and the thickness $T_1$ (previously described) of the liner layers 98A is controlled so that the liner layers 98A at opposing sides of the epitaxial source/drain regions 98 are separated by a desired distance. As a result, the width $W_1$ of the main layers 98B between opposing liner layers 98A may be controlled. In some embodiments, the width $W_1$ of the main layers 98B between opposing liner layers 98A is in the range of 3 nm to 50 nm.

In FIG. 17, the finishing layers 98C in the n-type region 50N are epitaxially grown on the main layers 98B. The finishing layers 98C may be grown from the main layers 98B by exposing the main layers 98B to a semiconductor-containing precursor and a dopant-containing precursor. When the semiconductor element is silicon, the semiconductor-containing precursor may be a silicon-containing precursor such as a silane, such as monosilane ($SiH_4$), disilane ($Si_2H_6$), trisilane ($Si_3H_8$), trichlorosilane ($HCl_3Si$), dichlorosilane ($H_2SiCl_2$), or the like. When the dopant is arsenic, the dopant-containing precursor may be an arsenic-containing precursor such as arsine ($AsH_3$) or the like. When the dopant is phosphorous, the dopant-containing precursor may be a phosphorous-containing precursor such as diphosphine ($P_2H_6$), phosphorus trichloride ($PCl_3$), or the like. The semiconductor-containing precursor and/or the dopant-containing precursor used to grow the finishing layers 98C may be the same as those used to grow the main layers 98B and/or the liner layers 98A, or may include different precursors. In some embodiments, the main layers 98B are exposed to the semiconductor-containing precursor and the dopant-containing precursor at a temperature in the range of 500° C. to 800° C. and at a pressure in the range of 1 Torr to 760 Torr.

Some embodiments contemplate other layers of the epitaxial source/drain regions 98 comprising a semiconductor material that is composed of the blocker element. For example, the semiconductor material of the main layers 98B may also be a compound semiconductor which is composed of the semiconductor element and the blocker element. In some embodiments, the semiconductor material of the main layers 98B has a concentration of the blocker element (e.g., a carbon concentration) in the range of 0 at % to 2 at %. In such embodiments, a carbon-containing precursor such as that previously described may also be used to grow the main layers 98B. In other words, the semiconductor material of the main layers 98B may have a zero or non-zero carbon concentration. The liner layers 98A have a greater concentration of the blocker element than the main layers 98B.

After the epitaxial source/drain regions 98 are formed, the liner layers 98A can have a variety of profile types. The liner layers 98A may be grown conformally so that the liner layers 98A have conformal profiles, as shown by FIGS. 18A-18E, which correspond to FIGS. 12A-12E, respectively. The liner layers 98A may be grown along the <111> direction so that the liner layers 98A have <111> faceted profiles, as shown by FIGS. 19A-19E, which correspond to FIGS. 12A-12E, respectively. The facet types of the liner layers 98A may be controlled by controlling the flow rates of the various precursors used to grow the liner layers 98A.

Figure 20A:
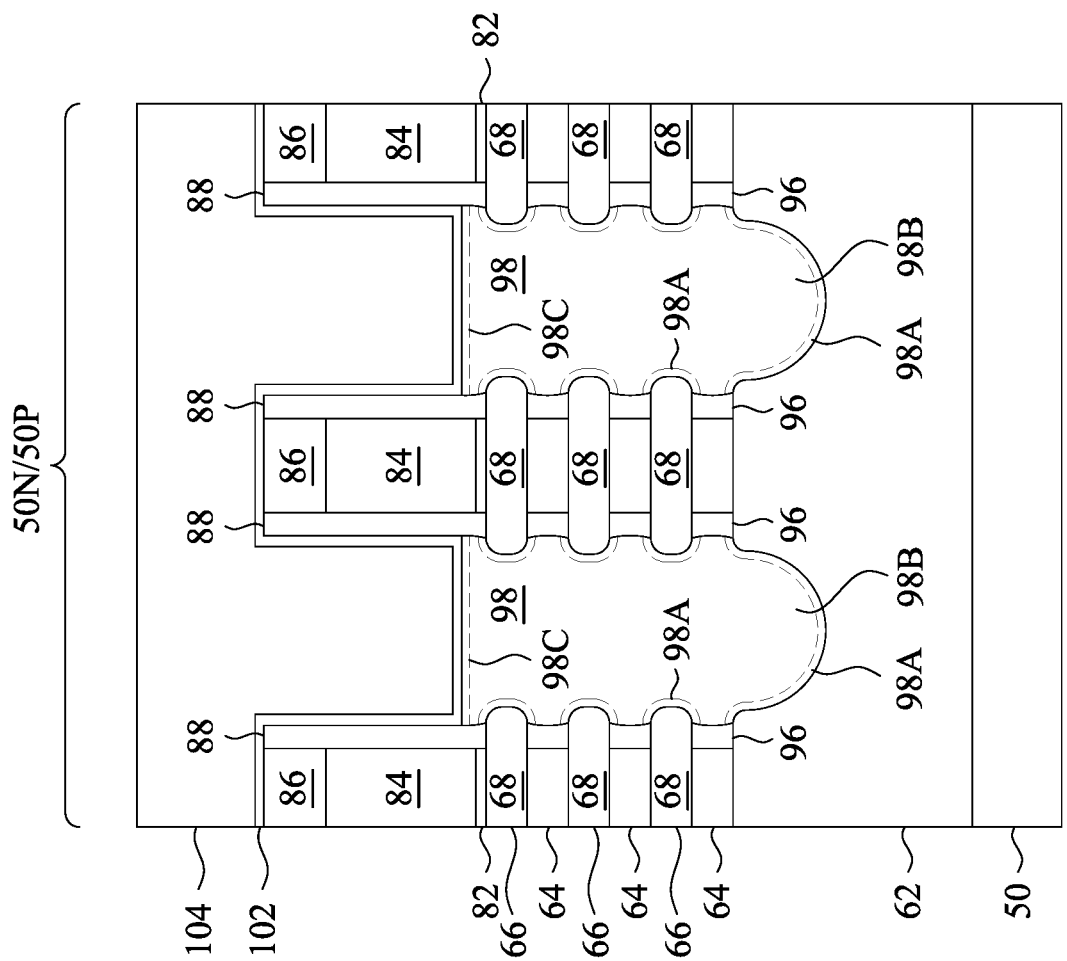
Figure 20C:
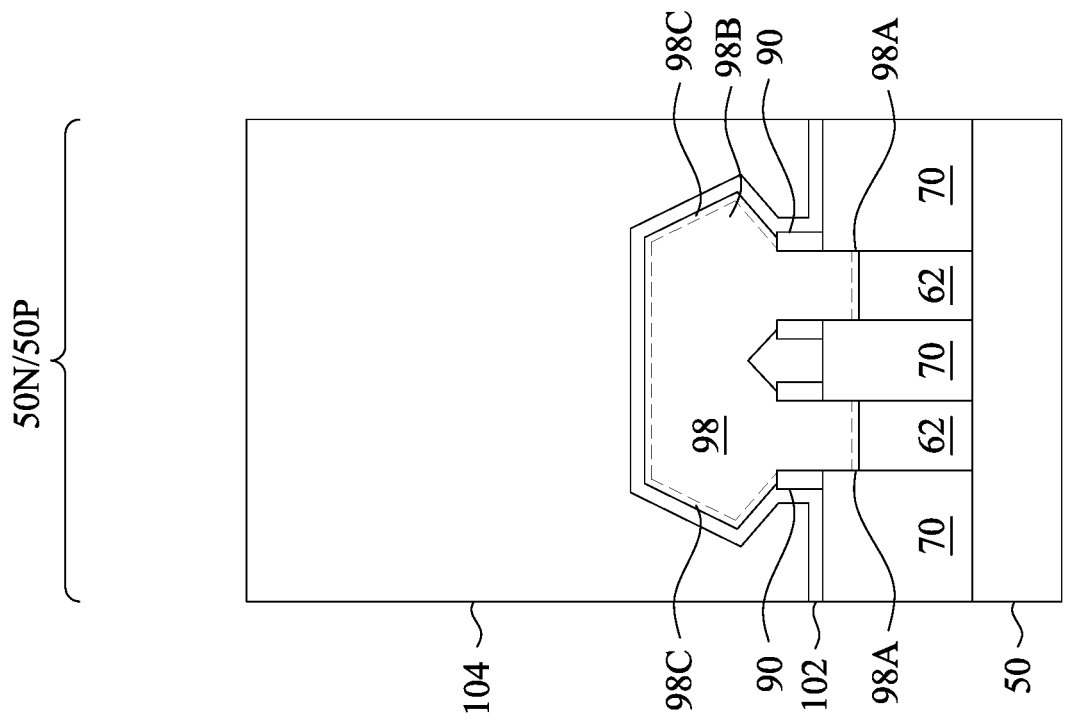
Figure 20B:
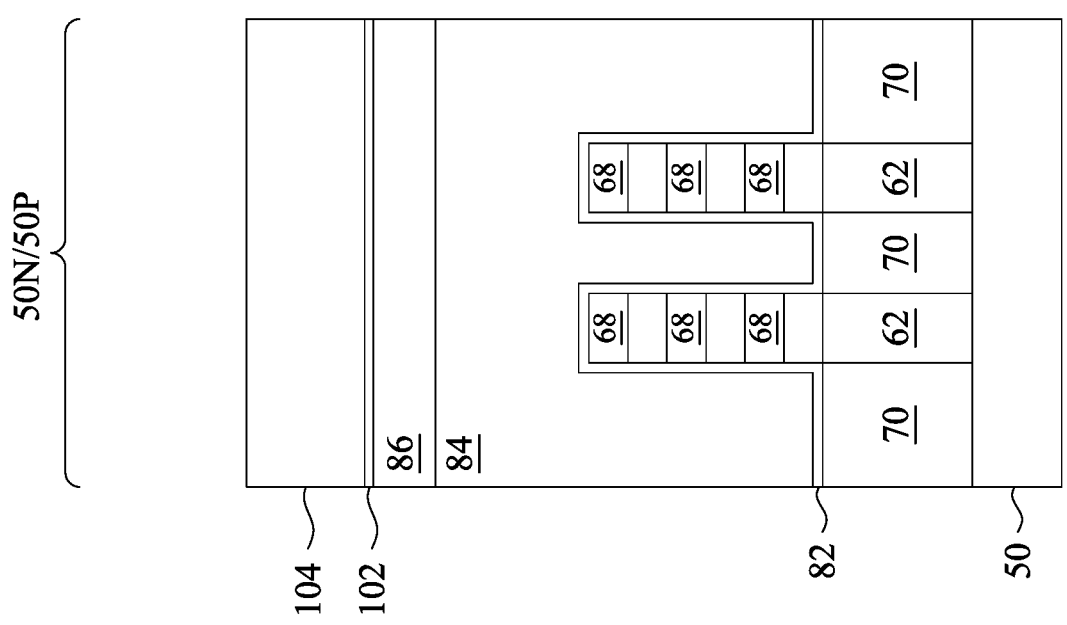

In FIGS. 20A-20C, a first ILD 104 is deposited over the epitaxial source/drain regions 98, the gate spacers 88, and the masks 86 (if present) or the dummy gates 84. The first ILD 104 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 102 is formed between the first ILD 104 and the epitaxial source/drain regions 98, the gate spacers 88, and the masks 86 (if present) or the dummy gates 84. The CESL 102 may be formed of a dielectric material, such as silicon nitride, silicon oxide, silicon oxynitride, or the like, having a high etching selectivity from the etching of the first ILD 104. The CESL 102 may be formed by an any suitable method, such as CVD, ALD, or the like.

Figure 21A:
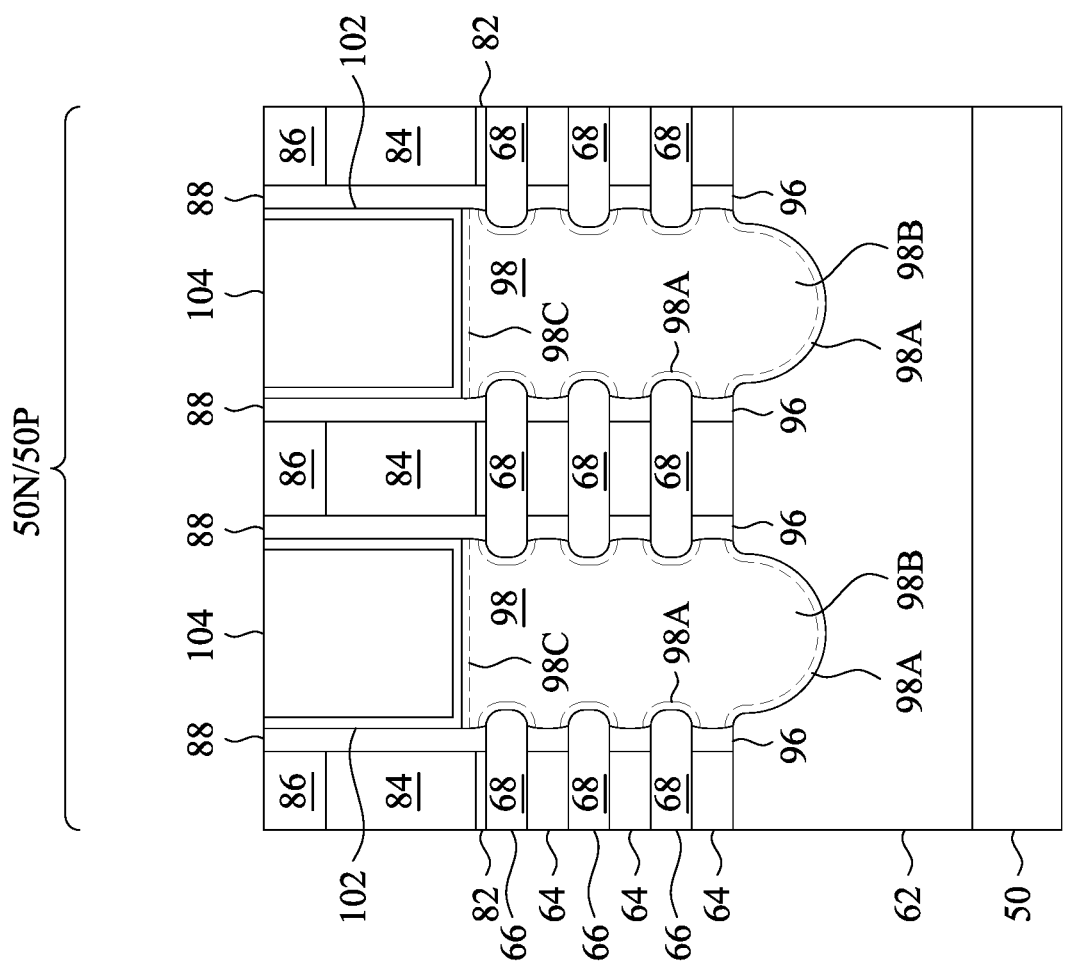
Figure 21C:
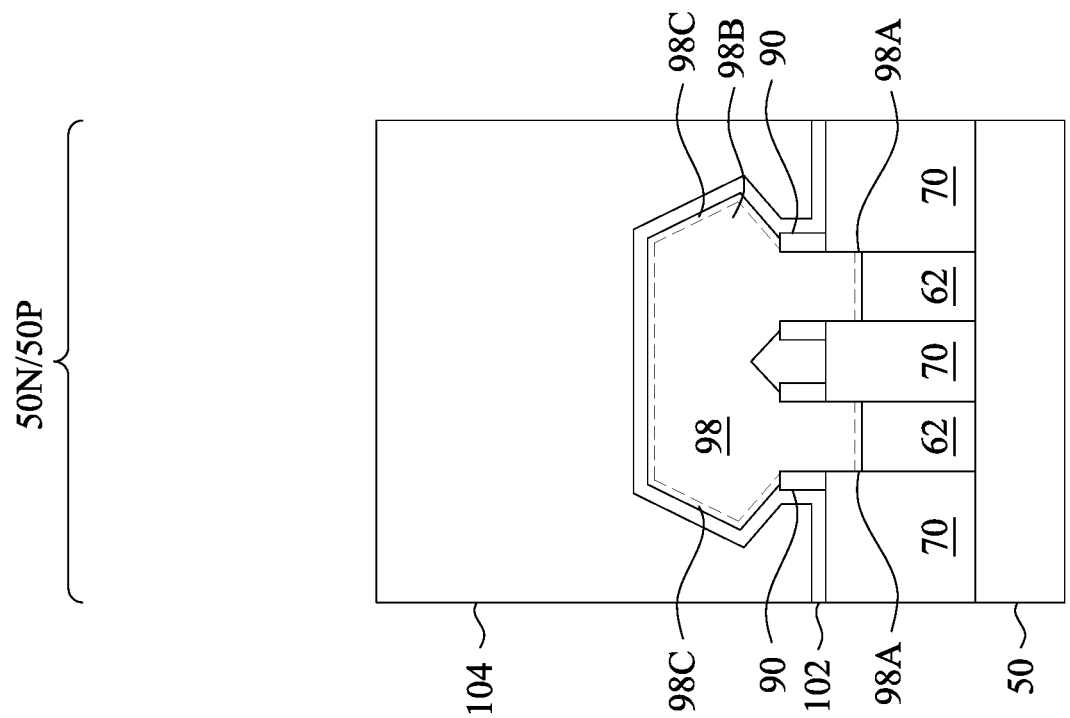
Figure 21B:
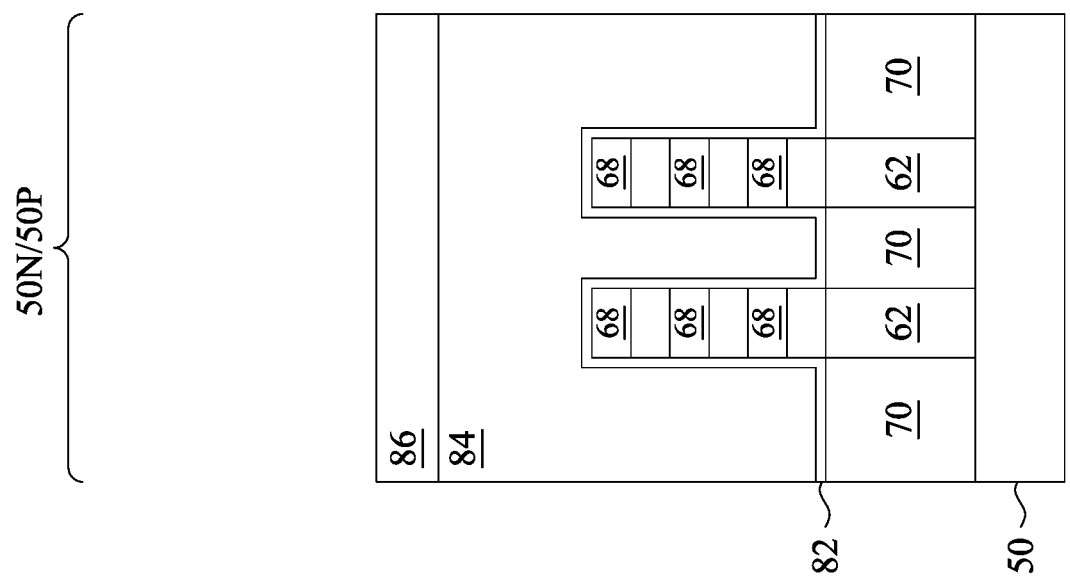

In FIGS. 21A-21C, a removal process is performed to level the top surfaces of the first ILD 104 with the top surfaces of the gate spacers 88 and the masks 86 (if present) or the dummy gates 84. In some embodiments, a planarization process such as a chemical mechanical polish (CMP), an etch-back process, combinations thereof, or the like may be utilized. The planarization process may also remove the masks 86 on the dummy gates 84, and portions of the gate spacers 88 along sidewalls of the masks 86. After the planarization process, the top surfaces of the gate spacers 88, the first ILD 104, the CESL 102, and the masks 86 (if present) or the dummy gates 84 are coplanar (within process variations). Accordingly, the top surfaces of the masks 86 (if present) or the dummy gates 84 are exposed through the first ILD 104. In the illustrated embodiment, the masks 86 remain, and the planarization process levels the top surfaces of the first ILD 104 with the top surfaces of the masks 86.

Figure 22A:
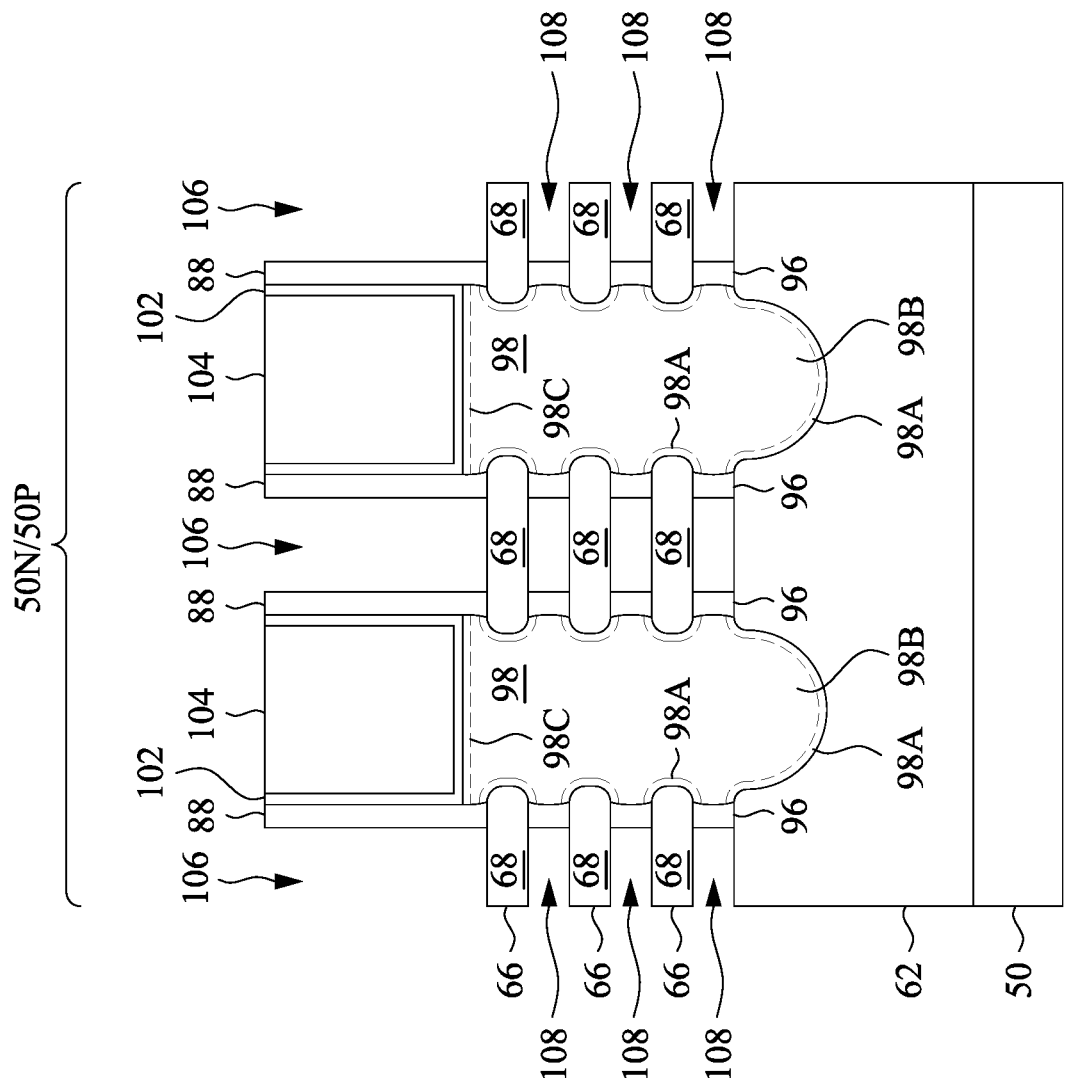
Figures 22B, 22C:
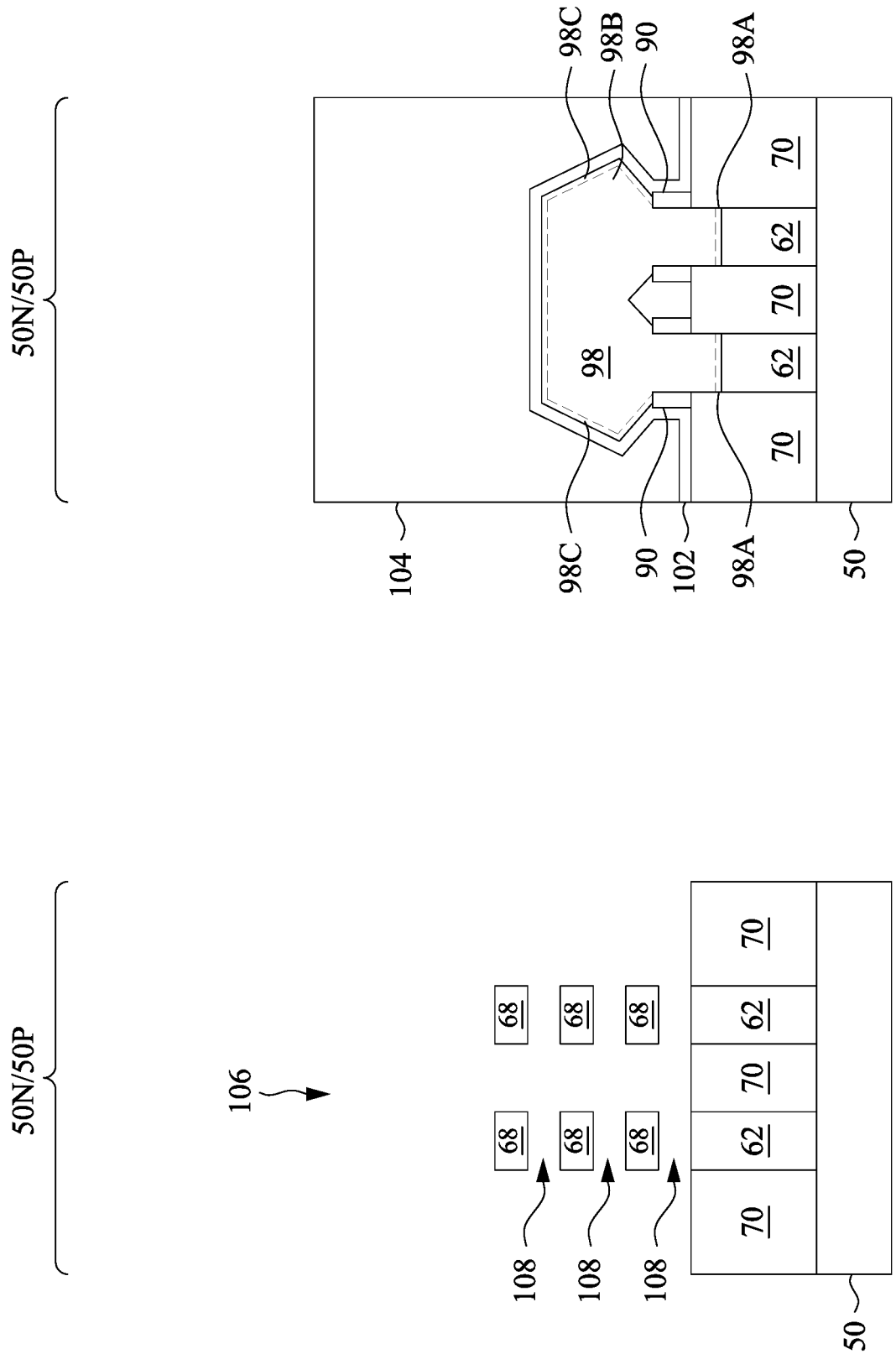

In FIGS. 22A-22C, the masks 86 (if present) and the dummy gates 84 are removed in an etching process, so that recesses 106 are formed. Portions of the dummy dielectrics 82 in the recesses 106 are also removed. In some embodiments, the dummy gates 84 are removed by an anisotropic dry etch process. For example, the etching process may include a dry etch process using reaction gas(es) that selectively etch the dummy gates 84 at a faster rate than the first ILD 104 or the gate spacers 88. During the removal, the dummy dielectrics 82 may be used as etch stop layers when the dummy gates 84 are etched. The dummy dielectrics 82 are then removed. Each recess 106 exposes and/or overlies portions of the channel regions 68. Portions of the second nanostructures 66 which act as the channel regions 68 are disposed between and adjoin adjacent pairs of the epitaxial source/drain regions 98.

The remaining portions of the first nanostructures 64 are then removed to expand the recesses 106, such that openings 108 are formed between the second nanostructures 66. The remaining portions of the first nanostructures 64 can be removed by any acceptable etching process that selectively etches the material of the first nanostructures 64 at a faster rate than the material of the second nanostructures 66. The etching may be isotropic. For example, when the first nanostructures 64 are formed of silicon germanium and the second nanostructures 66 are formed of silicon, the etching process may be a wet etch using tetramethylammonium hydroxide (TMAH), ammonium hydroxide (NH$_4$OH), or the like. In some embodiments, a trim process (not separately illustrated) is performed to decrease the thicknesses of the exposed portions of the second nanostructures 66.

Figure 23A:
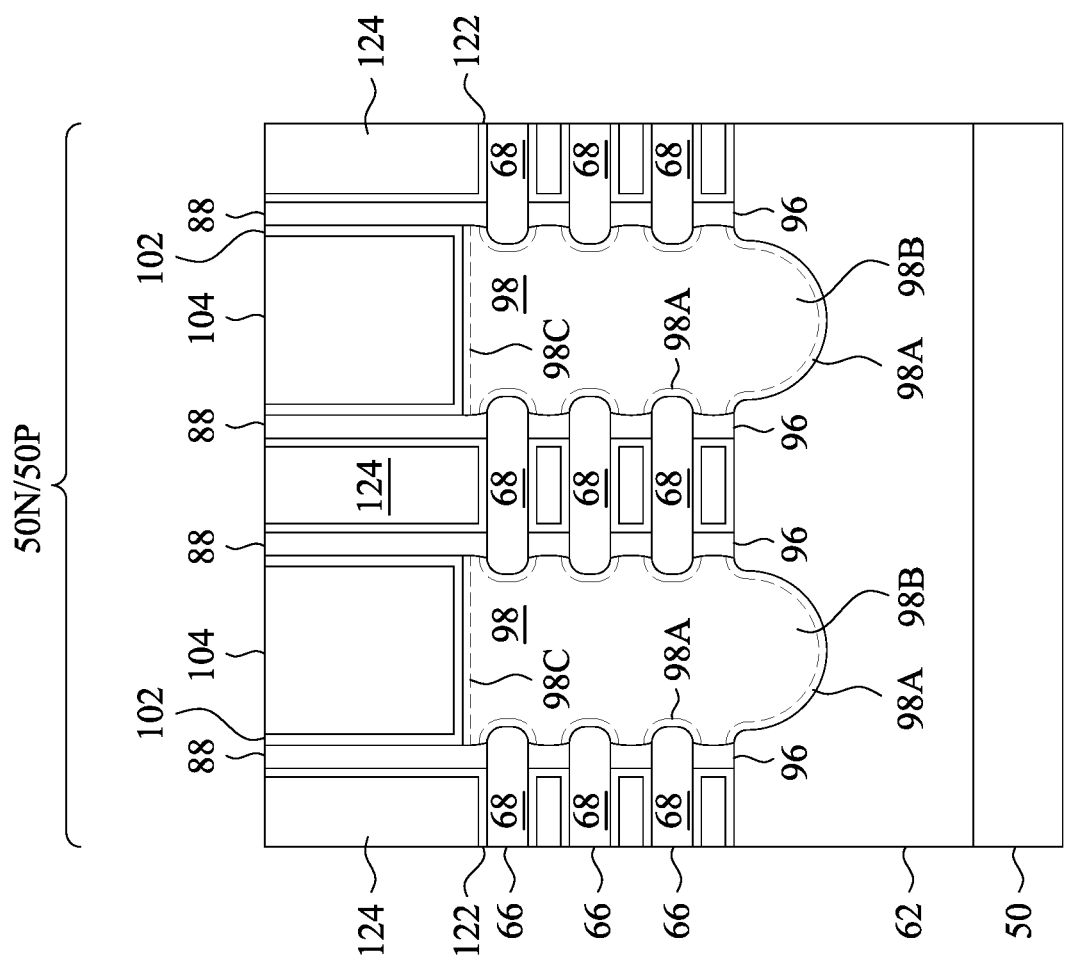
Figure 23C:
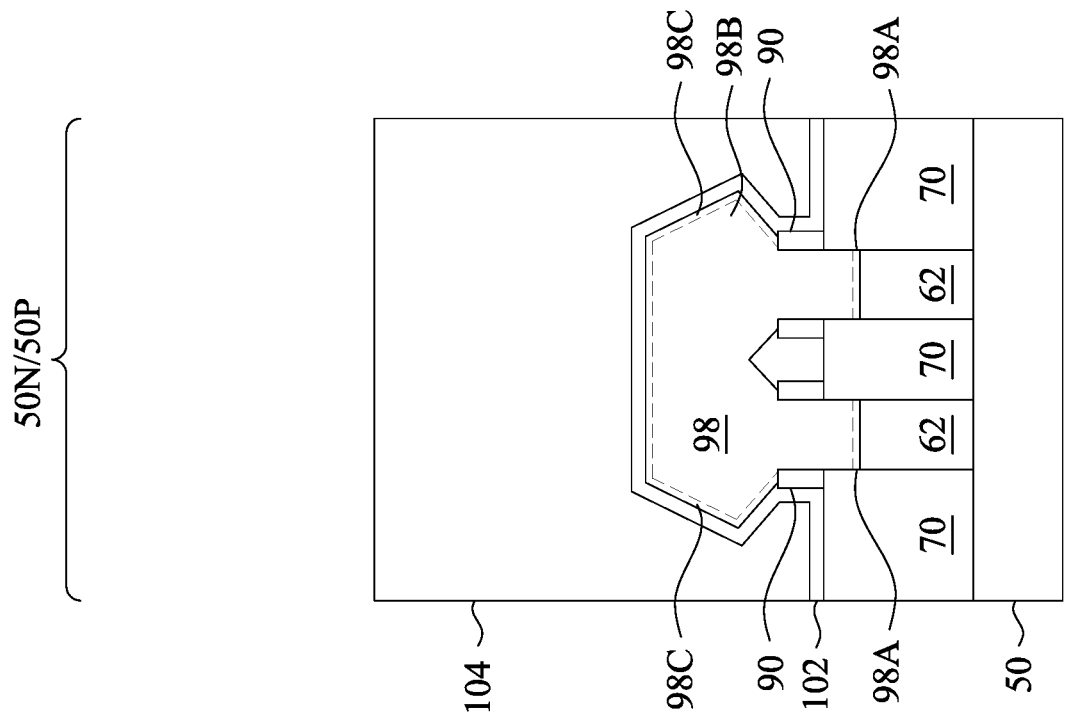
Figure 23B:
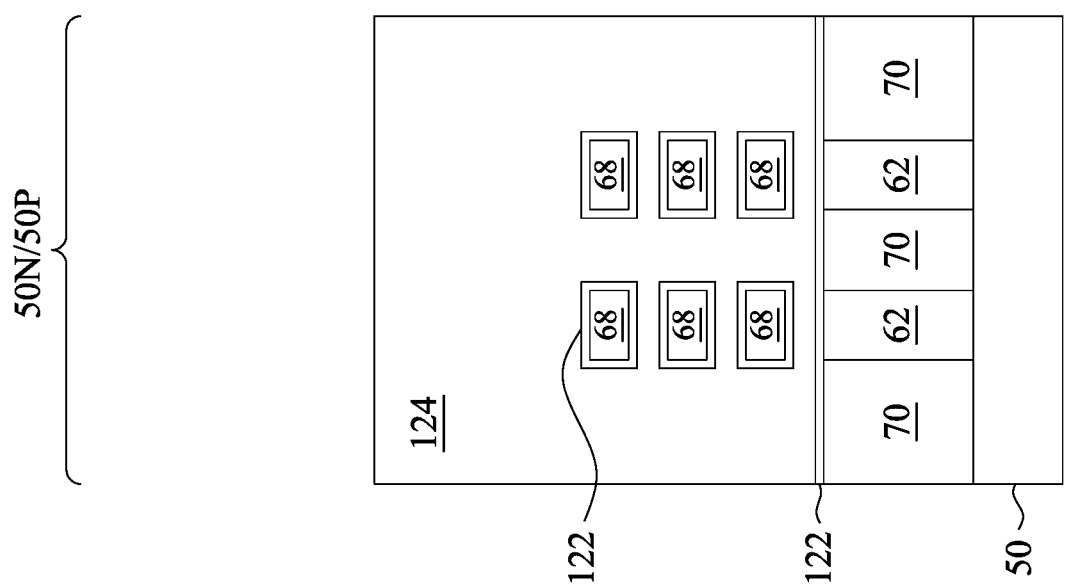

In FIGS. 23A-23C, gate dielectrics 122 and gate electrodes 124 are formed for replacement gates. Each respective pair of a gate dielectric 122 and a gate electrode 124 may be collectively referred to as a "gate structure." Each gate structure extends along sidewalls and a top surface of a channel region 68 of a second nanostructure 66. Some of the gate structures also extend along sidewalls and/or a top surface of a fin 62. The gate dielectrics 122 include one or more gate dielectric layer(s) disposed around the second nanostructure 66 and on the sidewalls of the gate spacers 88 and the inner spacers 96. The gate dielectrics 122 may be formed of an oxide such as silicon oxide or a metal oxide, a silicate such as a metal silicate, combinations thereof, multi-layers thereof, or the like. Additionally or alternatively, the gate dielectrics 122 may be formed of a high-k dielectric material (e.g., dielectric materials having a k-value greater than about 7.0), such as a metal oxide or a silicate of hafnium, aluminum, zirconium, lanthanum, manganese, barium, titanium, lead, and combinations thereof. The dielectric material(s) of the gate dielectrics 122 may be formed by molecular-beam deposition (MBD), ALD, PECVD, or the like. Although a single-layered gate dielectrics 122 are illustrated, the gate dielectrics 122 may include any number of interfacial layers and any number of main layers. For example, the gate dielectrics 122 may include an interfacial layer and an overlying high-k dielectric layer.

The gate electrodes 124 include one or more gate electrode layer(s) disposed over the gate dielectrics 122. The gate electrodes 124 may be formed of a metal-containing material such as titanium nitride, titanium oxide, tantalum nitride, tantalum carbide, tungsten, cobalt, ruthenium, aluminum, combinations thereof, multi-layers thereof, or the like. Although single-layered gate electrodes 124 are illustrated, the gate electrodes 124 may include any number of work function tuning layers, any number of barrier layers, any number of glue layers, and a fill material.

As an example to form the gate structures, one or more gate dielectric layer(s) may be deposited in the recesses 106 and the openings 108. The gate dielectric layer(s) may also be deposited on the top surfaces of the first ILD 104, the CESL 102, and the gate spacers 88. Subsequently, one or more gate electrode layer(s) may be deposited on the gate dielectric layer(s), and in the remaining portions of the recesses 106 and the openings 108. A removal process may then be performed to remove the excess portions of the gate dielectric layer(s) and the gate electrode layer(s), which excess portions are over the top surfaces of the first ILD 104, the CESL 102, and the gate spacers 88. The gate dielectric layer(s), after the removal process, have portions left in the recesses 106 and the openings 108 (thus forming the gate dielectrics 122). The gate electrode layer(s), after the removal process, have portions left in the recesses 106 and the openings 108 (thus forming the gate electrodes 124). In some embodiments, a planarization process such as a chemical mechanical polish (CMP), an etch-back process, combinations thereof, or the like may be utilized. After the planarization process, the top surfaces of the gate spacers 88, the CESL 102, the first ILD 104, the gate dielectrics 122, and the gate electrodes 124 are coplanar (within process variations).

The formation of the gate dielectrics 122 in the n-type region 50N and the p-type region 50P may occur simultaneously such that the gate dielectrics 122 in each region are formed of the same material(s), and the formation of the gate electrodes 124 may occur simultaneously such that the gate electrodes 124 in each region are formed of the same material(s). In some embodiments, the gate dielectrics 122 in each region may be formed by distinct processes, such that the gate dielectrics 122 may include different materials and/or have a different number of layers, and/or the gate electrodes 124 in each region may be formed by distinct processes, such that the gate electrodes 124 may include different materials and/or have a different number of layers. Various masking steps may be used to mask and expose appropriate regions when using distinct processes.

Figure 24A:
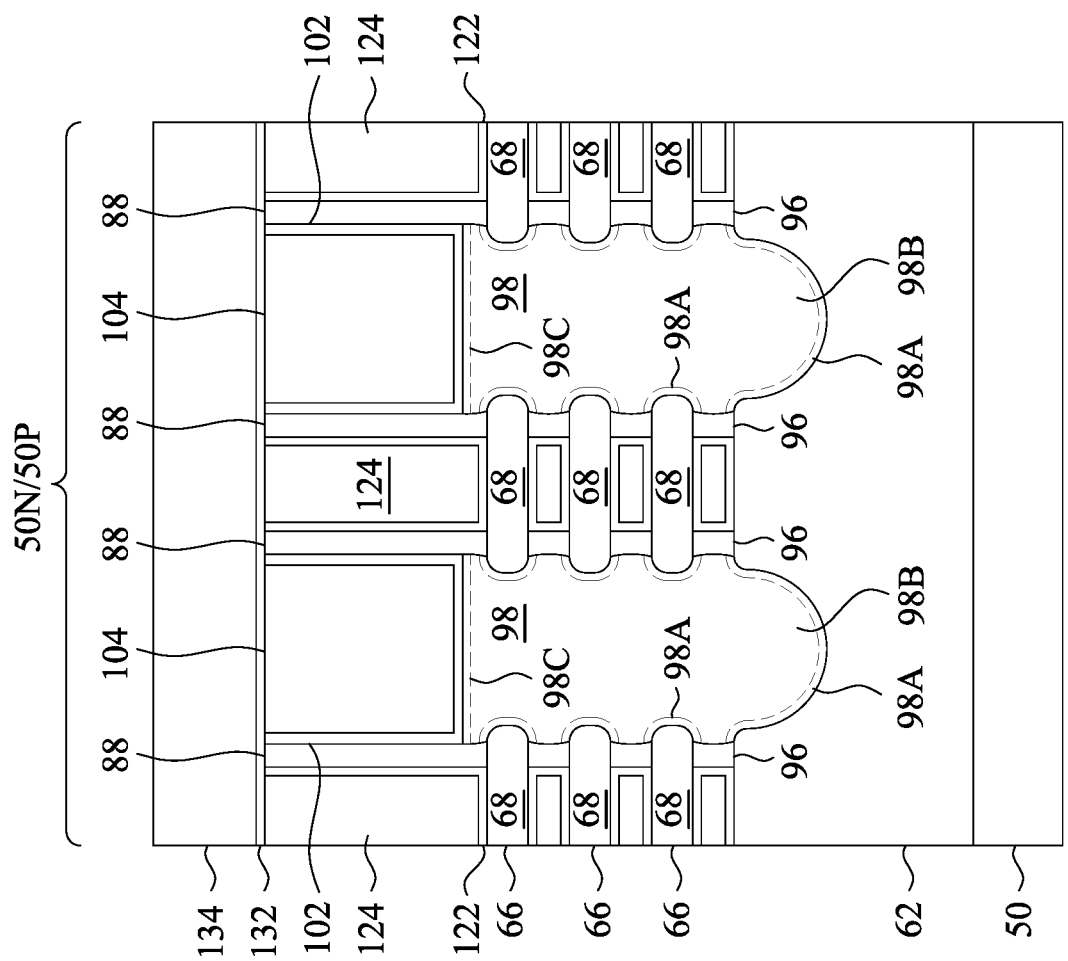
Figure 24C:
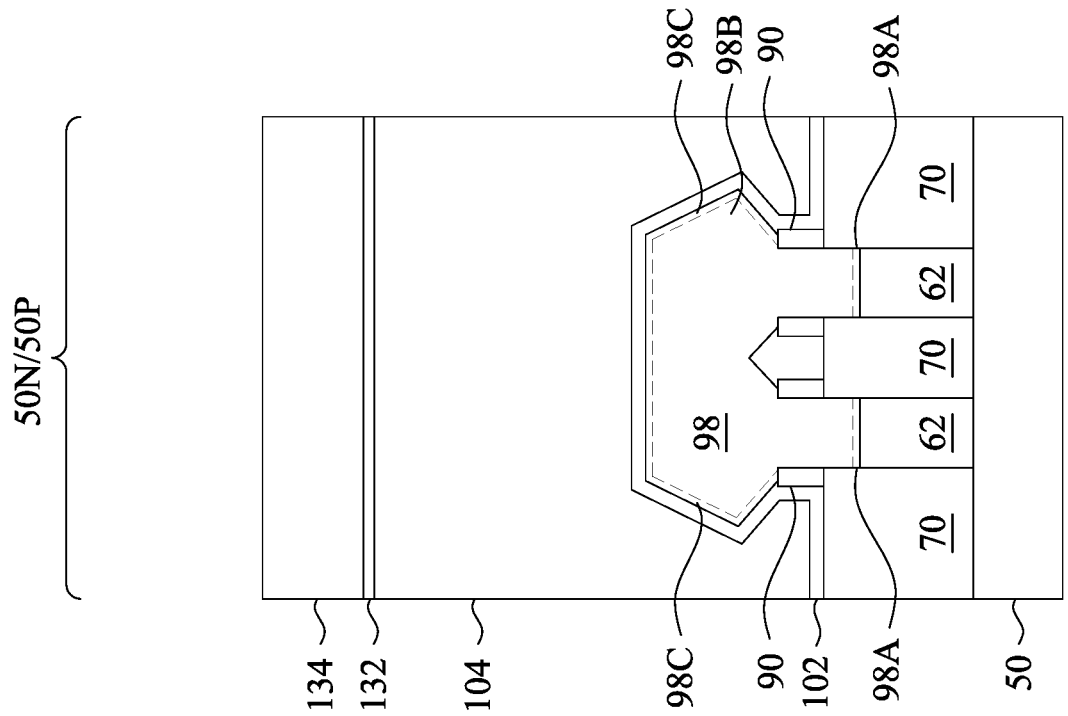
Figure 24B:
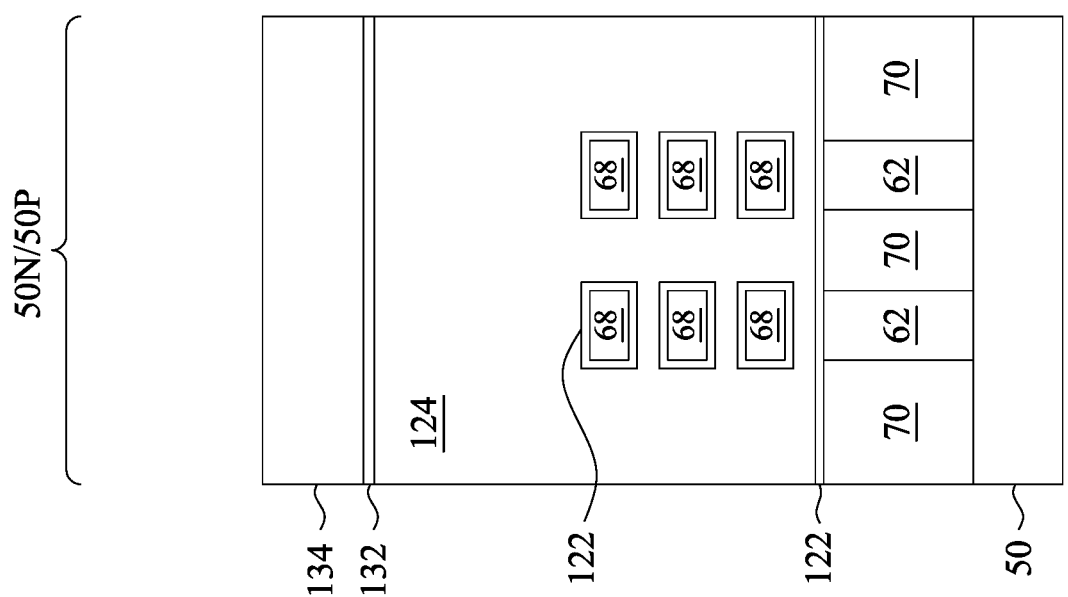

In FIGS. 24A-24C, a second ILD 134 is formed over the gate spacers 88, the CESL 102, the first ILD 104, the gate dielectrics 122, and the gate electrodes 124. In some embodiments, the second ILD 134 is a flowable film formed by a flowable CVD method. In some embodiments, the second ILD 134 is formed of a dielectric material such as PSG, BSG, BPSG, USG, or the like, which may be deposited by any suitable method, such as CVD, PECVD, or the like.

In some embodiments, an etch stop layer (ESL) 132 is formed between the second ILD 134 and the gate spacers 88, the CESL 102, the first ILD 104, the gate dielectrics 122, and the gate electrodes 124. The ESL 132 may include a dielectric material, such as, silicon nitride, silicon oxide, silicon oxynitride, or the like, having a high etching selectivity from the etching of the second ILD 134.

Figure 25A:
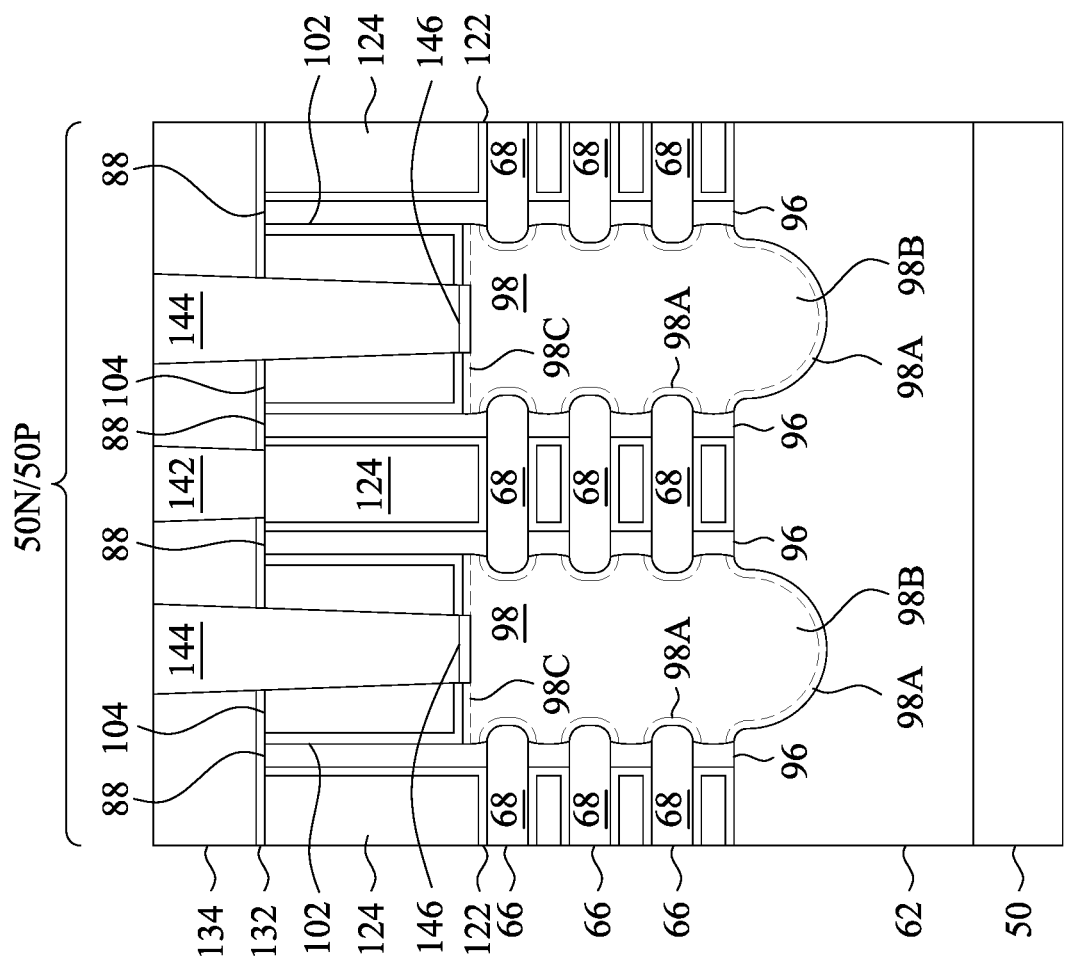
Figure 25C:
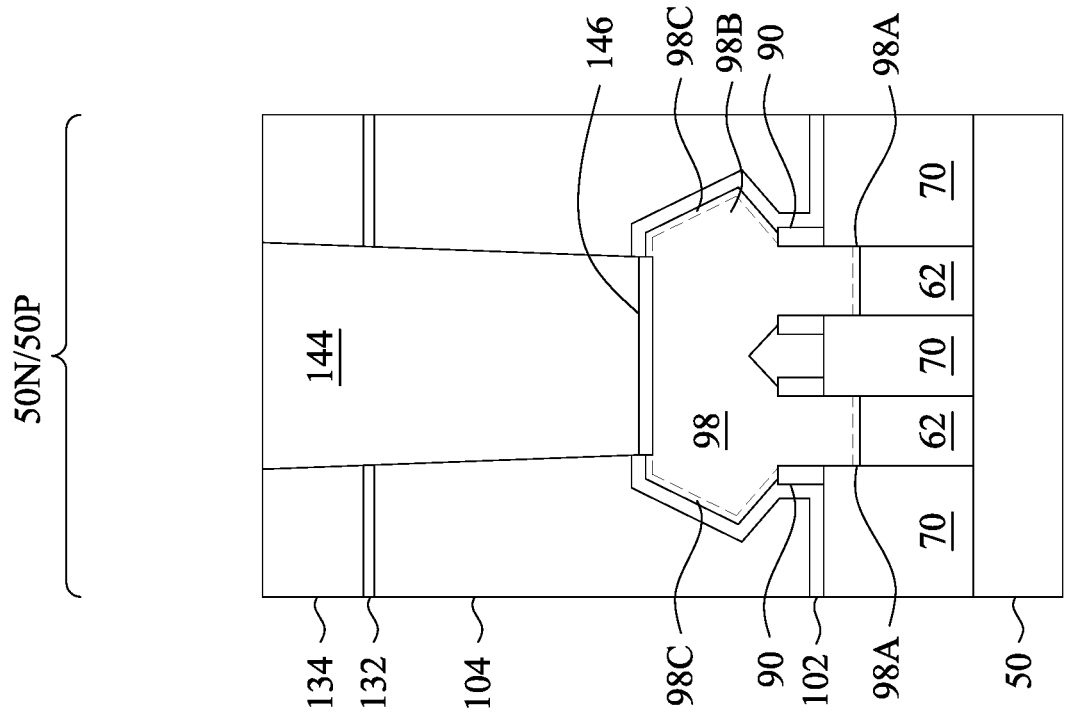
Figure 25B:
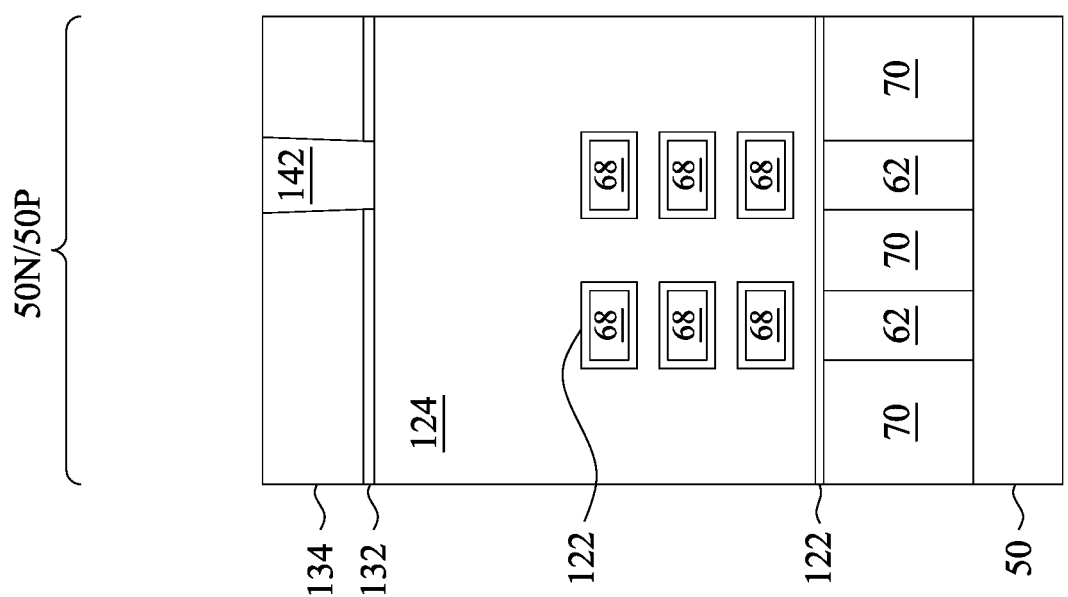

In FIGS. 25A-25C, gate contacts 142 and source/drain contacts 144 are formed to contact, respectively, the gate electrodes 124 and the epitaxial source/drain regions 98. The gate contacts 142 are physically and electrically coupled to the gate electrodes 124. The source/drain contacts 144 are physically and electrically coupled to the epitaxial source/drain regions 98.

As an example to form the gate contacts 142 and the source/drain contacts 144, openings for the gate contacts 142 are formed through the second ILD 134 and the ESL 132, and openings for the source/drain contacts 144 are formed through the second ILD 134, the ESL 132, the first ILD 104, and the CESL 102. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 134. The remaining liner and conductive material form the gate contacts 142 and the source/drain contacts 144 in the openings. The gate contacts 142 and the source/drain contacts 144 may be formed in distinct processes, or may be formed in the same process. Although shown as being formed in the same cross-sections, it should be appreciated that each of the gate contacts 142 and the source/drain contacts 144 may be formed in different cross-sections, which may avoid shorting of the contacts.

Optionally, metal-semiconductor alloy regions 146 are formed at the interfaces between the epitaxial source/drain regions 98 and the source/drain contacts 144. The metal-semiconductor alloy regions 146 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon germanide regions formed of both a metal silicide and a metal germanide, or the like. The metal-semiconductor alloy regions 146 can be formed before the material(s) of the source/drain contacts 144 by depositing a metal in the openings for the source/drain contacts 144 and then performing a thermal anneal process. In some embodiments, the metal reacts with the finishing layers 98C of the epitaxial source/drain regions 98 such that the metal-semiconductor alloy regions 146 extend through the finishing layers 98C. The metal can be any metal capable of reacting with the semiconductor materials (e.g., silicon, silicon carbide, silicon germanium, germanium, etc.) of the epitaxial source/drain regions 98 to form a low-resistance metal-semiconductor alloy, such as nickel, cobalt, titanium, tantalum, platinum, tungsten, other noble metals, other refractory metals, rare earth metals or their alloys. The metal may be deposited by a deposition process such as ALD, CVD, PVD, or the like. After the thermal anneal process, a cleaning process, such as a wet clean, may be performed to remove any residual metal from the openings for the source/drain contacts 144, such as from surfaces of the metal-semiconductor alloy regions 146. The material(s) of the source/drain contacts 144 can then be formed on the metal-semiconductor alloy regions 146.

The width of the source/drain contacts 144 is controlled so that the width $W_2$ of the source/drain contacts 144 is less than the width $W_1$ (previously described) of the main layers 98B between opposing liner layers 98A. As a result, the source/drain contacts 144 are formed to contact the main layers 98B of the epitaxial source/drain regions 98, and are not formed to contact the liner layers 98A of the epitaxial source/drain regions 98. In other words, the source/drain contacts 144 are spaced apart from the liner layers 98A. The contact resistance to the epitaxial source/drain regions 98 may thus be reduced, increasing device performance. In some embodiments, the width $W_2$ of the source/drain contacts 144 is in the range of 3 nm to 50 nm.

Subsequently, the nano-FET devices may be interconnected by metallization layers in an overlying interconnect structure to form integrated circuits. The overlying interconnect structure can be formed in a back end of line (BEOL) process, in which the metallization layers are connected to the gate contacts 142 and the source/drain contacts 144. In some types of devices, such as memory devices, the source/drain contacts 144 to source regions of the devices may be connected to ground. Additional features, such as passive devices, memories (e.g., magnetoresistive random-access memory (MRAM), resistive random access memory (RRAM), phase-change random access memory (PCRAM), etc.), or the like may be integrated with the interconnect structure during the BEOL process.

Figure 26:
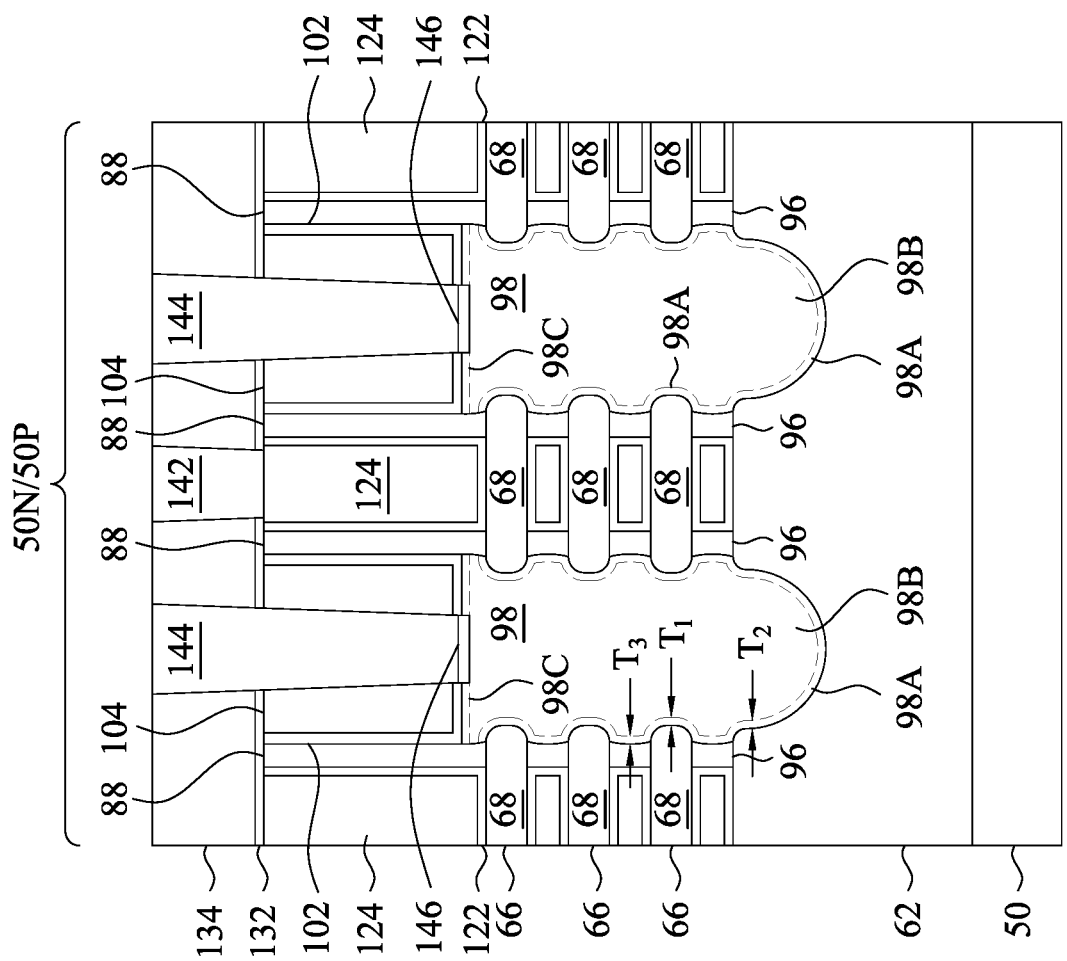
FIG. 26 is a view of nano-FETs, in accordance with some other embodiments.

FIG. 26 is a view of nano-FETs, in accordance with some other embodiments. This embodiment is similar to that described for FIG. 25A, except the liner layers 98A are grown until they merge in each source/drain recess 92 (see FIG. 28), so that the sidewalls of the inner spacers 96 are covered by the liner layers 98A. As such, the liner layers 98A are extending continuously along the sidewalls of the second nanostructures 66 and the inner spacers 96, and the main layers 98B are separated from the inner spacers 96 by the liner layers 98A.

The thickness $T_3$ of the portions of the liner layers 98A along the inner spacers 96 may be smaller than the thickness $T_1$ of the portions of the liner layers 98A along the second nanostructures 66 and the thickness $T_2$ of the portions of the liner layers 98A along the fins 62. In some embodiments, the portions of the liner layers 98A along the inner spacers 96 have a thickness $T_3$ in the range of 0 nm to 8 nm. Forming the liner layers 98A with a thickness $T_3$ that is greater than 8 nm may cause the resistance of the epitaxial source/drain regions 98 to be excessively high, decreasing device performance.

FIGS. 27-31 are views of intermediate stages in the manufacturing of nano-FETs, in accordance with some other embodiments. Specifically, FIGS. 27-31 illustrate another process for forming the epitaxial source/drain regions 98 in the n-type region 50N. FIGS. 27-31 illustrate features in a region 50A in FIG. 14A. As previously described, the semiconductor material of the liner layers 98A in the n-type region 50N is composed of a semiconductor element and a blocker element, which helps reduce out-diffusion of dopants from the main layers 98B in subsequent processing.

Figure 27:
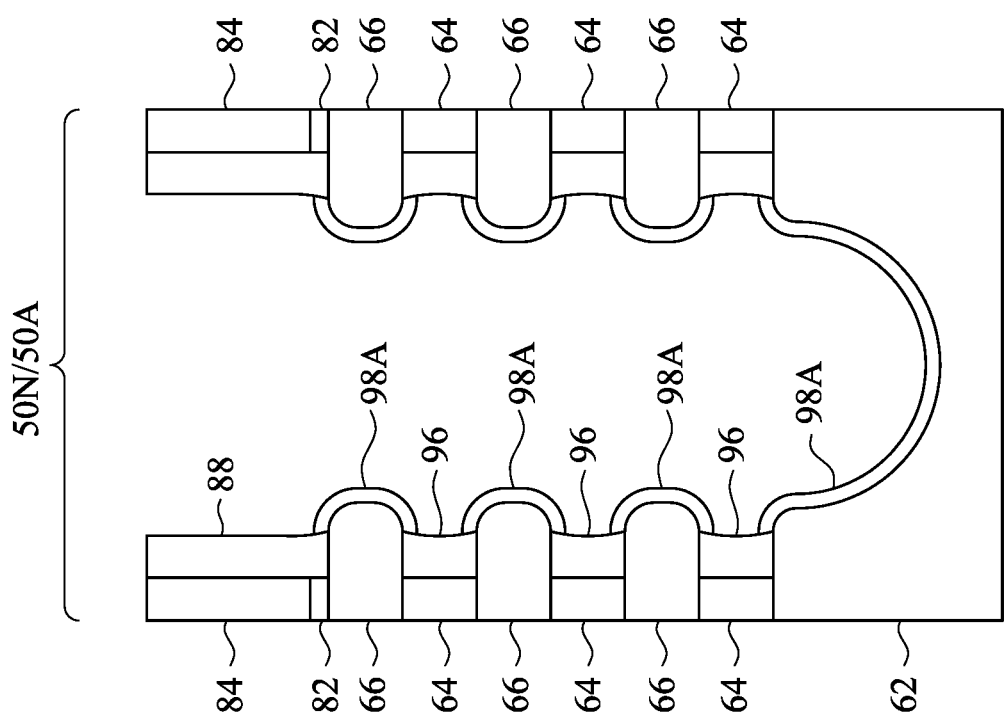
FIGS. 27-31 are views of intermediate stages in the manufacturing of nano-FETs, in accordance with some other embodiments.
Figure 28:
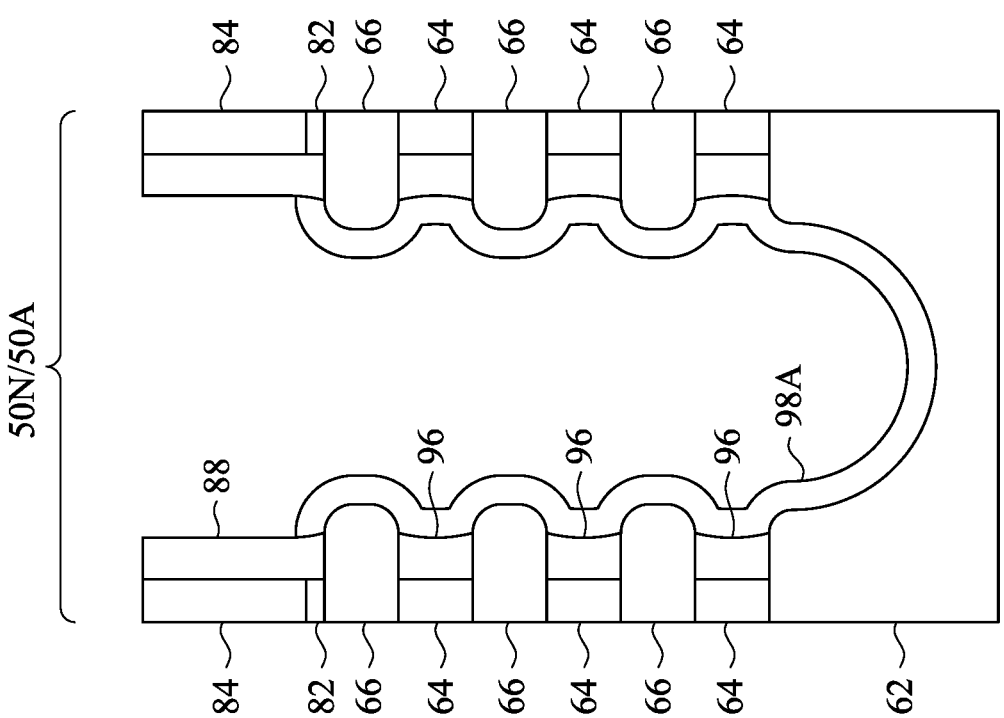

In FIGS. 27-28, the liner layers 98A in the n-type region 50N are epitaxially grown on the surfaces of semiconductor features (e.g., surfaces of the fins 62 and the second nanostructures 66) in the source/drain recesses 92. The liner layers 98A may be grown by a similar process as that described for FIG. 15, except the epitaxial growth process may be performed for a longer duration. In some embodiments, the second nanostructures 66 and the fins 62 are exposed to the semiconductor-containing precursor, the blocker-containing precursor, and the dopant-containing precursor (if present) for a duration in the range of 5 second to 20 minutes. As such, the liner layers 98A are initially grown on the fins 62 and the second nanostructures 66 in the source/drain recesses 92 (as shown by FIG. 27), but then growth is continued until the portions of the liner layers 98A in each source/drain recess 92 merge (as shown by FIG. 28). Performing the epitaxial growth process for a long duration allows the portions of the liner layers 98A in each source/drain recess 92 to merge, but also causes the liner layers 98A to be formed to a large thickness.

Figure 29:
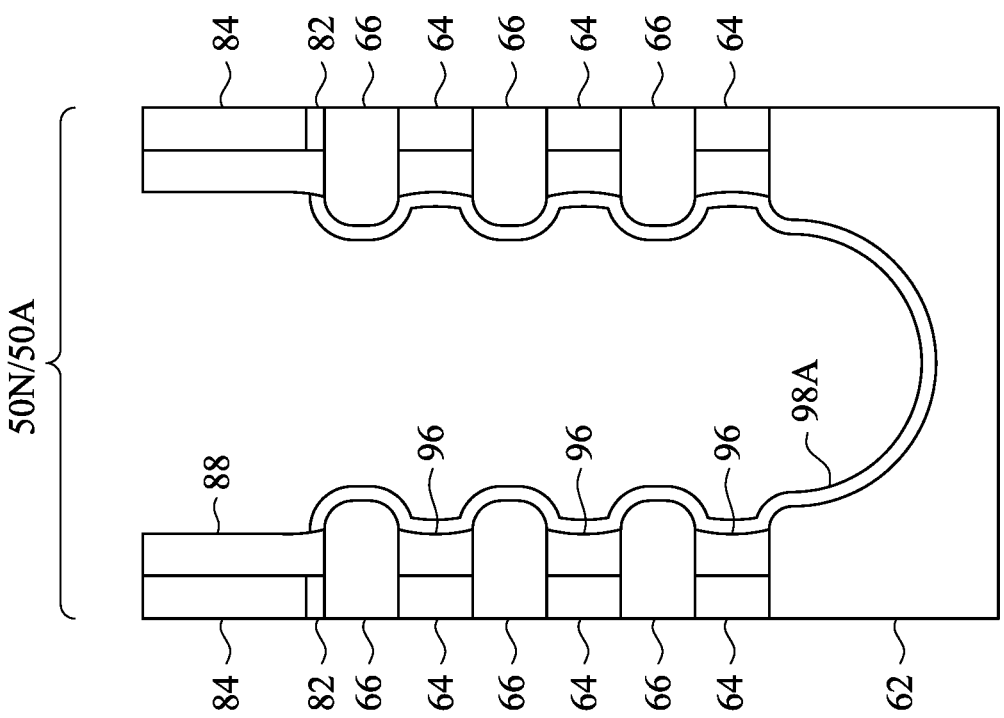

In FIG. 29, the liner layers 98A in the n-type region 50N are thinned to reduce their thickness. The liner layers 98A may be thinned by a dry etch using a chlorine-containing etchant such as hydrogen chloride (HCl) gas, chlorine ($Cl_2$) gas, or the like. The etching may be anisotropic. After the liner layers 98A are thinned, they have the thicknesses $T_1$, $T_2$, $T_3$ (previously described).

Figure 30:
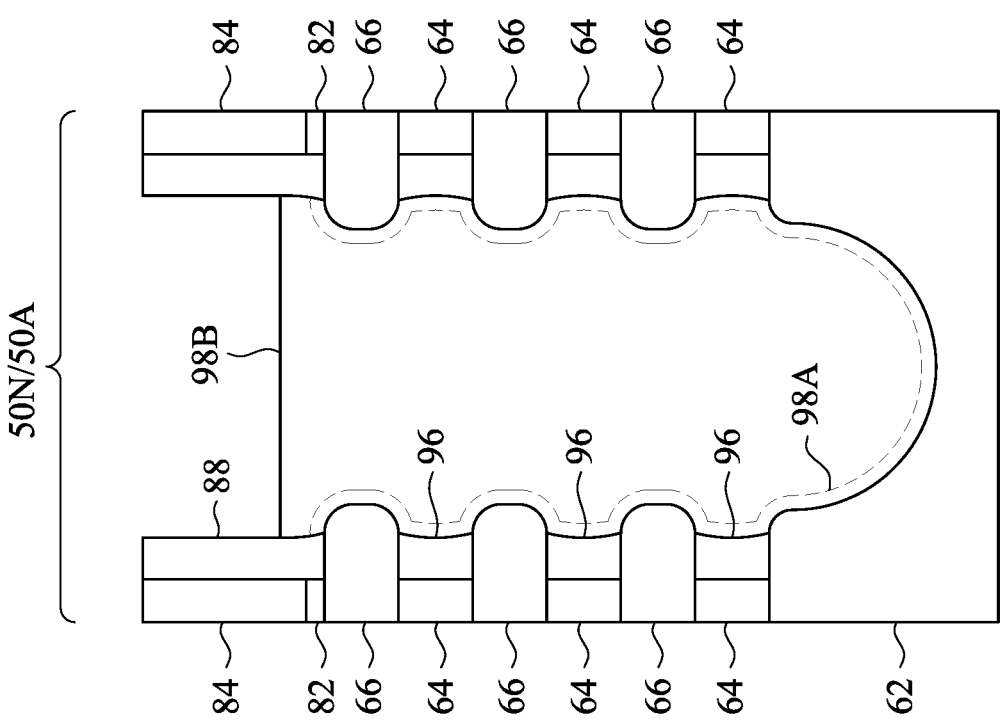

In FIG. 30, the main layers 98B in the n-type region 50N are epitaxially grown on the liner layers 98A. The main layers 98B may be grown by a similar process as that described for FIG. 16.

Figure 31:
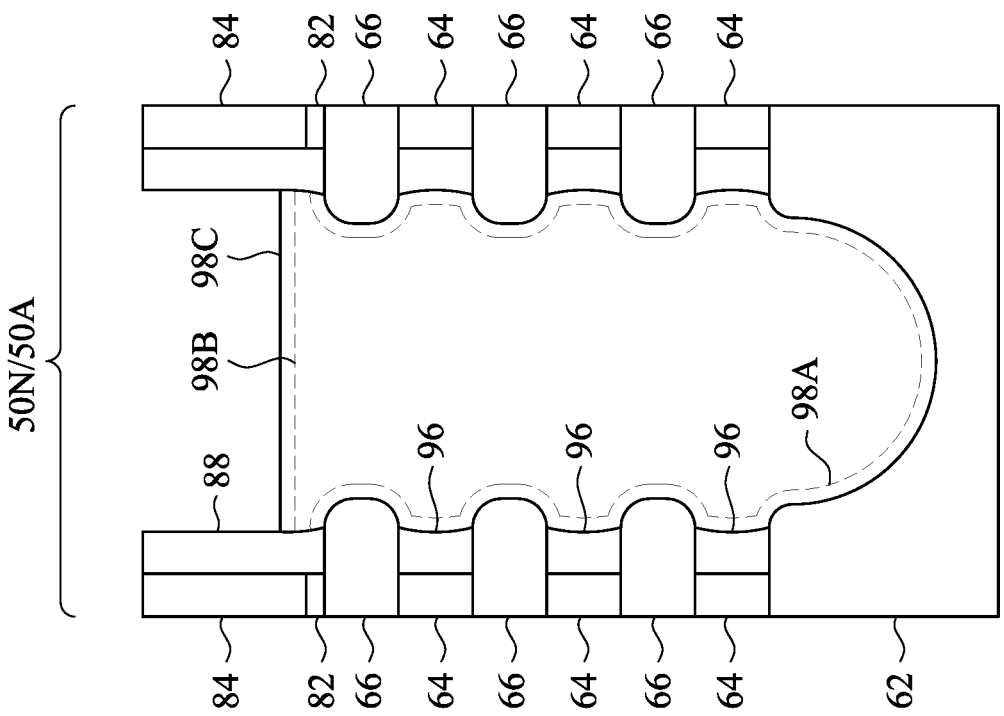

In FIG. 31, the finishing layers 98C in the n-type region 50N are epitaxially grown on the main layers 98B. The finishing layers 98C may be grown by a similar process as that described for FIG. 17.

Figure 32A:
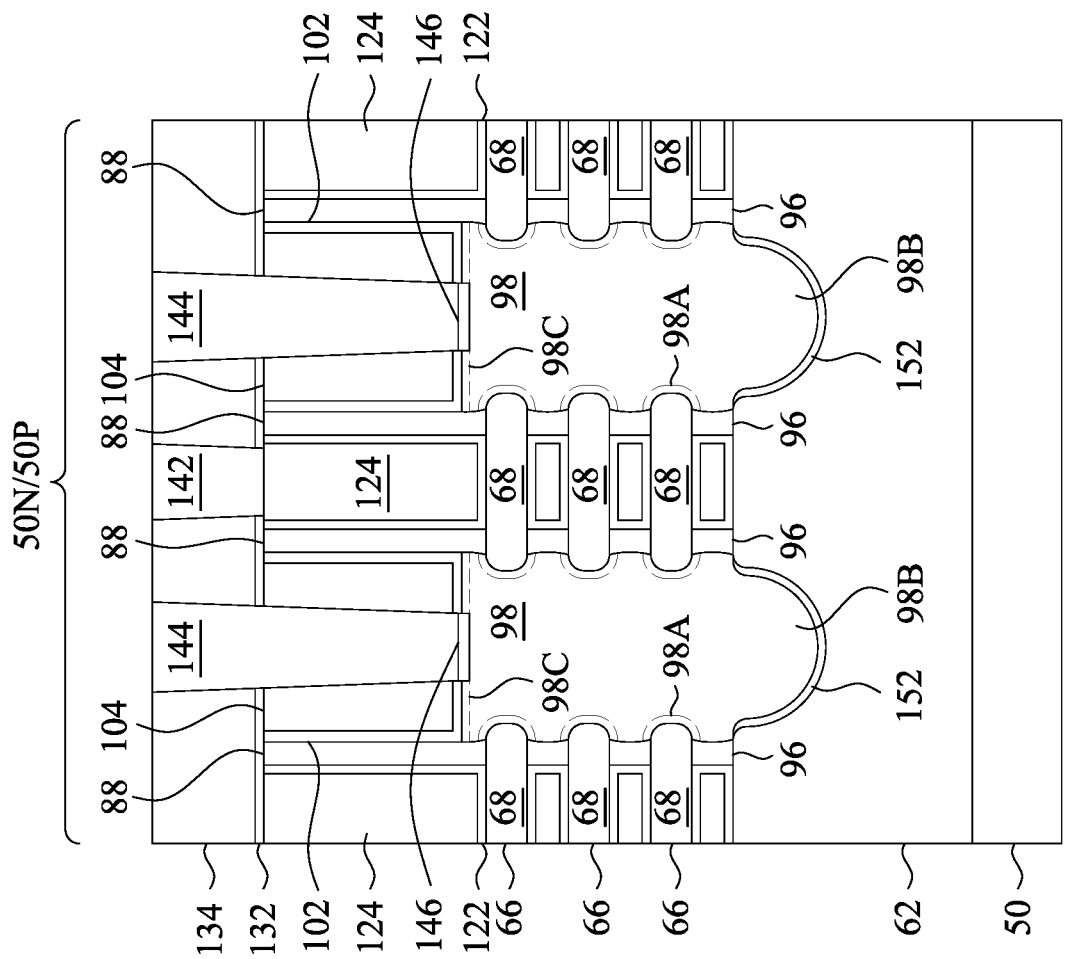
FIGS. 32A-32C are views of nano-FETs, in accordance with some other embodiments.
Figure 32C:
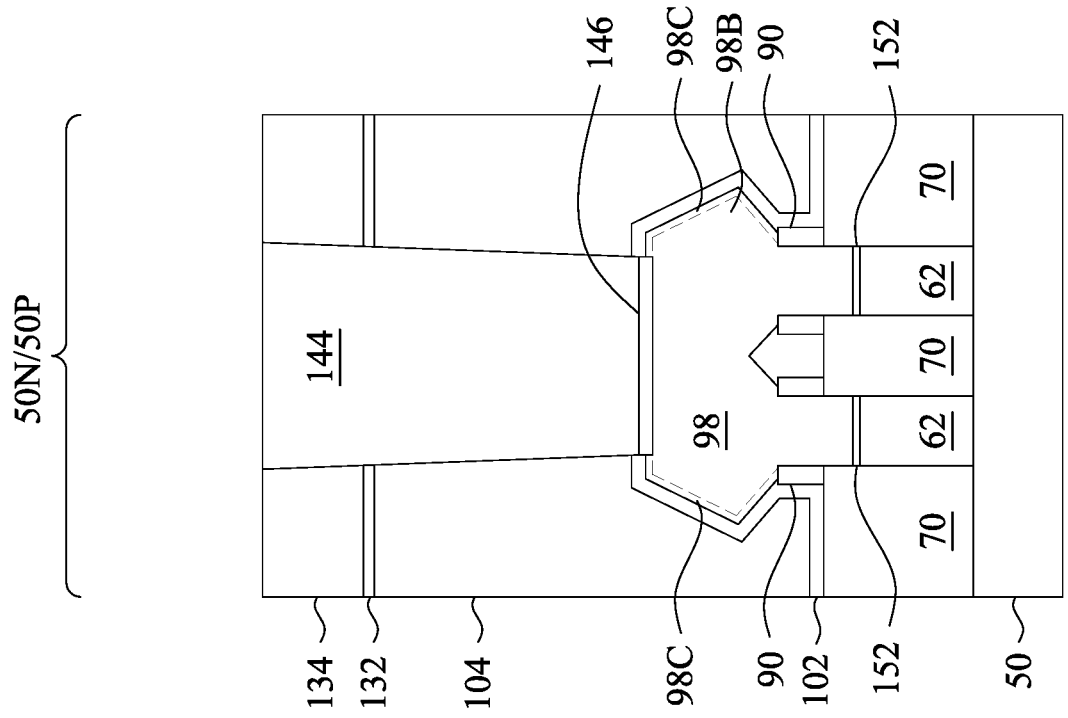
Figure 32B:
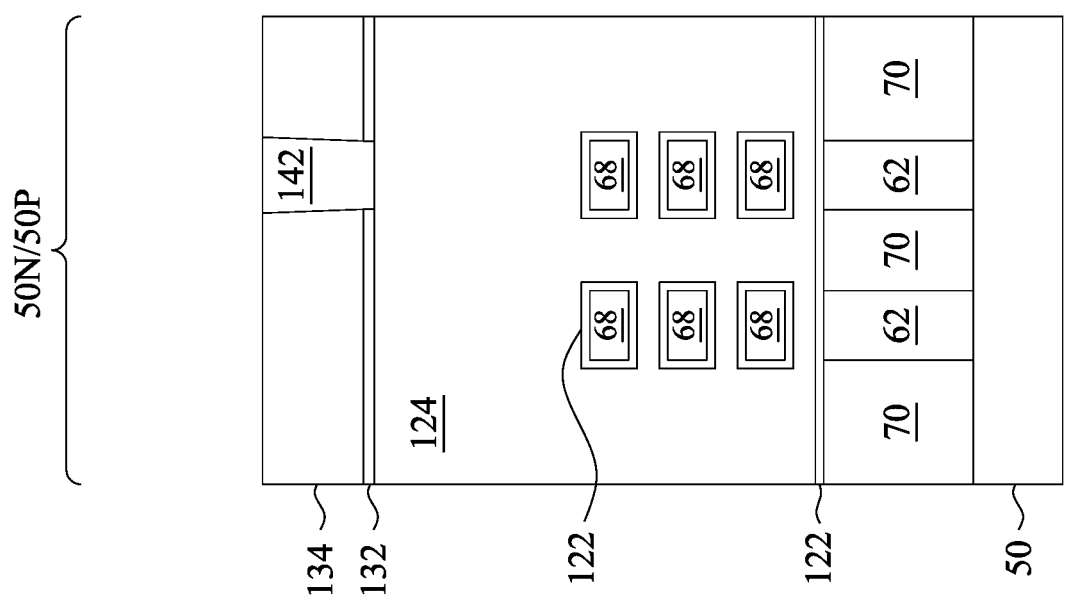

FIGS. 32A-32C are views of nano-FETs, in accordance with some other embodiments. This embodiment is similar to that described for FIGS. 25A-25C, except the spacer layer 94 is patterned (see FIGS. 11A-11C) so that bottom spacers 152 are also formed at the bottoms of the source/drain recesses 92 (see FIGS. 11A-11C). As such, the bottom spacers 152 separate the bottom surfaces of the epitaxial source/drain regions 98 from the fins 62. Forming the bottom spacers 152 along the bottom surfaces of the epitaxial source/drain regions 98 helps reduce the leakage from the epitaxial source/drain regions 98 to the substrate 50. In some embodiments, the bottom spacers 152 along the bottom surfaces of the epitaxial source/drain regions 98 have a thickness $T_4$ in the range of 1 nm to 30 nm. Forming the bottom spacers 152 along the bottom surfaces of the epitaxial source/drain regions 98 with a thickness $T_4$ that is less than 1 nm may not sufficiently reduce leakage from the epitaxial source/drain regions 98. Forming the bottom spacers 152 along the bottom surfaces of the epitaxial source/drain regions 98 with a thickness $T_4$ that is greater than 30 nm may cause the resistance of the epitaxial source/drain regions 98 to be excessively high, decreasing device performance.

Figure 33:
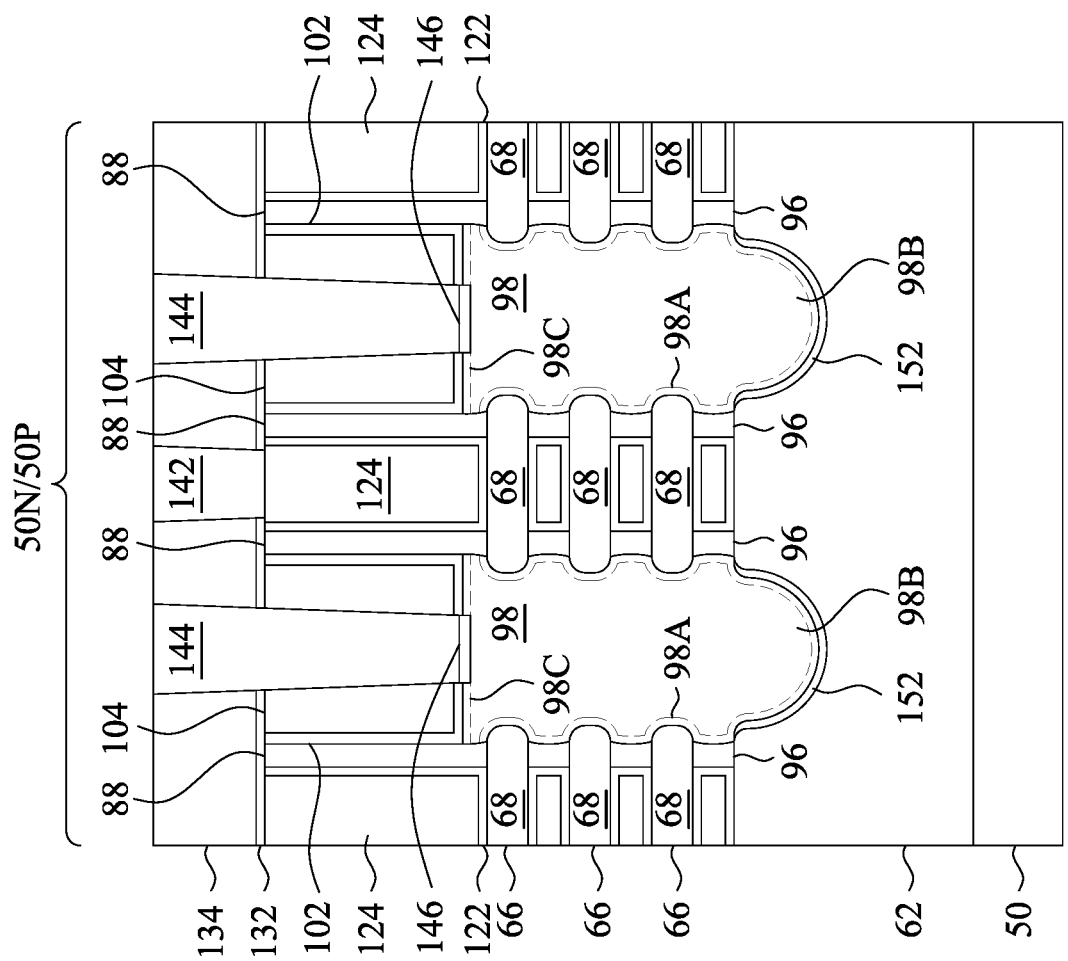
FIG. 33 is a view of nano-FETs, in accordance with some other embodiments.

FIG. 33 is a view of nano-FETs, in accordance with some other embodiments. This embodiment is similar to that described for FIG. 26, except the spacer layer 94 is patterned (see FIGS. 11A-11C) so that bottom spacers 152 are also formed at the bottoms of the source/drain recesses 92 (see FIGS. 11A-11C), in a similar manner as described for FIGS. 32A-32C.

Figure 34A:
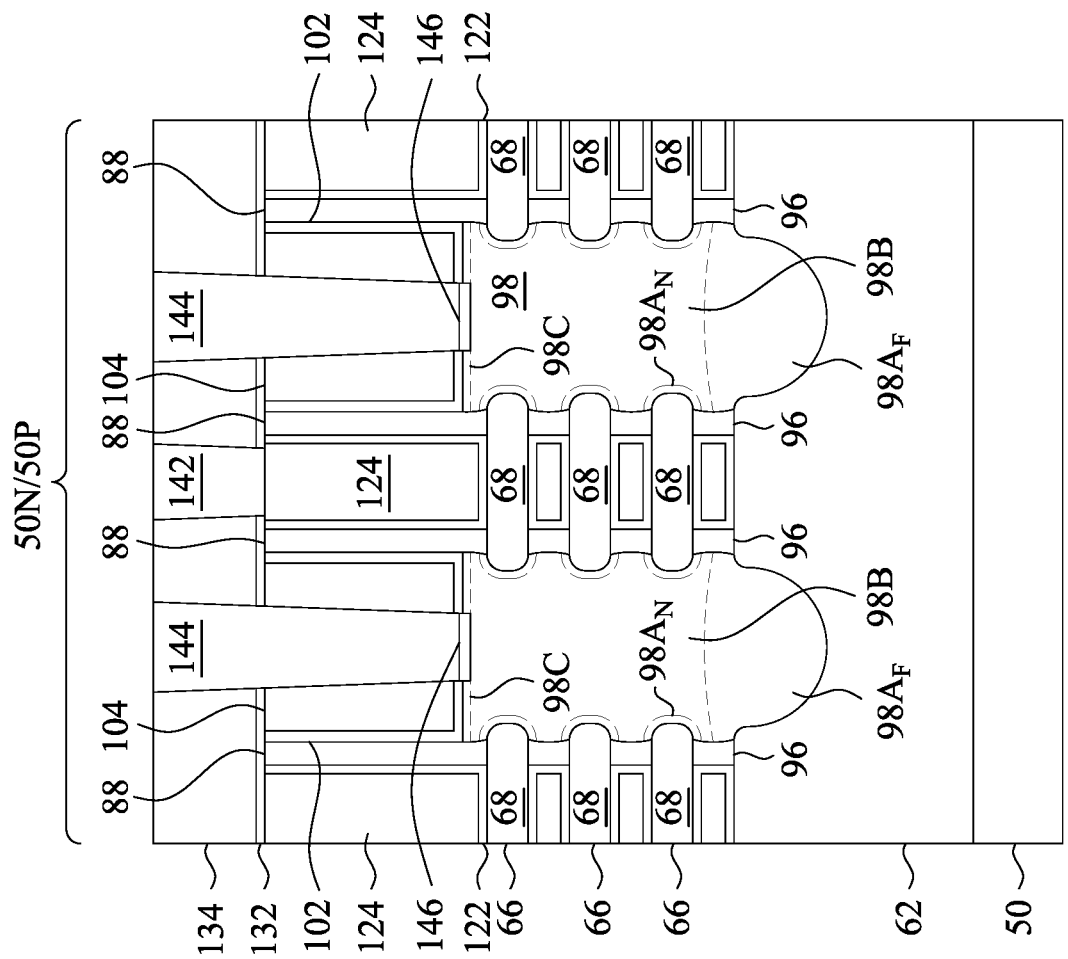
FIGS. 34A-34C are views of nano-FETs, in accordance with some other embodiments.
Figure 34C:
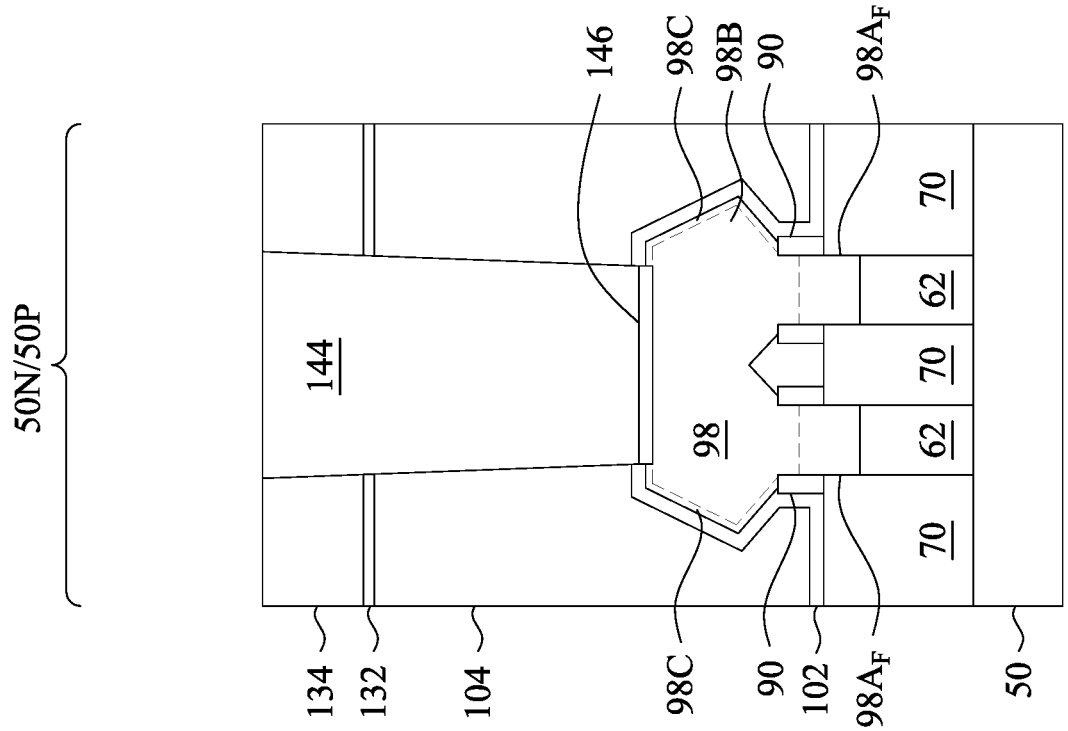
Figure 34B:
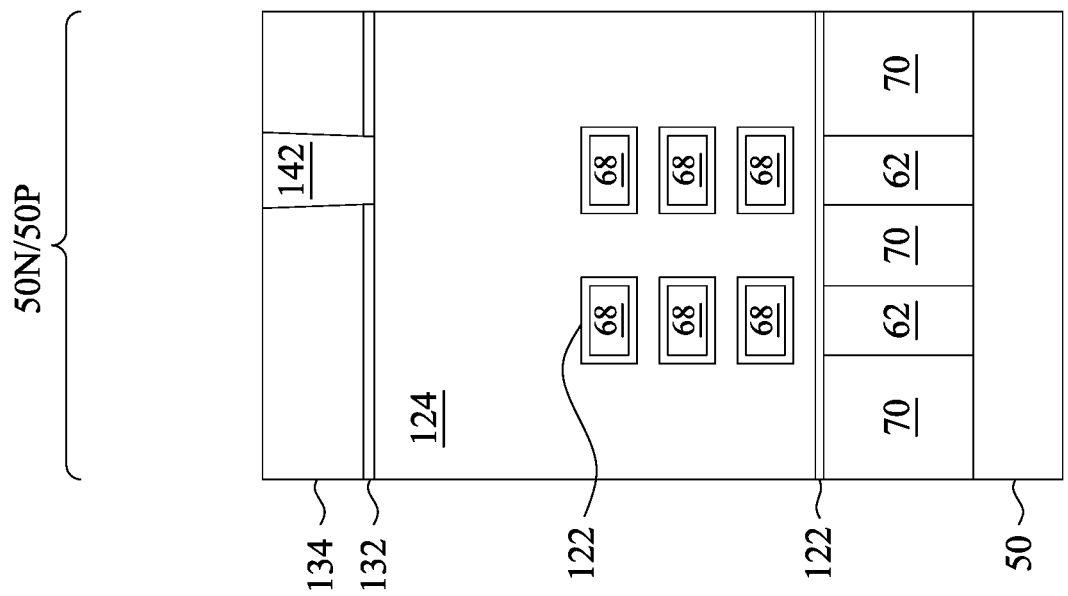

FIGS. 34A-34C are views of nano-FETs, in accordance with some other embodiments. This embodiment is similar to that described for FIGS. 25A-25C, except the liner layers 98A on the fins 62 are formed to a greater thickness than other liner layers 98A. Specifically, the liner layers $98A_F$ grown from the fins 62 are thicker than the liner layers $98A_N$ grown from the second nanostructures 66. Growing the liner layers $98A_F$ on the fins 62 to a greater thickness helps reduce the leakage from the epitaxial source/drain regions 98 to the substrate 50. The liner layers $98A_F$ are grown so that the top surfaces of the liner layers $98A_F$ are disposed above the top surfaces of the fins 62 and below the bottom surfaces of the second nanostructures 66. In some embodiments, the distance $D_1$ between the top surfaces of the liner layers $98A_F$ and the bottom surfaces of the second nanostructures 66 is less than 3 nm. Forming the liner layers $98A_F$ so that the distance $D_1$ is greater than 3 nm may cause the resistance of the epitaxial source/drain regions 98 to be excessively high, decreasing device performance.

The liner layers $98A_F$ may be grown to a greater thickness than the liner layers $98A_N$ by growing the liner layers 98A with an epitaxial growth process that has a large bottom-up growth rate. In some embodiments, bottom-up epitaxial growth is performed by using a chlorine-containing precursor during growth of the liner layers 98A (described for FIG. 15). The chlorine-containing precursor may be chlorine ($Cl_2$) gas, hydrogen chloride (HCl), or the like. Additionally or alternatively, bottom-up epitaxial growth may be performed by growing the liner layers 98A at a high temperature, such as a temperature in the range of 600° C. to 800° C. The epitaxial growth is performed until the top surfaces of the liner layers $98A_F$ are disposed a desired distance $D_1$ below the bottom surfaces of the second nanostructures 66.

Embodiments may achieve advantages. Forming the liner layers 98A in the n-type region 50N of a semiconductor material that is composed of a blocker element helps reduce out-diffusion of dopants from the main layers 98B into the channel region 68 in subsequent processing. In an experiment where the n-type dopant was arsenic, the dopant concentration 8 nm beyond the sidewalls of the second nanostructures 66 was decreased up to 66% for channel regions 68 under a tensile strain of 0% to 2%. In another experiment where the n-type dopant was phosphorous, the dopant concentration 8 nm beneath the sidewalls of the second nanostructures 66 was decreased up to 80%. In some embodiments, the dopant concentration in the channel regions 68 was as low as $5\times10^{17}$ cm$^{-3}$. By reducing the diffusion of dopants into the channel regions 68, channel mobility may be increased. Device performance may thus be increased.

In an embodiment, a device includes: a first nanostructure; a source/drain region adjoining a first channel region of the first nanostructure, the source/drain region including: a main layer; and a first liner layer between the main layer and the first nanostructure, a carbon concentration of the first liner layer being greater than a carbon concentration of the main layer; an inter-layer dielectric on the source/drain region; and a contact extending through the inter-layer dielectric, the contact connected to the main layer, the contact spaced apart from the first liner layer. In some embodiments, the device further includes: a second nanostructure, the source/drain region adjoining a second channel region of the second nanostructure, where the source/drain region further includes: a second liner layer between the main layer and the second nanostructure, the main layer having a first width between the first liner layer and the second liner layer, the contact having a second width, the second width less than the first width. In some embodiments of the device, the source/drain region further includes: a finishing layer on the main layer, the carbon concentration of the first liner layer being greater than a carbon concentration of the finishing layer. In some embodiments of the device, the carbon concentration of the first liner layer is in a range of 0.1 at % to 2 at %, and the carbon concentration of the main layer is zero. In some embodiments of the device, the carbon concentration of the first liner layer is in a range of 0.1 at % to 2 at %, and the carbon concentration of the main layer is in a range of 0 at % to 2 at %. In some embodiments, the device further includes: a second nanostructure, the source/drain region adjoining a second channel region of the second nanostructure, the first liner layer between the main layer and the second nanostructure; a gate structure wrapped around the first channel region of the first nanostructure and around the second channel region of the second nanostructure; and a spacer between the gate structure and the source/drain region, the first liner layer between the main layer and the spacer. In some embodiments, the device further includes: a second nanostructure, the source/drain region adjoining a second channel region of the second nanostructure; a gate structure wrapped around the first channel region of the first nanostructure and around the second channel region of the second nanostructure; and a spacer between the gate structure and the source/drain region, the main layer contacting the spacer, where the source/drain region further includes: a second liner layer between the main layer and the second nanostructure, the second liner layer separated from the first liner layer.

In an embodiment, a device includes: a nanostructure; and a source/drain region adjoining a channel region of the nanostructure, the source/drain region including: a first epitaxial layer on a sidewall of the nanostructure, the first epitaxial layer including a carbon-containing semiconductor material and an n-type dopant; a second epitaxial layer on the first epitaxial layer, the second epitaxial layer including a carbon-free semiconductor material and the n-type dopant; and a third epitaxial layer on the second epitaxial layer, the third epitaxial layer including the carbon-free semiconductor material and the n-type dopant. In some embodiments, the device further includes: an inter-layer dielectric on the source/drain region; and a contact extending through the inter-layer dielectric to contact the second epitaxial layer of the source/drain region, the contact spaced apart from the first epitaxial layer of the source/drain region. In some embodiments of the device, the carbon-containing semiconductor material is silicon carbide, the carbon-free semiconductor material is silicon, and the n-type dopant is phosphorous or arsenic. In some embodiments, the device further includes: a fin extending from a substrate, where the first epitaxial layer of the source/drain region is on a top surface of the fin. In some embodiments, the device further includes: a fin extending from a substrate; and a spacer between the fin and the first epitaxial layer of the source/drain region.

In an embodiment, a method includes: etching a source/drain recess in a nanostructure, a sidewall of the nanostructure exposed to the source/drain recess; growing a first epitaxial layer in the source/drain recess by exposing the sidewall of the nanostructure to a semiconductor-containing precursor, a blocker-containing precursor, and a dopant-containing precursor; growing a second epitaxial layer in the source/drain recess by exposing the first epitaxial layer to the semiconductor-containing precursor and the dopant-containing precursor, the first epitaxial layer not exposed to the blocker-containing precursor when growing the second epitaxial layer; depositing a dielectric layer on the second epitaxial layer; and forming a contact through the dielectric layer, the contact connected to the second epitaxial layer, the contact spaced apart from the first epitaxial layer. In some embodiments of the method, the semiconductor-containing precursor is a silane and the blocker-containing precursor is trimethylsilane. In some embodiments of the method, the sidewall of the nanostructure is exposed to the semiconductor-containing precursor, the blocker-containing precursor, and the dopant-containing precursor at a temperature in a range of 600° C. to 700° C. and at a pressure in a range of 1 Torr to 760 Torr. In some embodiments of the method, the first epitaxial layer is exposed to the semiconductor-containing precursor and the dopant-containing precursor at a temperature in a range of 400° C. to 800° C. and at a pressure in a range of 1 Torr to 760 Torr. In some embodiments of the method, the nanostructure is under a tensile strain after etching the source/drain recess, and the dopant-containing precursor is an arsenic-containing precursor or a phosphorous-containing precursor. In some embodiments of the method, the sidewall of the nanostructure is also exposed to a chlorine-containing precursor when growing the first epitaxial layer. In some embodiments of the method, the nanostructure is disposed over a spacer, a sidewall of the spacer is exposed to the source/drain recess, and growth of the first epitaxial layer is stopped before the first epitaxial layer covers the sidewall of the spacer. In some embodiments of the method, the nanostructure is disposed over a spacer, a sidewall of the spacer is exposed to the source/drain recess, and growth of the first epitaxial layer is performed until the first epitaxial layer covers the sidewall of the spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    etching a source/drain recess in a nanostructure and a fin, a sidewall of the nanostructure exposed to the source/drain recess, a top surface of the fin exposed to the source/drain recess;
    growing a first epitaxial layer and a second epitaxial layer in the source/drain recess, wherein the first epitaxial layer is grown on the sidewall of the nanostructure by exposing the sidewall of the nanostructure to a semiconductor-containing precursor, a blocker-containing precursor, and a dopant-containing precursor, wherein the second epitaxial layer is grown to cover an entirety of the top surface of the fin by exposing the top surface of the fin to the semiconductor-containing precursor, the blocker-containing precursor, and the dopant-containing precursor, wherein the second epitaxial layer is separated from the first epitaxial layer, wherein the second epitaxial layer is thicker than the first epitaxial layer;
    growing a third epitaxial layer in the source/drain recess by exposing the first epitaxial layer and the second epitaxial layer to the semiconductor-containing precursor and the dopant-containing precursor, the first epitaxial layer and the second epitaxial layer not exposed to the blocker-containing precursor when growing the third epitaxial layer;
    depositing a dielectric layer on the third epitaxial layer; and
    forming a contact through the dielectric layer, the contact connected to the third epitaxial layer, the contact spaced apart from the first epitaxial layer.

2. The method of claim 1, wherein the semiconductor-containing precursor is a silane and the blocker-containing precursor is trimethylsilane.

3. The method of claim 1, wherein the sidewall of the nanostructure is exposed to the semiconductor-containing precursor, the blocker-containing precursor, and the dopant-containing precursor at a temperature in a range of 600° C. to 700° C. and at a pressure in a range of 1 Torr to 760 Torr.

4. The method of claim 1, wherein the first epitaxial layer is exposed to the semiconductor-containing precursor and the dopant-containing precursor at a temperature in a range of 400° C. to 800° C. and at a pressure in a range of 1 Torr to 760 Torr.

5. The method of claim 1, wherein the nanostructure is under a tensile strain after etching the source/drain recess, and the dopant-containing precursor is an arsenic-containing precursor or a phosphorous-containing precursor.

6. The method of claim 1, wherein the sidewall of the nanostructure is also exposed to a chlorine-containing precursor when growing the first epitaxial layer.

7. The method of claim 1, wherein the nanostructure is disposed over a spacer, a sidewall of the spacer is exposed to the source/drain recess, and growth of the first epitaxial layer is stopped before the first epitaxial layer covers the sidewall of the spacer.

8. The method of claim 1, wherein the nanostructure is disposed over a spacer, a sidewall of the spacer is exposed to the source/drain recess, and growth of the first epitaxial layer is performed until the first epitaxial layer covers the sidewall of the spacer.

9. A method comprising:
    etching a source/drain recess in a nanostructure and a fin, the nanostructure disposed over the fin, a sidewall of the nanostructure and a top surface of the fin exposed to the source/drain recess;
    forming a source/drain region in the source/drain recess, wherein forming the source/drain region comprises:
        growing a first epitaxial layer and a second epitaxial layer, the first epitaxial layer grown on the sidewall of the nanostructure, the second epitaxial layer grown to cover an entirety of the top surface of the fin, the second epitaxial layer being thicker than the first epitaxial layer, the first epitaxial layer and the second epitaxial layer comprising a carbon-containing semiconductor material and an n-type dopant; and
        growing a third epitaxial layer on the first epitaxial layer and the second epitaxial layer, the third epitaxial layer comprising a carbon-free semiconductor material and the n-type dopant;
    depositing a dielectric layer on the third epitaxial layer; and
    forming a contact through the dielectric layer, the contact connected to the source/drain region.

10. The method of claim 9, wherein forming the source/drain region further comprises:
    growing a fourth epitaxial layer on the third epitaxial layer, the fourth epitaxial layer comprising the carbon-free semiconductor material and the n-type dopant.

11. The method of claim 9, wherein the contact is spaced apart from the first epitaxial layer.

12. The method of claim 9, wherein the carbon-containing semiconductor material is silicon carbide, the carbon-free semiconductor material is silicon, and the n-type dopant is phosphorous or arsenic.

13. The method of claim 9, wherein the nanostructure is under a tensile strain after etching the source/drain recess.

14. A method comprising:
    forming a first spacer and a second spacer under, respectively, a first nanostructure and a second nanostructure;
    forming a source/drain region between the first nanostructure and the second nanostructure, wherein forming the source/drain region comprises:
        epitaxially growing a first liner layer, a second liner layer, and a third liner layer, the first liner layer grown on a sidewall of the first nanostructure, the second liner layer grown on a sidewall of the second nanostructure, the first liner layer separated from the second liner layer, and the third liner layer extending between and contacting both the first spacer and the second spacer; and
        epitaxially growing a main layer on the first liner layer and the second liner layer, the main layer having a first width between the first liner layer and the second liner layer in a cross-sectional view, wherein a carbon concentration of the first liner layer and the second liner layer is greater than a carbon concentration of the main layer;
    depositing an inter-layer dielectric on the source/drain region; and
    forming a contact extending through the inter-layer dielectric, the contact connected to the source/drain region, the contact having a second width in the cross-sectional view, the second width being less than the first width.

15. The method of claim 14, wherein forming the source/drain region further comprises:
    epitaxially growing a finishing layer on the main layer, wherein the carbon concentration of the first liner layer and the second liner layer is greater than a carbon concentration of the finishing layer.

16. The method of claim 14, wherein the contact is connected to the main layer and spaced apart from the first liner layer and the second liner layer.

17. The method of claim 14, wherein the main layer is grown on a sidewall of the first spacer, and the method further includes:
   forming a gate structure around the first nanostructure, the first spacer disposed between the gate structure and the source/drain region.

18. The method of claim 14, wherein the first liner layer is grown on a sidewall of the first spacer, and the method further includes:
   forming a gate structure around the first nanostructure, the first spacer disposed between the gate structure and the source/drain region.

19. The method of claim 14, wherein the carbon concentration of the main layer is zero.

20. The method of claim 14, wherein the carbon concentration of the main layer is non-zero.

* * * * *